(12) United States Patent
Kawashima et al.

(10) Patent No.: US 11,990,502 B2
(45) Date of Patent: May 21, 2024

(54) DISPLAY DEVICE AND ELECTRONIC DEVICE

(71) Applicant: SEMICONDUCTOR ENERGY LABORATORY CO., LTD., Atsugi (JP)

(72) Inventors: Susumu Kawashima, Kanagawa (JP); Koji Kusunoki, Kanagawa (JP); Kazunori Watanabe, Tokyo (JP); Kouhei Toyotaka, Kanagawa (JP); Naoto Kusumoto, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 151 days.

(21) Appl. No.: 16/638,825

(22) PCT Filed: Aug. 10, 2018

(86) PCT No.: PCT/IB2018/056022
§ 371 (c)(1),
(2) Date: Feb. 13, 2020

(87) PCT Pub. No.: WO2019/043483
PCT Pub. Date: Mar. 7, 2019

(65) Prior Publication Data
US 2020/0194527 A1 Jun. 18, 2020

(30) Foreign Application Priority Data

Aug. 31, 2017 (JP) .................................. 2017-166757
Nov. 30, 2017 (JP) .................................. 2017-230388
(Continued)

(51) Int. Cl.
H01L 27/32 (2006.01)
G09G 3/3275 (2016.01)
(Continued)

(52) U.S. Cl.
CPC ....... *H10K 59/1213* (2023.02); *G09G 3/3275* (2013.01); *H10K 50/11* (2023.02);
(Continued)

(58) Field of Classification Search
CPC ....................... H01L 27/3262; H01L 51/5012
See application file for complete search history.

(56) References Cited

U.S. PATENT DOCUMENTS 5,903,248 A 5/1999 Irwin
6,331,844 B1 12/2001 Okumura et al.
(Continued)

FOREIGN PATENT DOCUMENTS

CN 104143313 A 11/2014
CN 104715716 A 6/2015
(Continued)

OTHER PUBLICATIONS

International Search Report (Application No. PCT/IB2018/056022) dated Nov. 27, 2018.
(Continued)

Primary Examiner — Tuan A Hoang
(74) Attorney, Agent, or Firm — Fish & Richardson P.C.

(57) ABSTRACT

To provide a display device capable of performing image processing. Each pixel is provided with a memory circuit in which desired correction data is retained. The correction data is generated by calculation in an external device and written to each pixel. The correction data is added to image data by capacitive coupling and supplied to a display element. Thus, the display element can display a corrected image. Through the correction, image upconversion can be performed, or image quality decreased because of variations in pixel transistor characteristics can be corrected.

6 Claims, 35 Drawing Sheets

(30) Foreign Application Priority Data

Feb. 22, 2018 (JP) ................................ 2018-029271
May 17, 2018 (JP) ................................ 2018-095317

(51) Int. Cl.
*H10K 50/11* (2023.01)
*H10K 59/121* (2023.01)
*H10K 59/131* (2023.01)

(52) U.S. Cl.
CPC ....... *H10K 59/1216* (2023.02); *H10K 59/131* (2023.02); *G09G 2300/0857* (2013.01); *G09G 2310/0251* (2013.01); *G09G 2310/0262* (2013.01)

(56) References Cited

U.S. PATENT DOCUMENTS

| | | | |
|---|---|---|---|
| 6,563,480 B1 | 5/2003 | Nakamura | |
| 7,224,339 B2* | 5/2007 | Koyama | G09G 3/3266 345/98 |
| 7,674,650 B2 | 3/2010 | Akimoto et al. | |
| 7,808,008 B2* | 10/2010 | Miyake | H01L 27/1266 257/431 |
| 8,338,835 B2 | 12/2012 | Miyake | |
| 8,760,376 B2 | 6/2014 | Koyama et al. | |
| 8,816,359 B2 | 8/2014 | Miyake | |
| 8,860,108 B2 | 10/2014 | Yamazaki et al. | |
| 8,884,852 B2* | 11/2014 | Yamamoto | G09G 3/3241 345/77 |
| 8,976,090 B2* | 3/2015 | Yamamoto | G09G 3/32 345/78 |
| 9,013,457 B2 | 4/2015 | Kimura | |
| 9,029,849 B2 | 5/2015 | Kim | |
| 9,245,935 B2 | 1/2016 | Miyake | |
| 9,697,769 B2 | 7/2017 | Kishi et al. | |
| 9,721,942 B2 | 8/2017 | Kimura | |
| 10,062,330 B2 | 8/2018 | Han et al. | |
| 10,140,940 B2 | 11/2018 | Aoki | |
| 10,181,291 B2 | 1/2019 | Han et al. | |
| 10,909,920 B2 | 2/2021 | Zhu et al. | |
| 2010/0301326 A1* | 12/2010 | Miyairi | H01L 27/1255 257/43 |
| 2011/0164071 A1 | 7/2011 | Chung et al. | |
| 2012/0249509 A1 | 10/2012 | Kim et al. | |
| 2013/0057532 A1* | 3/2013 | Lee | G09G 3/3225 345/76 |
| 2013/0321248 A1* | 12/2013 | Kimura | G09G 3/3208 345/76 |
| 2014/0326969 A1* | 11/2014 | Kim | G09G 3/3208 257/40 |
| 2015/0060847 A1* | 3/2015 | Miyake | H01L 29/78648 257/43 |
| 2015/0170569 A1 | 6/2015 | Han et al. | |
| 2015/0221637 A1 | 8/2015 | Kimura | |
| 2018/0330670 A1 | 11/2018 | Han et al. | |
| 2019/0266946 A1* | 8/2019 | Zhu | G09G 3/3266 |

FOREIGN PATENT DOCUMENTS

| | | |
|---|---|---|
| CN | 106952617 A | 7/2017 |
| EP | 1182638 A | 2/2002 |
| EP | 2884484 A | 6/2015 |
| EP | 3627485 A | 3/2020 |
| JP | 09-319339 A | 12/1997 |
| JP | 09-329806 A | 12/1997 |
| JP | 11-119698 A | 4/1999 |
| JP | 2001-520762 | 10/2001 |
| JP | 2002-140051 A | 5/2002 |
| JP | 2005-309422 A | 11/2005 |
| JP | 2006-078911 A | 3/2006 |
| JP | 2007-096055 A | 4/2007 |
| JP | 2007-123861 A | 5/2007 |
| JP | 2007-206590 A | 8/2007 |
| JP | 2009-031782 A | 2/2009 |
| JP | 2009-115840 A | 5/2009 |
| JP | 2009-204794 A | 9/2009 |
| JP | 2010-266494 A | 11/2010 |
| JP | 2010-286541 A | 12/2010 |
| JP | 2010286541 A * | 12/2010 |
| JP | 2011-119674 A | 6/2011 |
| JP | 2012-185328 A | 9/2012 |
| JP | 2014-006516 A | 1/2014 |
| JP | 2014-211631 A | 11/2014 |
| JP | 2017-027012 A | 2/2017 |
| JP | 2019-045613 A | 3/2019 |
| JP | 2019-045614 A | 3/2019 |
| KR | 2009-0004516 A | 1/2009 |
| KR | 2014-0131637 A | 11/2014 |
| TW | I556212 | 11/2016 |
| WO | WO-1998/047131 | 10/1998 |
| WO | WO-2015/016196 | 2/2015 |
| WO | WO-2019/030595 | 2/2019 |

OTHER PUBLICATIONS

Written Opinion (Application No. PCT/IB2018/056022) dated Nov. 27, 2018.

Toyotaka.K et al., "5-3: OLED Display Device Mounted with a Novel External Compensating Circuit", SID Digest '18 : SID International Symposium Digest of Technical Papers, May 30, 2018, vol. 49, No. 1, pp. 44-47.

European Search Report (Application No. 18850799.0) dated Jul. 1, 2021.

Chinese Office Action (Application No. 201880056149.8) dated Feb. 25, 2022.

Taiwanese Office Action (Application No. 107127905) dated Mar. 2, 2022.

\* cited by examiner

FIG. 12A1
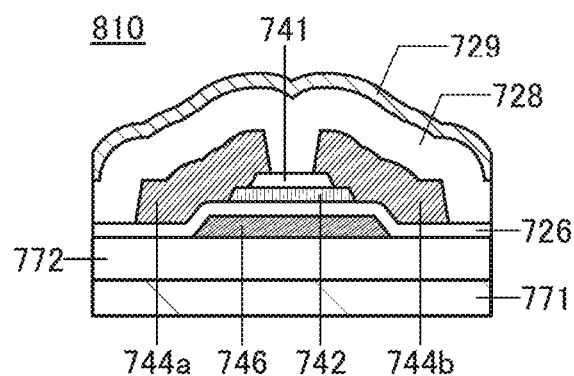
FIG. 12A2
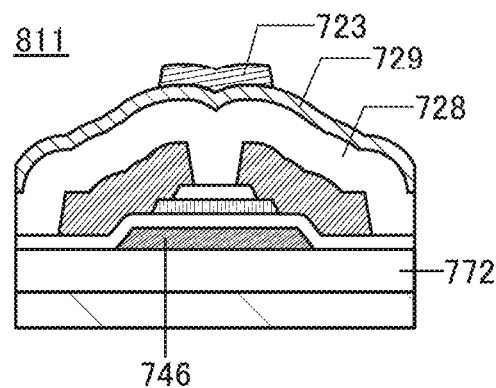
FIG. 12B1
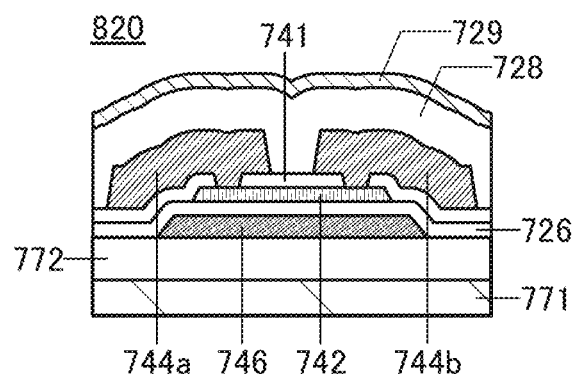
FIG. 12B2
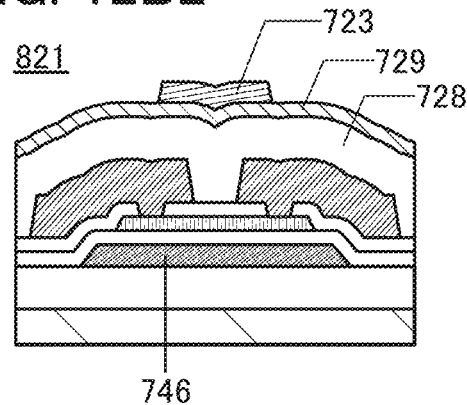
FIG. 12C1
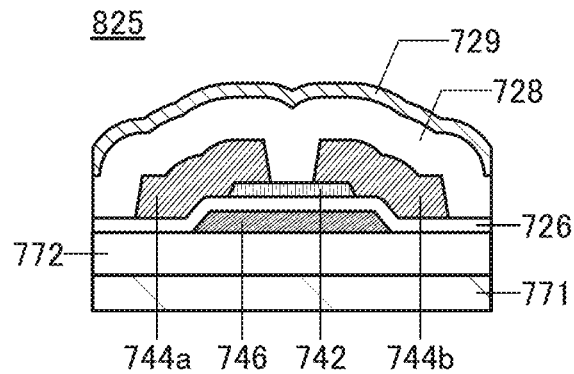
FIG. 12C2
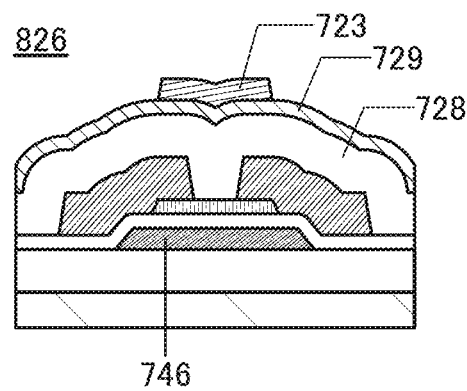

FIG. 13A1
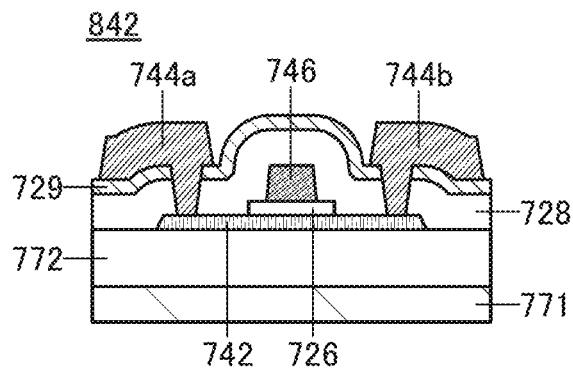
FIG. 13A2
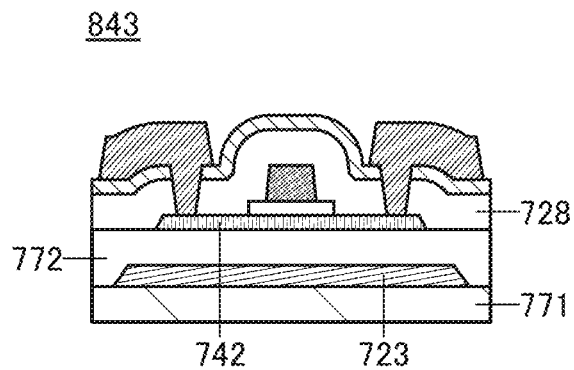
FIG. 13A3
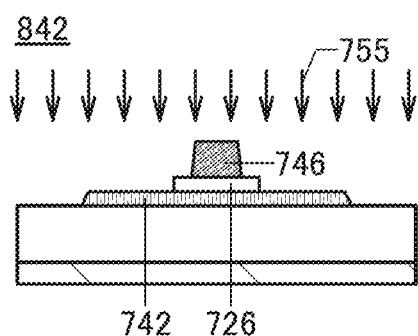
FIG. 13B1
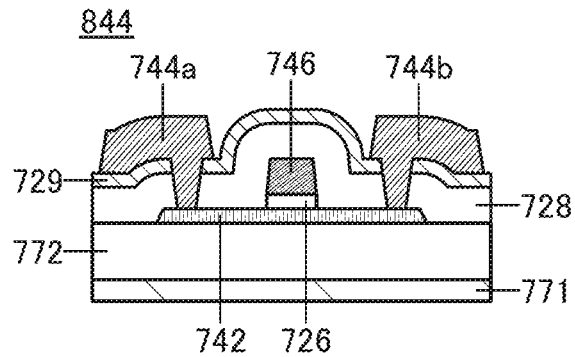
FIG. 13B2
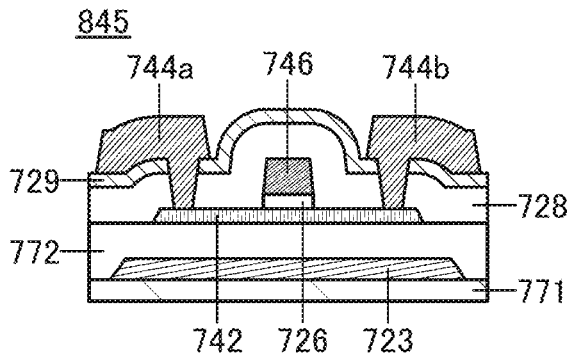
FIG. 13C1
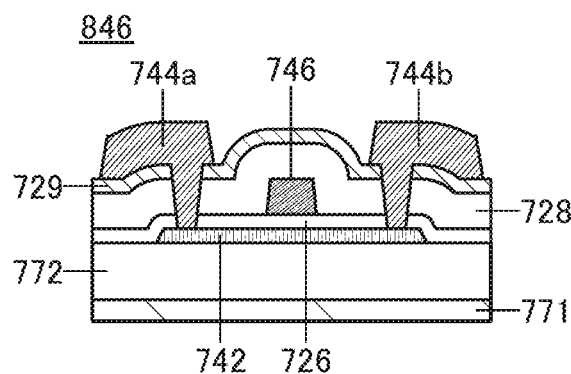
FIG. 13C2
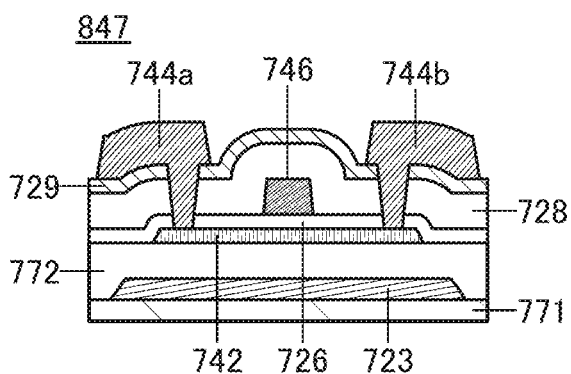

DISPLAY DEVICE AND ELECTRONIC DEVICE

CROSS REFERENCE TO RELATED APPLICATIONS

This application is a U.S. National Phase Application under 35 U.S.C. § 371 of International Application PCT/IB2018/056022, filed on Aug. 10, 2018, which claims the benefit of foreign priority applications filed in Japan on Aug. 31, 2017, as Application No. 2017-166757, on Nov. 30, 2017, as Application No. 2017-230388, on Feb. 22, 2018, as Application No. 2018-029271, and on May 17, 2018, as Application No. 2018-095317, all of which are incorporated by reference.

TECHNICAL FIELD

One embodiment of the present invention relates to a display device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a driving method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A technique for forming transistors using a metal oxide formed over a substrate has been attracting attention. For example, a technique in which a transistor formed using zinc oxide or In—Ga—Zn-based oxide is used as a switching element or the like of a pixel of a display device is disclosed in Patent Document 1 and Patent Document 2.

Patent Document 3 discloses a memory device using a transistor with an extremely low off-state current in a memory cell.

REFERENCES

Patent Documents

[Patent Document 1] Japanese Published Patent Application No. 2007-123861
[Patent Document 2] Japanese Published Patent Application No. 2007-096055 [Patent Document 3] Japanese Published Patent Application No. 2011-119674

DISCLOSURE OF INVENTION

The resolution of display devices has been increased; hardware capable of displaying images of an 8K4K (7680× 4320 pixels) or higher resolution has been developed. Meanwhile, peripheral technologies such as an imaging device, a memory device, and a communication device are required to catch up with the hardware technology to put high-resolution display devices into widespread use because the amount of image data of a high resolution is enormous.

A technique for generating image data of a high resolution is upconversion. Through upconversion, an image of a low resolution can be artificially converted into an image of a high resolution. Upconversion is performed in a peripheral device of a display device; therefore, a conventional technique can be utilized for a device that processes image data before upconversion.

However, a device that performs upconversion analyzes a massive amount of image data and generates new image data, so that the device has a problem of an increase in circuit size and power consumption. Furthermore, in some cases, the amount of processing is too much to handle in real time, causing display delay.

Although upconversion has such challenges, for example, when functions regarding upconversion are separated for a plurality of devices, problems such as power consumption and delay may be reduced.

A cause of a decrease in display quality of a display device including an EL (electroluminescence) element is variations in transistor characteristics of pixels. Methods for compensating for variations in transistor characteristics are internal correction, in which image data is corrected in a circuit in a pixel, and external correction, in which a correction value is acquired for each pixel and corrected image data is supplied to the pixel.

In internal correction, correction can be performed for each frame, but it is difficult to ensure an enough correction period because a horizontal selection period is short in the case of high-resolution display devices. Although external correction can be employed for high-resolution display devices, all image data are required to be corrected and thus a significant burden is placed on an external device. It is ideal that high-resolution display devices be operated without correction; however, a novel correcting means is required because variations in transistor characteristics are highly difficult to reduce.

In view of the above, an object of one embodiment of the present invention is to provide a display device capable of performing image processing. Another object of one embodiment of the present invention is to provide a display device capable of performing an upconversion operation. Another object of one embodiment of the present invention is to provide a display device capable of correcting image data.

Another object of one embodiment of the present invention is to provide a low-power display device. Another object of one embodiment of the present invention is to provide a highly reliable display device. Another object of one embodiment of the present invention is to provide a novel display device or the like. Another object of one embodiment of the present invention is to provide a method for driving any of the display devices. Another object of one embodiment of the present invention is to provide a novel semiconductor device or the like.

Note that the description of these objects does not disturb the existence of other objects. One embodiment of the present invention does not have to achieve all the objects. Other objects will be apparent from and can be derived from the description of the specification, the drawings, the claims, and the like.

One embodiment of the present invention relates to a display device capable of performing image processing. Another embodiment of the present invention relates to a display device capable of correcting image data.

One embodiment of the present invention is a display device comprising a pixel including a display element and a memory circuit. The memory circuit is configured to store first data. The memory circuit is configured to generate third data by adding the first data to second data. The display element is configured to display an image on the basis of the third data.

Another embodiment of the present invention is a display device comprising a first transistor, a second transistor, a third transistor, a fourth transistor, a first capacitor, a second capacitor, and a display element. One of a source and a drain of the first transistor is electrically connected to one electrode of the first capacitor. The other electrode of the first capacitor is electrically connected to one of a source and a drain of the second transistor. The one of the source and the drain of the second transistor is electrically connected to a gate of the third transistor. The gate of the third transistor is electrically connected to one electrode of the second capacitor. The other electrode of the second capacitor is electrically connected to one of a source and a drain of the third transistor. The one of the source and the drain of the third transistor is electrically connected to one of a source and a drain of the fourth transistor. The other of the source and the drain of the fourth transistor is electrically connected to one electrode of the display element.

An organic EL element can be used as the display element.

At least the second transistor contains a metal oxide in a channel formation region. The metal oxide preferably contains In, Zn, and M, where M is Al, Ti, Ga, Sn, Y, Zr, La, Ce, Nd, or Hf.

The first circuit can be configured to supply a constant potential. The first circuit can be configured to read a current value and generate correction data.

Another embodiment of the present invention is a display device comprising a first pixel, a second pixel, and a third pixel. The first pixel and the second pixel are adjacent to each other in a first direction. The first pixel and the third pixel are adjacent to each other in a direction perpendicular to the first direction. The first to third pixels each include first, second, and third subpixels. A first wiring electrically connected to the first subpixel of the first pixel is electrically connected to one terminal of a first switch. A second wiring electrically connected to the first subpixel of the second pixel is electrically connected to the other terminal of the first switch. A third wiring electrically connected to the second subpixel of the first pixel is electrically connected to one terminal of a second switch. A fourth wiring electrically connected to the second subpixel of the second pixel is electrically connected to the other terminal of the second switch. A fifth wiring electrically connected to the third subpixel of the first pixel is electrically connected to one terminal of a third switch. A sixth wiring electrically connected to the third subpixel of the second pixel is electrically connected to the other terminal of the third switch. A seventh wiring electrically connected to the first to third subpixels of the first pixel is electrically connected to one terminal of a fourth switch. An eighth wiring electrically connected to the first to third subpixels of the third pixel is electrically connected to the other terminal of the fourth switch.

The first to sixth wirings can serve as a signal line that supplies image data. The seventh and eighth wirings can serve as a signal line that selects a pixel.

The first to third subpixels can be configured to emit light of different colors.

According to one embodiment of the present invention, a display device capable of performing image processing can be provided. A display device capable of performing an upconversion operation can be provided. A display device capable of correcting image data can be provided.

A low-power display device can be provided. A highly reliable display device can be provided. A novel display device or the like can be provided. A method for driving any of the display devices can be provided. A novel semiconductor device or the like can be provided.

BRIEF DESCRIPTION OF DRAWINGS

FIGS. 12A1, 12A2, 12B1, 12B2, 12C1, and 12C2 illustrate transistors.
FIGS. 13A1, 13A2, 13A3, 13B1, 13B2, 13C1, and 13C2 illustrate transistors.

BEST MODE FOR CARRYING OUT THE INVENTION

Figure 1:
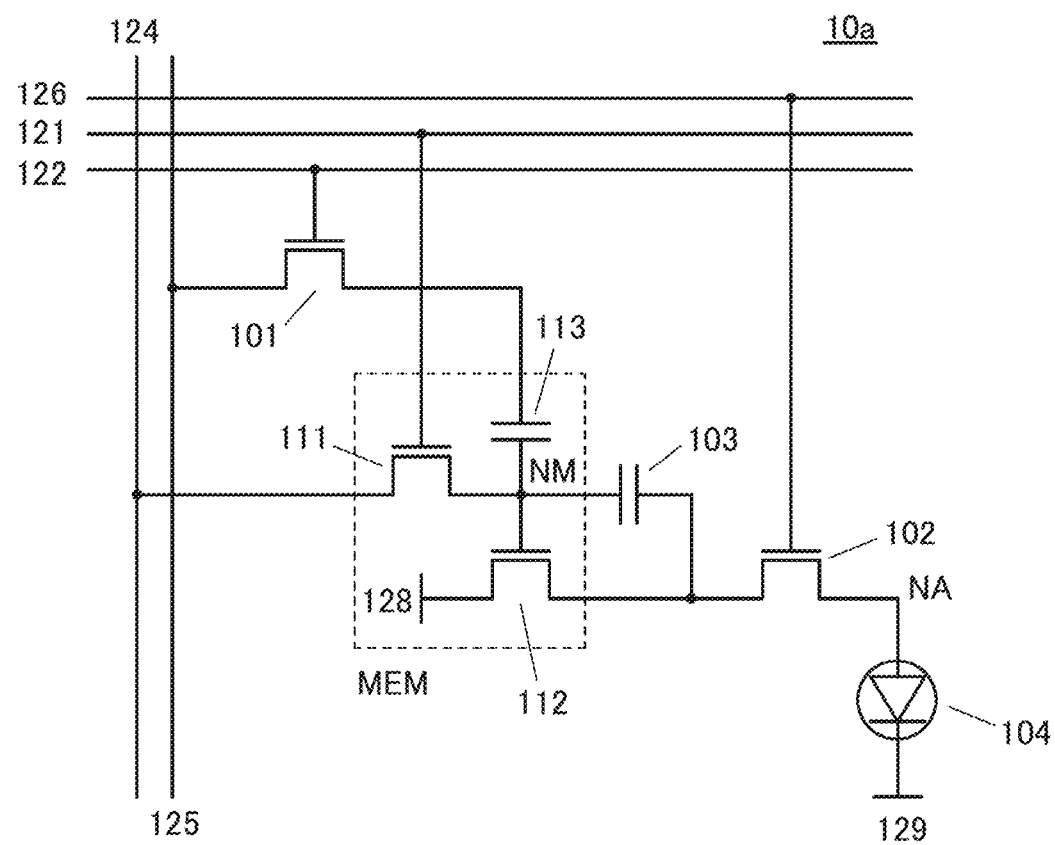
FIG. 1 illustrates a pixel circuit.

Embodiments and examples will be described in detail with reference to the drawings. Note that the present invention is not limited to the following description. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments and examples below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Embodiment 1

In this embodiment, a display device of one embodiment of the present invention will be described with reference to drawings.

One embodiment of the present invention is a display device having a function of adding correction data to image data. Each pixel is provided with a memory circuit in which desired correction data is retained. The correction data is generated in an external device and written to the pixel.

The correction data is added to image data by capacitive coupling, and the resulting data is supplied to a display element. Thus, the display element can display a corrected image. Through the correction, image upconversion can be performed, or image quality decreased because of variations in pixel transistor characteristics can be compensated for.

FIG. 1 illustrates a pixel 10a that can be used for a display device of one embodiment of the present invention. The pixel 10a includes a transistor 101, a transistor 102, a transistor 111, a transistor 112, a capacitor 103, a capacitor 113, and an EL element 104.

One of a source and a drain of the transistor 101 is electrically connected to one electrode of the capacitor 113. The other electrode of the capacitor 113 is electrically connected to one of a source and a drain of the transistor 111. The one of the source and the drain of the transistor 111 is electrically connected to a gate of the transistor 112. The gate of the transistor 112 is electrically connected to one electrode of the capacitor 103. The other electrode of the capacitor 103 is electrically connected to one of a source and a drain of the transistor 112. The one of the source and the drain of the transistor 112 is electrically connected to one of a source and a drain of the transistor 102. The other of the source and the drain of the transistor 102 is electrically connected to one electrode of the EL element 104.

Here, a wiring where the other electrode of the capacitor 113, the one of the source and the drain of the transistor 111, the gate of the transistor 112, and the one electrode of the capacitor 103 are connected is referred to as a node NM. A wiring where the other of the source and the drain of the transistor 102 and the one electrode of the EL element 104 are connected is referred to as a node NA.

A gate of the transistor 101 is electrically connected to a wiring 122. A gate of the transistor 102 is electrically connected to a wiring 126. A gate of the transistor 111 is electrically connected to a wiring 121. The other of the source and the drain of the transistor 101 is electrically connected to a wiring 125. The other of the source and the drain of the transistor 111 is electrically connected to a wiring 124.

The other of the source and the drain of the transistor 112 is electrically connected to a power supply line 128 (at high potential). The other electrode of the EL element 104 is electrically connected to the common wiring 129. Note that a given potential can be supplied to the common wiring 129.

The wirings 121, 122, and 126 can serve as a signal line for controlling the operation of the corresponding transistor. The wiring 125 can serve as a signal line for supplying image data.

The wiring 124 can serve as a signal line for writing data to a memory circuit MEM described next.

The transistor 111, the transistor 112, and the capacitor 113 form the memory circuit MEM. A node NM is a storage node; when the transistor 111 is turned on, data supplied to the wiring 124 can be written to the node NM. The use of a transistor with a noticeably low off-state current as the transistor 111 allows the potential of the node NM to be retained for a long time. As the transistor, a transistor using a metal oxide in a channel formation region (hereinafter referred to as an OS transistor) can be used, for example.

Note that an OS transistor may be used for other transistors of the pixel as well as the transistor 111. A transistor containing silicon (Si) in a channel formation region (hereinafter referred to as a Si transistor) may be used as the transistor 111. Both an OS transistor and a Si transistor may be used. Examples of the Si transistor include a transistor containing amorphous silicon and a transistor containing crystalline silicon (typically, low-temperature polysilicon and single crystal silicon).

In the case where an EL element is used as a display element, a silicon substrate can be used and a Si transistor and an OS transistor can be formed to at least partly overlap with each other. Thus, even when the number of transistors is relatively large, high pixel density can be achieved.

As a semiconductor material used for an OS transistor, a metal oxide whose energy gap is greater than or equal to 2 eV, preferably greater than or equal to 2.5 eV, more preferably greater than or equal to 3 eV can be used. A typical example is an oxide semiconductor containing indium, and a CAAC-OS or a CAC-OS described later can be used, for example. A CAAC-OS has a crystal structure including stable atoms and is suitable for a transistor that highly requires reliability, and the like. A CAC-OS has high mobility and is suitable for a transistor that operates at high speed, and the like.

An OS transistor has a large energy gap and thus has an extremely low off-state current. An OS transistor has the following feature different from that of a Si transistor: impact ionization, an avalanche breakdown, a short-channel effect, or the like does not occur. Thus, the use of an OS transistor enables formation of a highly reliable circuit.

A semiconductor layer included in the OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the oxide semiconductor contained in the semiconductor layer is an In-M-Zn-based oxide, it is preferable that the atomic ratio of metal elements of a sputtering target used to form a film of the In-M-Zn oxide satisfy In M and Zn M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio of metal elements in the formed semiconductor layer varies from the above atomic ratio of metal elements of the sputtering target in a range of ±40%.

An oxide semiconductor with low carrier density is used for the semiconductor layer. For example, the semiconductor layer may use an oxide semiconductor whose carrier density is lower than or equal to $1\times10^{17}/cm^3$, preferably lower than or equal to $1\times10^{15}/cm^3$, more preferably lower than or equal to $1\times10^{13}/cm^3$, still more preferably lower than or equal to $1\times10^{11}/cm^3$, even more preferably lower than $1\times10^{10}/cm^3$, and higher than or equal to $1\times10^{-9}/cm^3$. Such an oxide semiconductor is referred to as a highly purified intrinsic or substantially highly purified intrinsic oxide semiconductor. The oxide semiconductor can be said to have a low density of defect states and stable characteristics.

Note that, without limitation to those described above, a material with an appropriate composition may be used in accordance with required semiconductor characteristics and electrical characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon, which is an element belonging to Group 14, is contained in the oxide semiconductor contained in the semiconductor layer, the amount of oxygen vacancies is increased in the semiconductor layer, and the semiconductor layer becomes n-type. Thus, the concentration of silicon or carbon (measured by secondary ion mass spectrometry) in the semiconductor layer is set to lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer, which is measured by secondary ion mass spectrometry, is set to lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. Thus, a transistor using an oxide semiconductor that contains nitrogen is likely to be normally on. Hence, the concentration of nitrogen in the semiconductor layer, which is measured by secondary ion mass spectrometry, is preferably set to lower than or equal to $5\times10^{18}$ atoms/cm$^3$.

The semiconductor layer may have a non-single-crystal structure, for example. Examples of the non-single-crystal structure include CAAC-OS (c-axis aligned crystalline oxide semiconductor, or c-axis aligned a-b-plane-anchored crystalline oxide semiconductor) including a c-axis aligned crystal, a polycrystalline structure, a microcrystalline structure, and an amorphous structure. Among the non-single-crystal structures, an amorphous structure has the highest density of defect states, whereas CAAC-OS has the lowest density of defect states.

An oxide semiconductor film having an amorphous structure has disordered atomic arrangement and no crystalline component, for example. In another example, an oxide film having an amorphous structure has an absolutely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single crystal structure. The mixed film has, for example, a single-layer structure or a layered structure including two or more of the foregoing regions in some cases.

Described below is the composition of a cloud-aligned composite oxide semiconductor (CAC-OS), which is one embodiment of a non-single-crystal semiconductor layer.

The CAC-OS has, for example, a composition in which elements contained in an oxide semiconductor are unevenly distributed. Materials containing unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions containing the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In-Ga—Zn oxide with the CAC composition (such an In-Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite oxide semiconductor with a composition in which a region containing GaO$_{X3}$ as a main component and a region containing In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region is described as having higher In concentration than the second region.

Note that a compound containing In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ (−1≤x0≤1; m0 is a given number).

The above crystalline compounds have a single crystal structure, a polycrystalline structure, or a CAAC structure.

Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS containing In, Ga, Zn, and O, nanoparticle regions containing Ga as a main component are observed in part of the CAC-OS and nanoparticle regions containing In as a main component are observed in part thereof. These nanoparticle regions are randomly dispersed to form a mosaic pattern. Thus, the crystal structure is a secondary element for the CAC-OS.

Note that in the CAC-OS, a layered structure including two or more films with different atomic ratios is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions containing the selected metal element(s) as a main component(s) are observed in part of the CAC-OS and nanoparticle regions containing In as a main component are observed in part of the CAC-OS, and these nanoparticle regions are randomly dispersed to form a mosaic pattern in the CAC-OS.

The CAC-OS can be formed by a sputtering method under a condition where a substrate is intentionally not heated, for example. In the case where the CAC-OS is formed by a sputtering method, one or more of an inert gas (typically, argon), an oxygen gas, and a nitrogen gas may be used as a deposition gas. The flow rate of the oxygen gas to the total flow rate of the deposition gas in deposition is preferably as low as possible, for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an out-of-plane method, which is an X-ray diffraction (XRD) measurement method. That is, it is found by the XRD that there are no alignment in the a-b plane direction and no alignment in the c-axis direction in the measured areas.

In the CAC-OS, an electron diffraction pattern that is obtained by irradiation with an electron beam with a probe diameter of 1 nm (also referred to as nanobeam electron beam) has regions with high luminance in a ring pattern and a plurality of bright spots appear in the ring-like pattern. Thus, it is found from the electron diffraction pattern that the crystal structure of the CAC-OS includes a nanocrystalline (nc) structure that does not show alignment in the plane direction and the cross-sectional direction.

For example, energy dispersive X-ray spectroscopy (EDX) is used to obtain EDX mapping, and according to the EDX mapping, the CAC-OS of the In-Ga—Zn oxide has a composition in which the regions containing $GaO_{X3}$ as a main component and the regions containing $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions containing $GaO_{X3}$ or the like as a main component and regions containing $In_{X2}Zn_{Y2}O_{Z2}$ or $InO_{X1}$ as a main component are separated to form a mosaic pattern.

The conductivity of a region containing $In_{X2}Zn_{Y2}O_{Z2}$ or $InO_{X1}$ as a main component is higher than that of a region containing $GaO_{X3}$ or the like as a main component. In other words, when carriers flow through regions containing $In_{X2}Zn_{Y2}O_{Z2}$ or $InO_{X1}$ as a main component, the conductivity of an oxide semiconductor is generated. Accordingly, when regions containing $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region containing $GaO_{X3}$ or the like as a main component is more excellent than that of a region containing $In_{X2}Zn_{Y2}O_{Z2}$ or $InO_{X1}$ as a main component. In other words, when regions containing $GaO_{X3}$ or the like as a main component are distributed in an oxide semiconductor, leakage current can be suppressed and favorable switching operation can be achieved.

Accordingly, when a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Ion) and high field-effect mobility (μ) can be achieved.

A semiconductor element using a CAC-OS has high reliability. Thus, the CAC-OS is suitably used as a material in a variety of semiconductor devices.

In the pixel 10a, data written to the node NM is capacitively coupled with image data supplied from the wiring 125 and output to the node NA. Note that the transistor 101 can have a function of selecting a pixel. The transistor 102 can serve as a switch that controls light emission of the EL element 104.

For example, when the voltage of data written to the node NM from the wiring 124 is higher than the threshold voltage ($V_{th}$) of the transistor 112, the transistor 112 is turned on before image data is written, and thus, the EL element 104 emits light. For this reason, it is preferred that the transistor 102 be provided and be turned on so that the EL element 104 emits light, after the potential of the node NM is fixed.

In other words, in the case where desired correction data is stored in the node NM in advance, the correction data can be added to the supplied image data. Note that the correction data sometimes attenuates because of an element on a transmission path; accordingly, the correction data is preferably generated in consideration of the attenuation.

Note that in potential distribution, potential coupling, or potential loss, detailed changes due to a circuit configuration, operation timing, or the like are not considered. A change in potential resulting from capacitive coupling depends on the capacitance ratio of a side that supplies a potential to a side that is supplied with the potential; however, the capacitance values of the nodes NM and NA are assumed to be sufficiently small for simplicity of description.

Figure 2A:
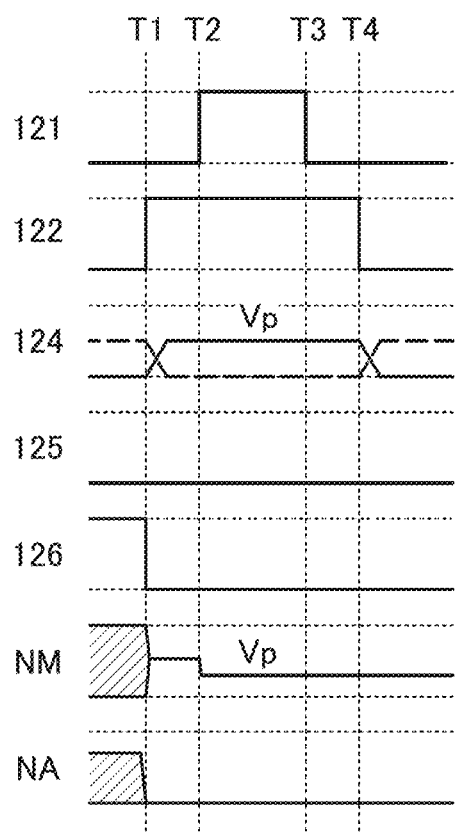
FIGS. 2A and 2B are timing charts each showing the operation of a pixel circuit.
Figure 2B:
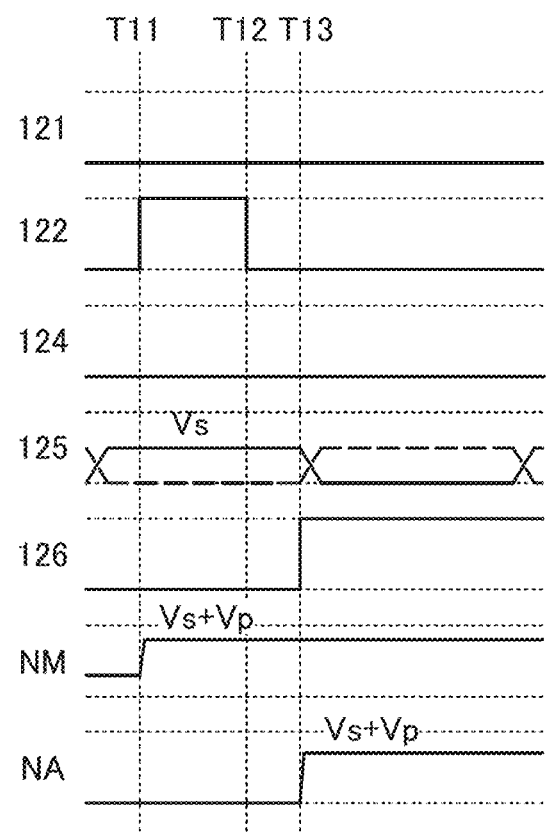

The operation of the pixel 10a will be described in detail with reference to timing charts shown in FIGS. 2A and 2B. Although a given positive or negative potential can be used as correction data (Vp) supplied to the wiring 124, the case where a positive potential is supplied will be described here. In the following description, a high potential is represented by "H", and a low potential is represented by "L".

First, an operation of writing the correction data (Vp) to the node NM will be described with reference to FIG. 2A. Note that in the process for upconversion, it is usually preferred that the operation be performed frame by frame.

At time T1, the potential of the wiring 121 is set to "L", the potential of the wiring 122 is set to "H", the potential of the wiring 125 is set to "L", and the potential of the wiring 126 is set to "L", so that the transistor 101 is turned on and the potential of the other electrode of the capacitor 113 becomes "L".

The operation is a reset operation to be performed before capacitive coupling. Before the time T1, the EL element 104 emits light in the previous frame; however, the reset operation changes the potential of the node NM, thereby changing the amount of current flowing through the EL element 104; thus, the transistor 102 is preferably turned off to stop light emission of the EL element 104.

At time T2, the potential of the wiring 121 is set to "H", the potential of the wiring 122 is set to "H", the potential of the wiring 125 is set to "L", and the potential of the wiring 126 is set to "L", so that the transistor 111 is turned on and the potential (correction data (Vp)) of the wiring 124 is written to the node NM.

At time T3, the potential of the wiring 121 is set to "L", the potential of the wiring 122 is set to "H", the potential of the wiring 125 is set to "L", and the potential of the wiring 126 is set to "L", so that the transistor 111 is turned off and the correction data (Vp) is retained in the node NM.

At time T4, the potential of the wiring 121 is set to "L", the potential of the wiring 122 is set to "L", the potential of the wiring 125 is set to "L", and the potential of the wiring 126 is set to "L", so that the transistor 101 is turned off. Thus, the operation of writing the correction data (Vp) is completed.

Next, an operation of correcting image data (Vs) and an operation of making the EL element 104 emit light will be described with reference to FIG. 2B.

At time T11, the potential of the wiring 121 is set to "L", the potential of the wiring 122 is set to "H", the potential of the wiring 124 is set to "L", and the potential of the wiring 126 is set to "L", so that the transistor 101 is turned on and the potential of the wiring 125 is added to the potential of the node NM by capacitive coupling of the capacitor 113. That is, the potential of the node NM becomes a potential (Vs+Vp) obtained by adding the correction data (Vp) to the image data (Vs).

At time T12, the potential of the wiring 121 is set to "L", the potential of the wiring 122 is set to "L", the potential of the wiring 124 is set to "L", and the potential of the wiring 126 is set to "L", so that the transistor 101 is turned off and the potential of the node NM is fixed to Vs+Vp.

At time T13, the potential of the wiring 121 is set to "L", the potential of the wiring 122 is set to "L", the potential of the wiring 124 is set to "L", and the potential of the wiring 126 is set to "H", so that the transistor 102 is turned on and the potential of the node NA becomes Vs+Vp. Thus, the EL element 104 emits light. Strictly speaking, the potential of the node NA is lower than Vs+Vp by the threshold voltage ($V_{th}$) of the transistor 112; here, the level of $V_{th}$ is as low as a negligible level.

The operation of correcting the image data (Vs) and the operation of making the EL element 104 emit light are described above. Note that the operation of writing the correction data (Vp) described above and an operation of inputting the image data (Vs) may be successively performed but the operation of inputting the image data (Vs) is preferably performed after the correction data (Vp) is written to all the pixels. In one embodiment of the present invention, since the same image data can be supplied to a plurality of pixels at a time, the operation speed can be increased by writing the correction data (Vp) to all the pixels first; the details will be described later.

The configuration and operation of the pixel 10a are advantageous for image upconversion. Upconversion using the pixel 10a will be described with reference to FIGS. 3A and 3B.

For example, the number of pixels of a 8K4K display device is four times that of a 4K2K display device (3840×2160). That is to say, in order that image data that is displayed in one pixel of a 4K2K display device can be simply displayed on an 8K4K display device, the same image data is displayed in four pixels.

Figure 3A:
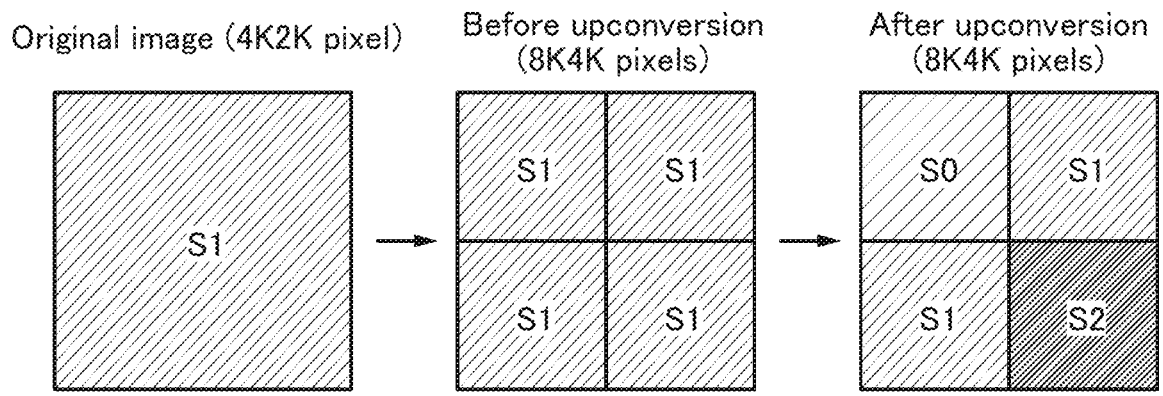
FIGS. 3A and 3B illustrate upconversion.

An image displayed in four pixels in the longitudinal and lateral directions is illustrated in FIG. 3A assuming the above condition. As in FIG. 3A, image data S1 is displayed in all the four pixels before upconversion, while image data S0 to S2 are displayed in corresponding pixels after upconversion, contributing to an increase in resolution.

Figure 3B:
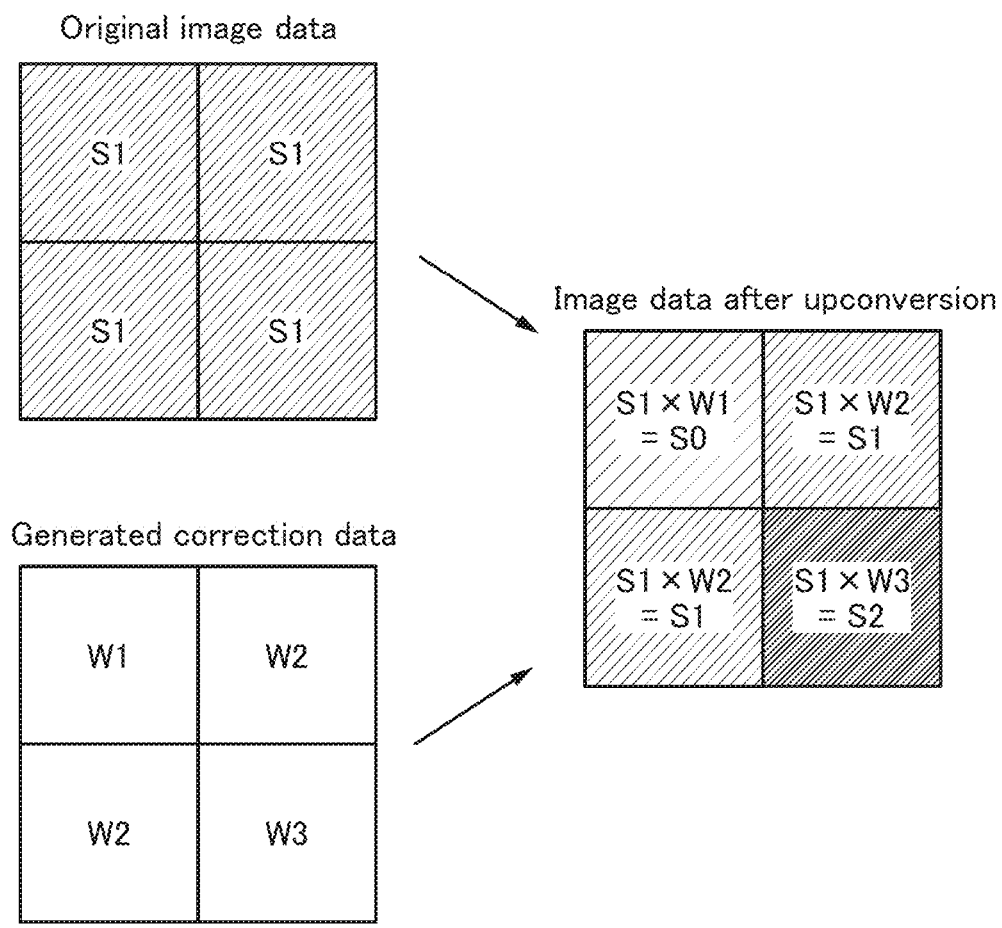

FIG. 3B illustrates an upconversion operation in the pixel 10a. In the pixel 10a, given correction data can be added to image data as described above. Therefore, the original image data S1 is supplied to each pixel as it is.

Furthermore, W1 to W3 are supplied as correction data to corresponding pixels. Here, a method for generating W1 to W3 is not particularly limited. The correction data may be generated in real time using an external device, or correction data stored in a storage medium may be read and synchronized with the image data S1.

Through the operation in the pixel 10a described above, the correction data is added to the corresponding image data, so that new image data S0 to S2 are generated. Thus, an image to which the original data has been upconverted can be displayed.

Conventional upconversion by external correction generates new image data itself and thus an external device has a heavy load. In contrast, in one embodiment of the present invention described above, supplied image data is not changed and new image data is generated in a pixel to which correction data has been supplied; consequently, a load on the external device can be reduced. Furthermore, the operation for generating new image data in a pixel can be performed in a small number of steps and thus can be performed even in a display device with a large number of pixels and a short horizontal period.

Figure 4A:
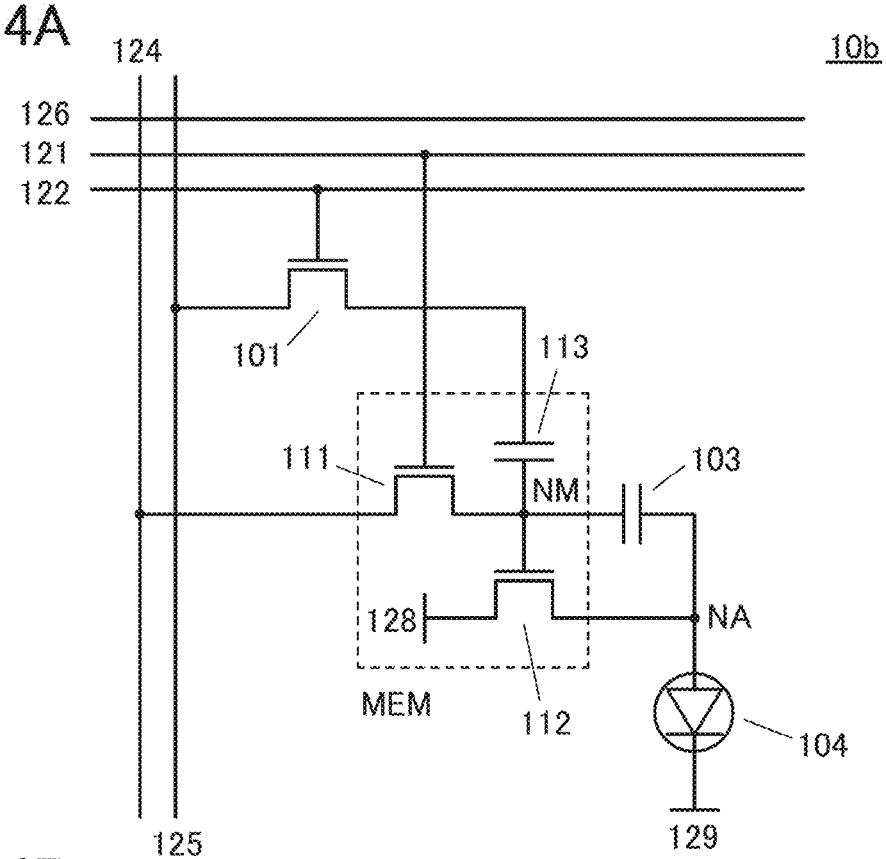
FIGS. 4A and 4B each illustrate a pixel circuit.

The pixel of one embodiment of the present invention may have the configuration of the pixel 10b illustrated in FIG. 4A. The pixel 10b has the same configuration as the pixel 10a except that the transistor 102 is not provided.

As described above, the transistor 102 is provided to solve a malfunction that occurs in the case where the voltage of data written to the node NM is higher than or equal to the threshold voltage ($V_{th}$) of the transistor 112. Note that when the voltage of data to be written to the node NM is set to lower than $V_{th}$, the transistor 102 can be omitted.

Figure 4B:
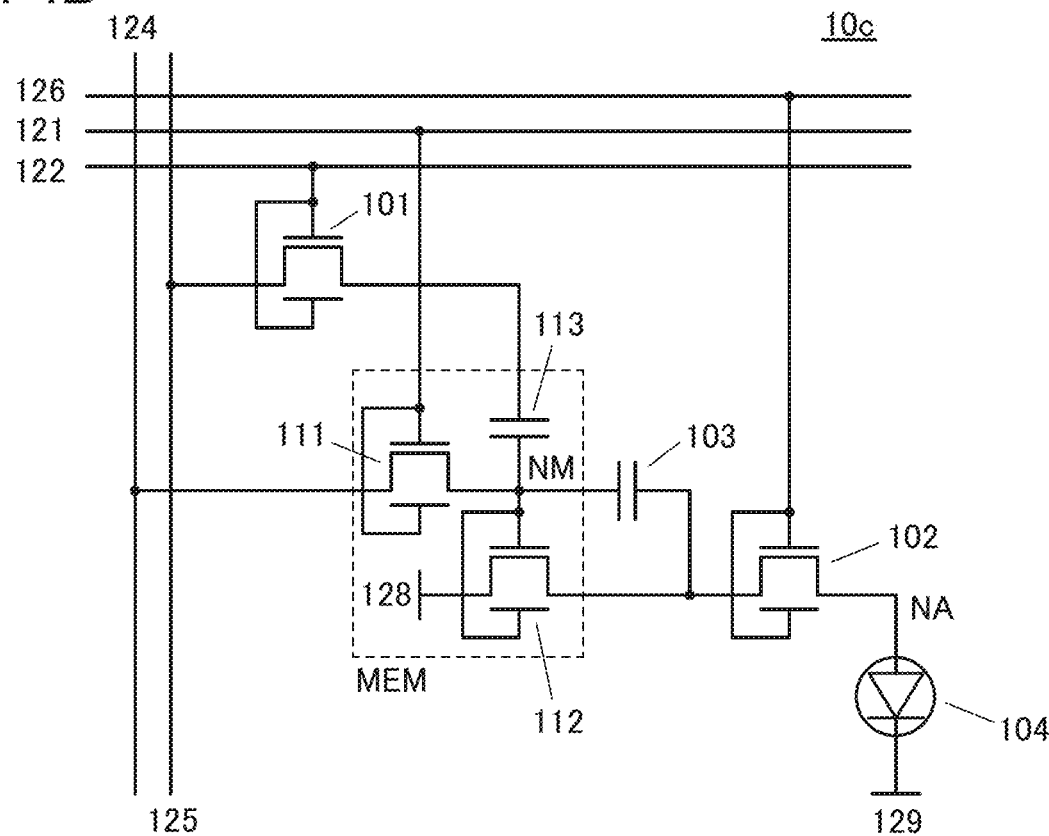

The pixel of one embodiment of the present invention may have the configuration of the pixel 10c illustrated in FIG. 4B. The pixel 10c includes transistors each with a back gate. The back gate is electrically connected to a front gate and can increase on-state current. Different constant potentials may be supplied to the back gate and the front gate. In such a configuration, the threshold voltage of the transistor can be controlled. Although all of the transistors have a back gate in FIG. 4B, a transistor without a back gate may also be included. A transistor with a back gate can also be used effectively in another pixel circuit in this embodiment.

Figure 5:
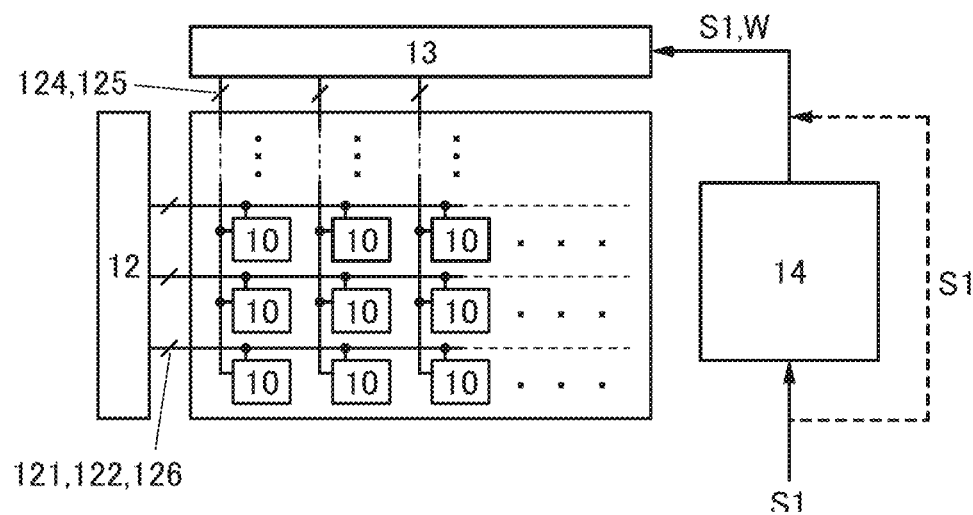
FIG. 5 is a block diagram illustrating a display device.

FIG. 5 is an example of a block diagram of a display device of one embodiment of the present invention. The display device includes a pixel array where pixels 10 are arranged in a matrix, a row driver 12, a column driver 13, and a circuit 14. As the pixel 10, any of the pixels 10a to 10c can be used.

For example, a shift register circuit can be used for the row driver 12 and the column driver 13. The circuit 14 has a function of generating correction data. The circuit 14 can also be referred to as an external device for generating correction data.

The image data S1 described with reference to FIGS. 3A and 3B is input to the circuit 14, and the image data S1 and generated correction data W are output to the column driver 13. Note that the image data S1 may be input to the column driver 13 not through the circuit 14.

The circuit 14 may also include a neural network. For example, the use of a deep neural network that has learned a huge number of images as teacher data allows generation of highly accurate correction data W.

Although the upconversion operation in a pixel including the memory circuit MEM is mainly described above, an operation of correcting variations in transistor characteristics can also be performed in the pixel. In the pixel using an EL element, variations in the threshold voltage of a driving transistor that supplies current to the EL element significantly affect display quality. Data for correcting the threshold voltage of the driving transistor is retained in the memory circuit MEM and added to image data, so that display quality can be improved.

Figure 6:
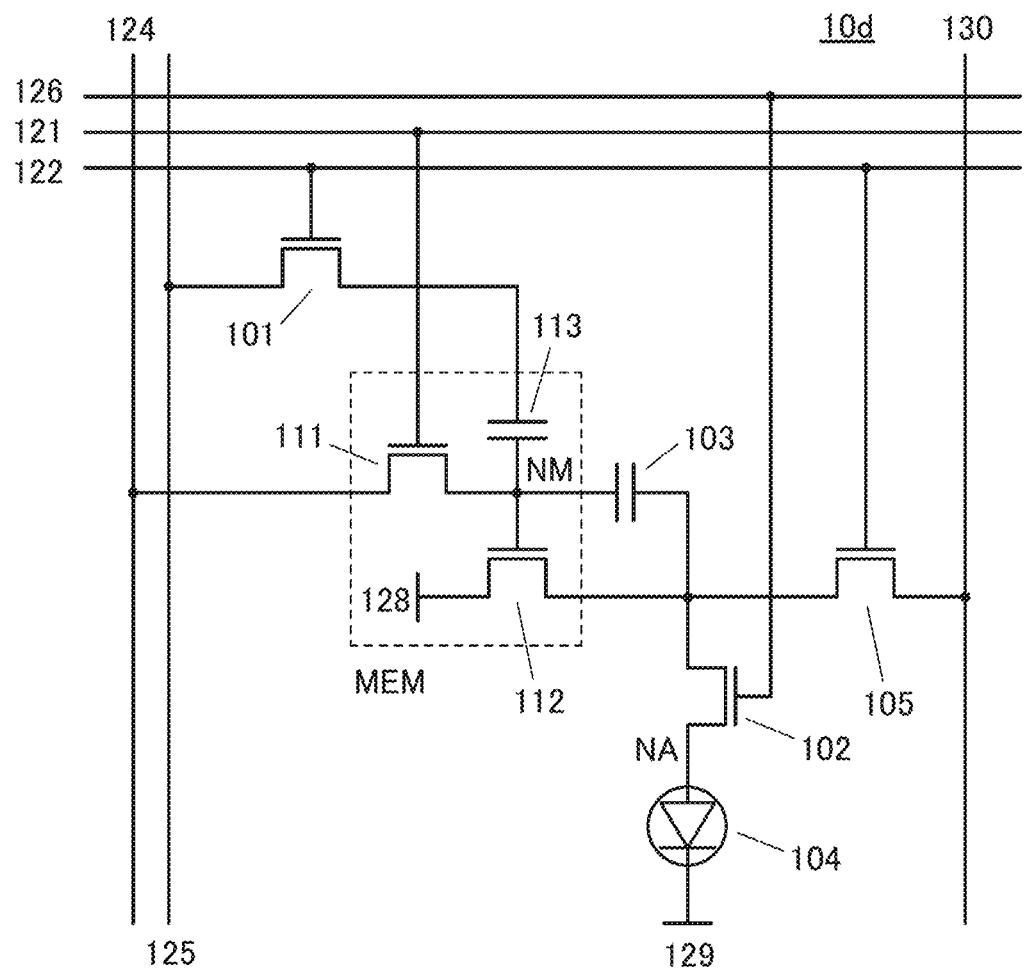
FIG. 6 illustrates a pixel circuit.

FIG. 6 illustrates the configuration of a pixel 10d that can perform an operation of correcting the threshold voltage ($V_{th}$) of the transistor 112 corresponding to the driving transistor. The pixel 10d includes a transistor 105 and a wiring 130 in addition to the components of the pixel 10a. Note that the upconversion operation described above may be performed using the pixel circuit with such a configuration. Both the operation of correcting threshold voltage and the upconversion operation may be performed.

One of a source and a drain of the transistor 105 is electrically connected to one of a source and a drain of the transistor 112. The other of the source and the drain of the transistor 105 is electrically connected to the wiring 130. A gate of the transistor 105 is electrically connected to the wiring 122.

The wiring 130 serves as a monitor line for obtaining the electrical characteristics of the transistor 111. A certain potential is supplied to the one of the source and the drain of the transistor 112 from the wiring 130 through the transistor 105, whereby image data can be stably written.

The pixel 10d performs an operation of external correction as an initial operation, and generated correction data is stored in the memory circuit MEM. Thus, after the correction data is retained in the memory circuit MEM, the pixel 10d operates as in internal correction.

Figure 7A:
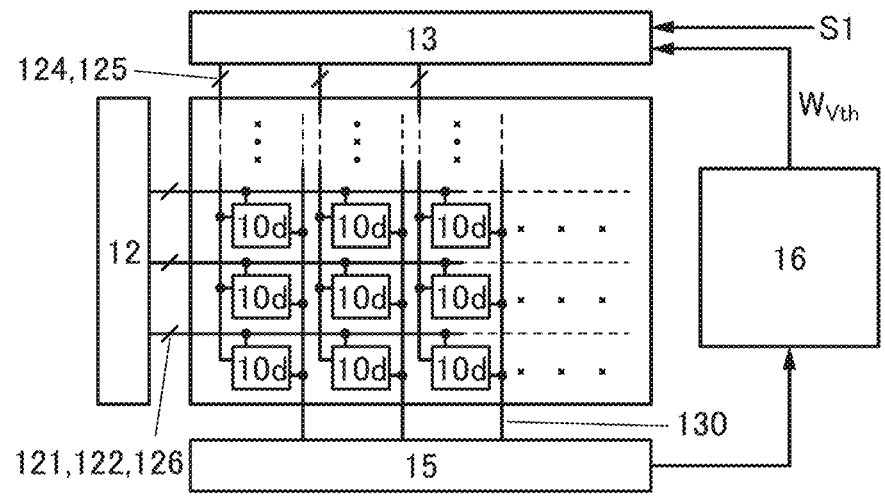
FIGS. 7A and 7B are block diagrams each illustrating a display device.

Generation of correction data and storage of the correction data in the memory circuit MEM will be described with reference to the circuit diagram in FIG. 6 and a block diagram of a display device in FIG. 7A. The display device includes a pixel array where the pixels 10d are arranged in a matrix, the row driver 12, the column driver 13, a column driver 15, and a circuit 16.

For the column driver 15, a shift register circuit can be used, for example. The circuit 16 has a function of generating correction data. With the column driver 15, the wirings 130 can be sequentially selected and the output values of the wirings 130 can be input to the circuit 16.

First, the transistor 111 is turned on to write a standard potential with which the transistor 112 is turned on to the node NM. Current output from the transistor 112 is taken into the circuit 16 through the transistor 105. The operation is performed for all the pixels and the current value output by each of the transistors 112 when the standard potential is supplied to a gate is acquired.

The circuit 16 reads and analyzes the current values and generates correction data $W_{Vth}$ to be stored in each pixel, on the basis of the transistor whose current value is a mean value or a median value. The correction data $W_{Vth}$ is input to the column driver 13 and stored in the memory circuit MEM of each pixel. Note that the following may be employed: the circuit 16 has a function of reading current values and another circuit has the function of generating the correction data $W_{Vth}$.

After the above steps, an operation of displaying an image using data obtained by adding correction data to image data is performed like the upconversion operation. Note that the threshold voltage of a transistor noticeably varies over a long period but rarely varies in a short period. Thus, generating correction data and storing the correction data in the memory circuit MEM do not need to be performed frame by frame and can be performed when power is turned on or off, for example. The operation time of the display device may be recorded so that the operations can be performed at regular intervals of days, weeks, months, years, or the like.

Figure 7B:
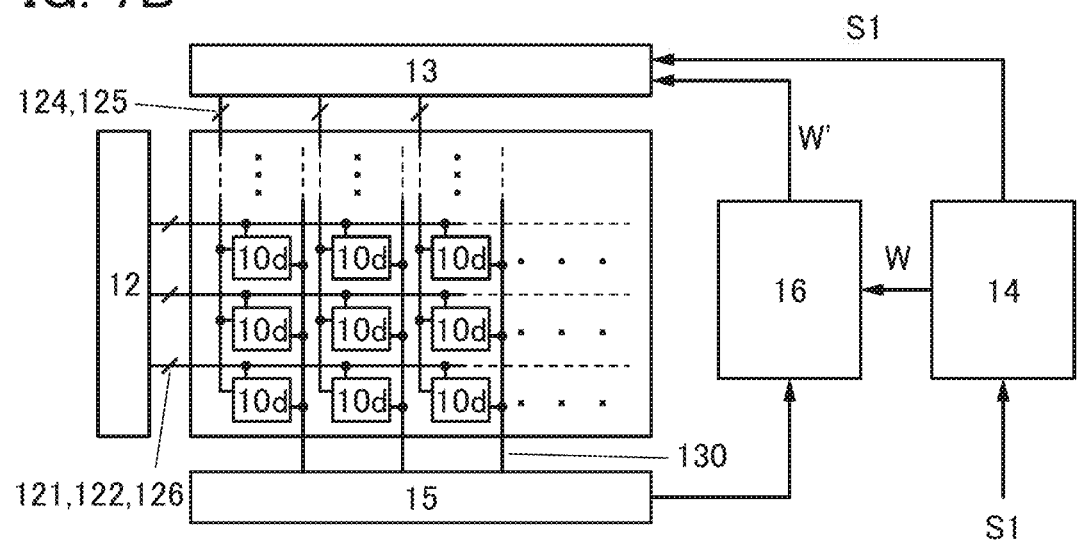

In the case where both correcting threshold voltage and upconversion are performed, the circuit 14 (refer to the description of FIG. 5), which generates correction data for upconversion, may be provided as illustrated in the block diagram of FIG. 7B. In that case, the correction data $W_{Vth}$ generated in the circuit 14 is input to the circuit 16, and correction data W' obtained by adding the correction data $W_{Vth}$ for threshold voltage correction to the correction data for upconversion is input to the column driver 13 from the circuit 16.

Although the method for generating the correction data $W_{Vth}$ by measuring the value of current output from the transistor 112 is described above, the correction data $W_{Vth}$ may be generated by another method. For example, the correction data $W_{Vth}$ may be generated on the basis of data obtained by reading the luminance of a displayed grayscale image with a luminance meter or data obtained by reading a photograph of the displayed image. For generation of the correction data $W_{Vth}$, inference using a neural network is preferably employed.

The display device of one embodiment of the present invention is capable of generating an image subjected to upconversion in pixels as described with reference to FIGS. 3A and 3B. Thus, the same image data of a low resolution is supplied to a plurality of pixels. In the example illustrated in FIGS. 3A and 3B, the same image data is supplied to four pixels in the longitudinal and lateral directions. In this case, the same image data may be supplied to signal lines connected to corresponding pixels, and electrically connecting the signal lines that supply the same image data allows image data to be written at high speed.

Figure 8:
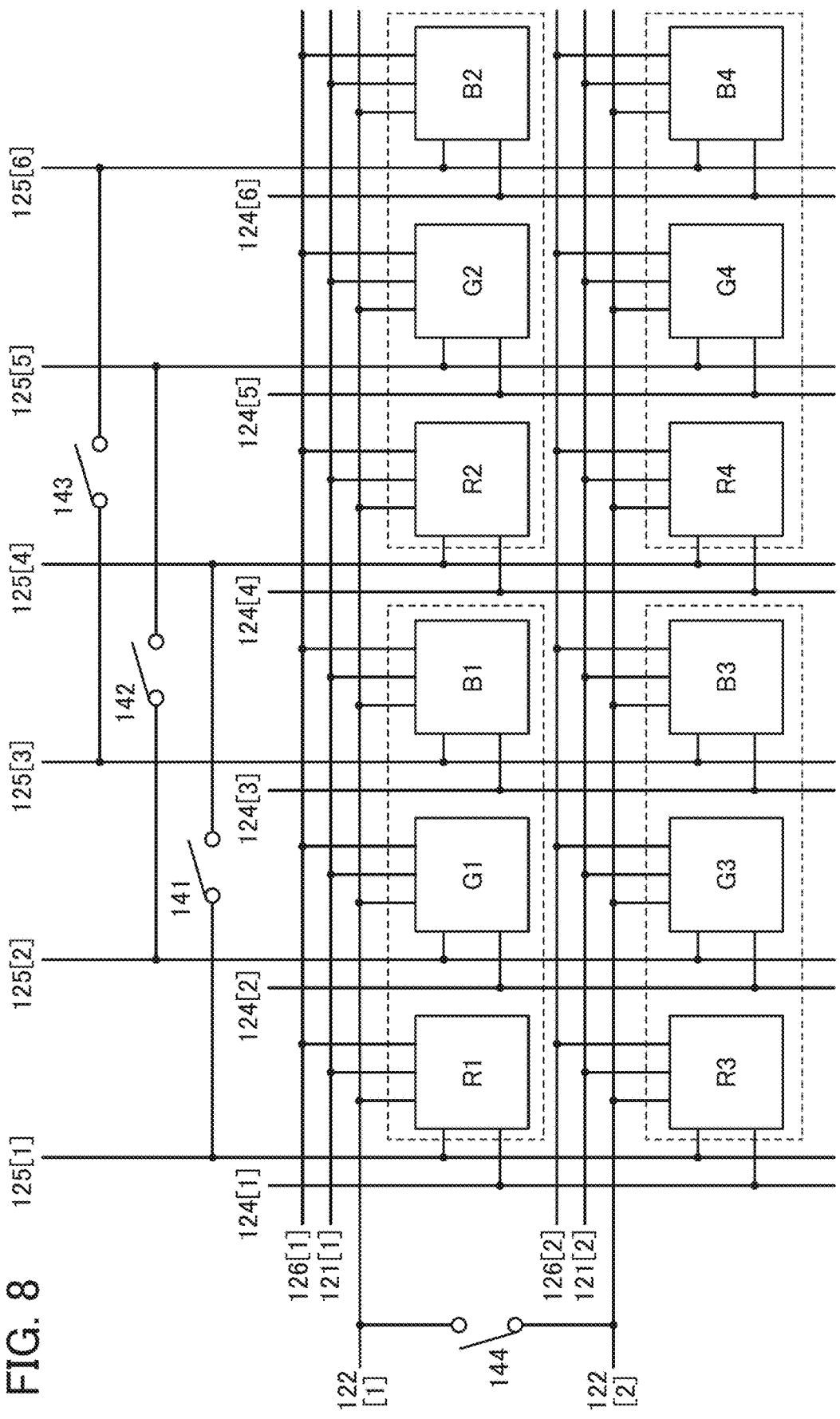
FIG. 8 illustrates a pixel array.

FIG. 8 illustrates part of a pixel array of a display device capable of color display, in which signal lines that supply the same image data can be electrically connected to each other through a switch. A pixel of a display device capable of color display generally includes a combination of subpixels that emit red (R) light, green (G) light, and blue (B) light. FIG. 8 illustrates four pixels in the longitudinal and lateral directions each composed of three subpixels of R, G, and B arranged in the lateral direction.

Here, as illustrated in FIGS. 3A and 3B, the same image data is input to four pixels in the longitudinal and lateral directions. In FIG. 8, the same image data is supplied to pixels R1 to R4. For example, the same image data is supplied to wirings 125[1] and 125[4] that are connected to the pixels R1 to R4 and serve as signal lines and signals are sequentially input to wirings 122[1] and 122[2] that serve as scan lines, whereby the same image data can be input to all pixels. Note that the method is wasteful in supplying the same image data to a plurality of pixels.

In one embodiment of the present invention, electrical continuity between the signal lines is provided with a switch placed between two signal lines and electrical continuity between the scan lines is provided with a switch placed between two scan lines, whereby image data can be written to four pixels at a time.

As illustrated in FIG. 8, a switch 141 placed between the wirings 125[1] and 125[4] is turned on, whereby image data supplied to one of the wirings 125[1] and 125[4] can be written to the pixel R1 and R2 simultaneously. At this time, the switch 144 placed between the wirings 122[1] and 122[2] is turned on so that the image data can also be written to the pixels R3 and R4. That is, simultaneous data writing to the four pixels is possible.

Similarly, a switch 142 placed between wirings 125[2] and 125[5] and a switch 143 placed between wirings 125[3] and 125[6] are turned on as needed, whereby image data can be written to other four pixels at a time. As the switches 141 to 144, a transistor can be used, for example.

Simultaneous data writing to four pixels enables a reduction in writing time and an increase in frame frequency.

This embodiment can be implemented in combination with any of the structures described in the other embodiments, examples, or the like, as appropriate.

Embodiment 2

In this embodiment, structure examples of a display device including an EL element will be described. Note that the operation and functions for correction described in Embodiment 1 will not be described in this embodiment.

Figure 9A:
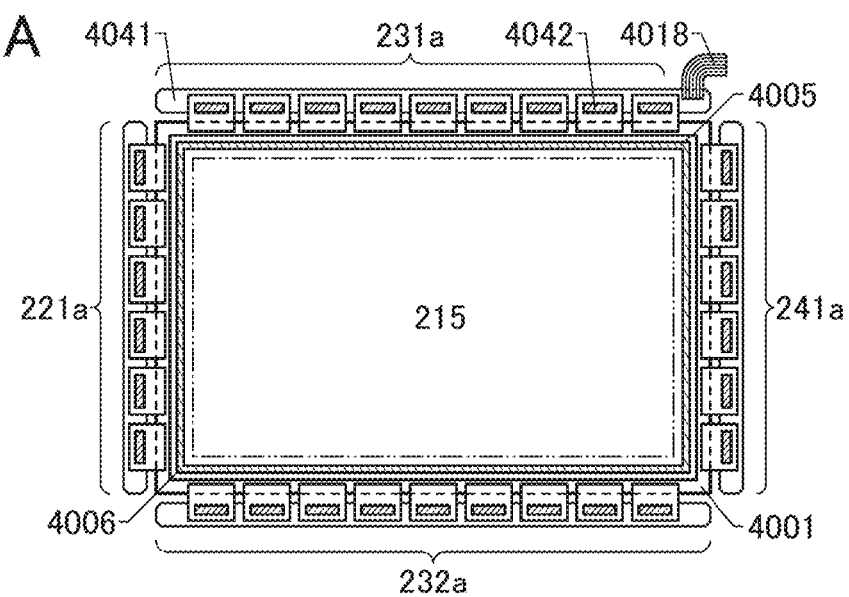
FIGS. 9A to 9C each illustrate a display device.
Figure 9B:
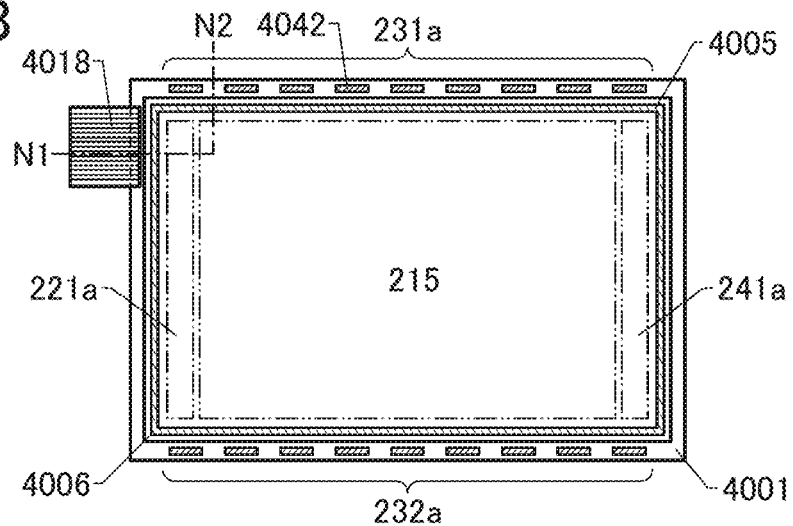
Figure 9C:
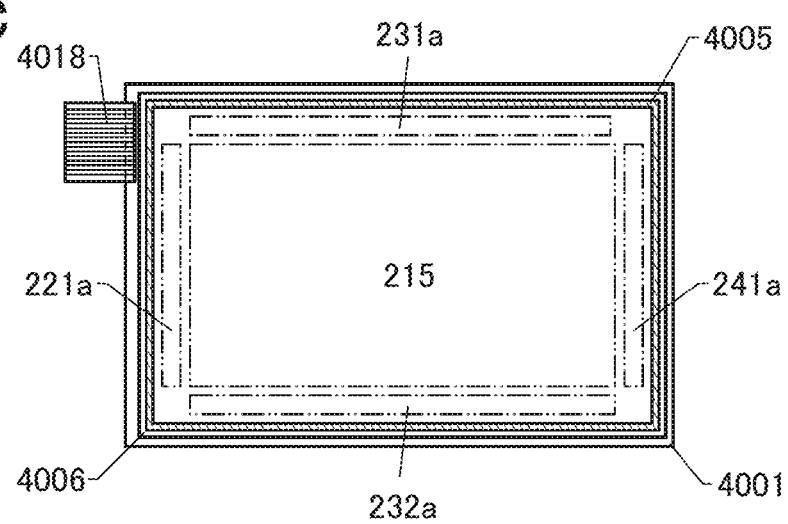

FIGS. 9A to 9C each illustrate the structure of a display device that can be manufactured using one embodiment of the present invention.

In FIG. 9A, a sealant 4005 is provided to surround a display portion 215 provided over a first substrate 4001, and the display portion 215 is sealed with the sealant 4005 and a second substrate 4006.

A pixel array including the pixels described in Embodiment 1 is provided in the display portion 215.

In FIG. 9A, a scan line driver circuit 221a, a signal line driver circuit 231a, a signal line driver circuit 232a, and a common line driver circuit 241a each include a plurality of integrated circuits 4042 provided over a printed circuit board 4041. The integrated circuits 4042 are each formed using a single crystal semiconductor or a polycrystalline semiconductor. The signal line driver circuit 231a and the signal line driver circuit 232a each function as the column driver described in Embodiment 1. The scan line driver circuit 221a functions as the row driver described in Embodiment 1. The common line driver circuit 241a has a function of supplying a predetermined potential to the common wiring described in Embodiment 1.

Signals and potentials are supplied to the scan line driver circuit 221a, the common line driver circuit 241a, the signal line driver circuit 231a, and the signal line driver circuit 232a through a flexible printed circuit (FPC) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying image data to the display portion 215. The integrated circuits 4042 are mounted in a region different from a region surrounded by the sealant 4005 over the first substrate 4001.

Note that the connection method of the integrated circuits 4042 is not particularly limited; a wire bonding method, a chip on glass (COG) method, a tape carrier package (TCP) method, a chip on film (COF) method, or the like can be used.

FIG. 9B shows an example of mounting the integrated circuits 4042 included in the signal line driver circuit 231a and the signal line driver circuit 232a by a COG method. Some or all of the driver circuits can be formed over a substrate over which the display portion 215 is formed, whereby a system-on-panel can be obtained.

In the example shown in FIG. 9B, the scan line driver circuit 221a and the common line driver circuit 241a are formed over the substrate over which the display portion 215 is formed. When the driver circuits are formed concurrently with the pixel circuit in the display portion 215, the number of components can be reduced. Accordingly, the productivity can be increased.

In FIG. 9B, the sealant 4005 is provided to surround the display portion 215, the scan line driver circuit 221a, and the common line driver circuit 241a over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed together with a display element with the use of the first substrate 4001, the sealant 4005, and the second substrate 4006.

Although the signal line driver circuit 231a and the signal line driver circuit 232a are formed separately and mounted on the first substrate 4001 in the example shown in FIG. 9B, one embodiment of the present invention is not limited to this structure. The scan line driver circuits may be separately formed and then mounted, or part of the signal line driver circuits or part of the scan line driver circuits may be separately formed and then mounted. The signal line driver circuit 231a and the signal line driver circuit 232a may be provided over the substrate over which the display portion 215 is formed, as illustrated in FIG. 9C.

In some cases, the display device encompasses a panel in which a display element is sealed, and a module in which an IC or the like including a controller is mounted on the panel.

The display portion and the scan line driver circuit over the first substrate each include a plurality of transistors. Any of the transistors described in the above embodiment can be used as the transistors.

Transistors included in the peripheral driver circuits and transistors included in the pixel circuits of the display portion may have the same structure or different structures. The transistors included in the peripheral driver circuits may have the same structure or a combination of two or more kinds of structures. Similarly, the transistors included in the pixel circuits may have the same structure or a combination of two or more kinds of structures.

An input device 4200 can be provided over the second substrate 4006. The display devices illustrated in FIGS. 9A to 9C and provided with the input device 4200 can function as a touch panel.

There is no particular limitation on a sensor element included in the touch panel of one embodiment of the present invention. A variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element will be described as an example.

Examples of the capacitive sensor element include a surface capacitive sensor element and a projected capacitive sensor element. Examples of the projected capacitive sensor element include a self-capacitive sensor element and a mutual capacitive sensor element. The use of a mutual capacitive sensor element is preferable because multiple points can be sensed simultaneously.

The touch panel of one embodiment of the present invention can have any of a variety of structures, including a structure in which a display device and a sensor element that are separately formed are attached to each other and a structure in which an electrode and the like included in a sensor element are provided on one or both of a substrate supporting a display element and a counter substrate.

Figure 10A:
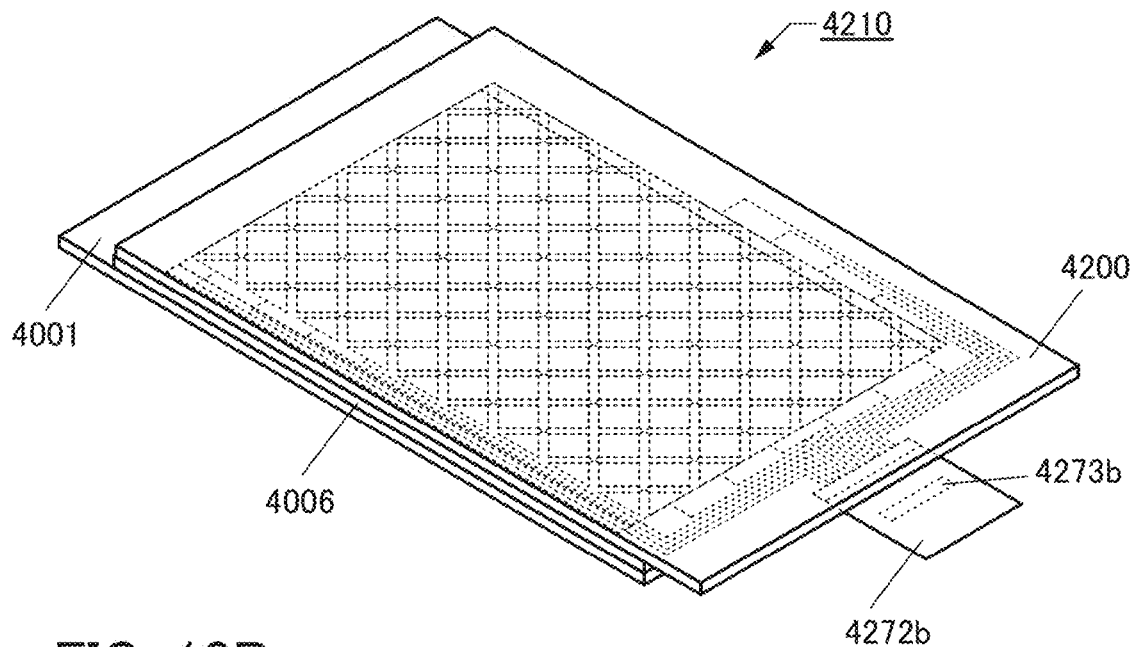
FIGS. 10A and 10B illustrate a touch panel.
Figure 10B:
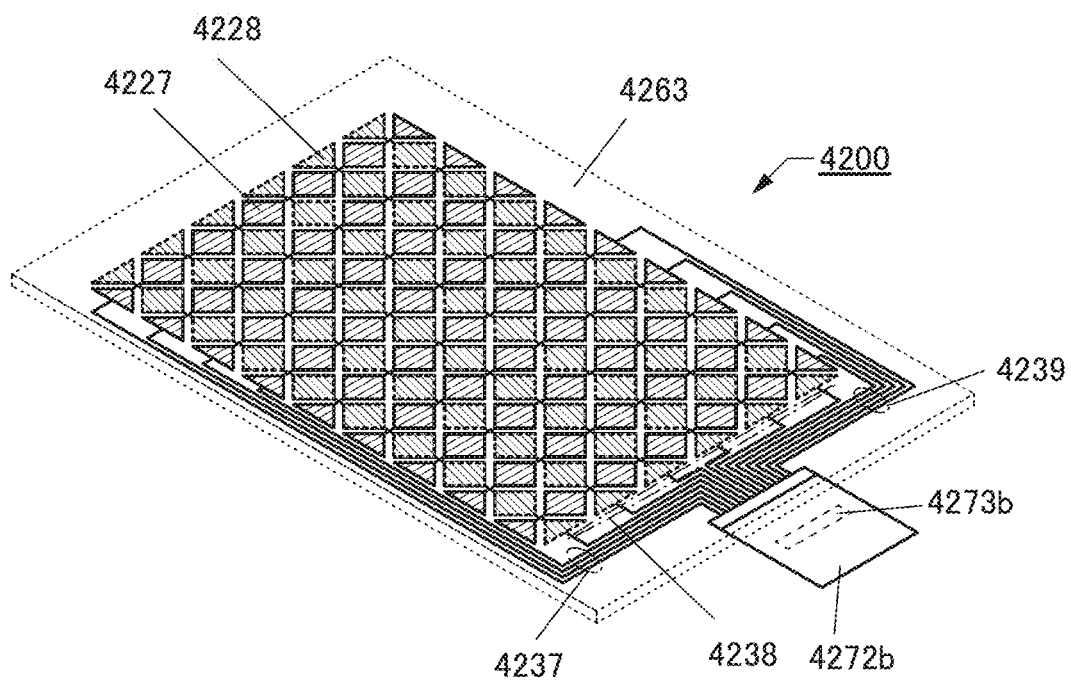

FIGS. 10A and 10B illustrate an example of the touch panel. FIG. 10A is a perspective view of a touch panel 4210. FIG. 10B is a schematic perspective view of the input device 4200. Note that for simplicity, FIGS. 10A and 10B illustrate only the major components.

The touch panel 4210 has a structure in which a display device and a sensor element that are formed separately are bonded together.

The touch panel 4210 includes the input device 4200 and the display device, which are provided to overlap with each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to the wiring 4237 or 4239. In addition, the electrode 4228 can be electrically connected to the wiring 4239. An FPC 4272b is electrically connected to each of the plurality of wirings 4237 and the plurality of wirings 4238. An IC 4273b can be provided on the FPC 4272b.

A touch sensor may be provided between the first substrate 4001 and the second substrate 4006 in the display device. In the case where a touch sensor is provided between the first substrate 4001 and the second substrate 4006, either a capacitive touch sensor or an optical touch sensor including a photoelectric conversion element may be used.

Figure 11:
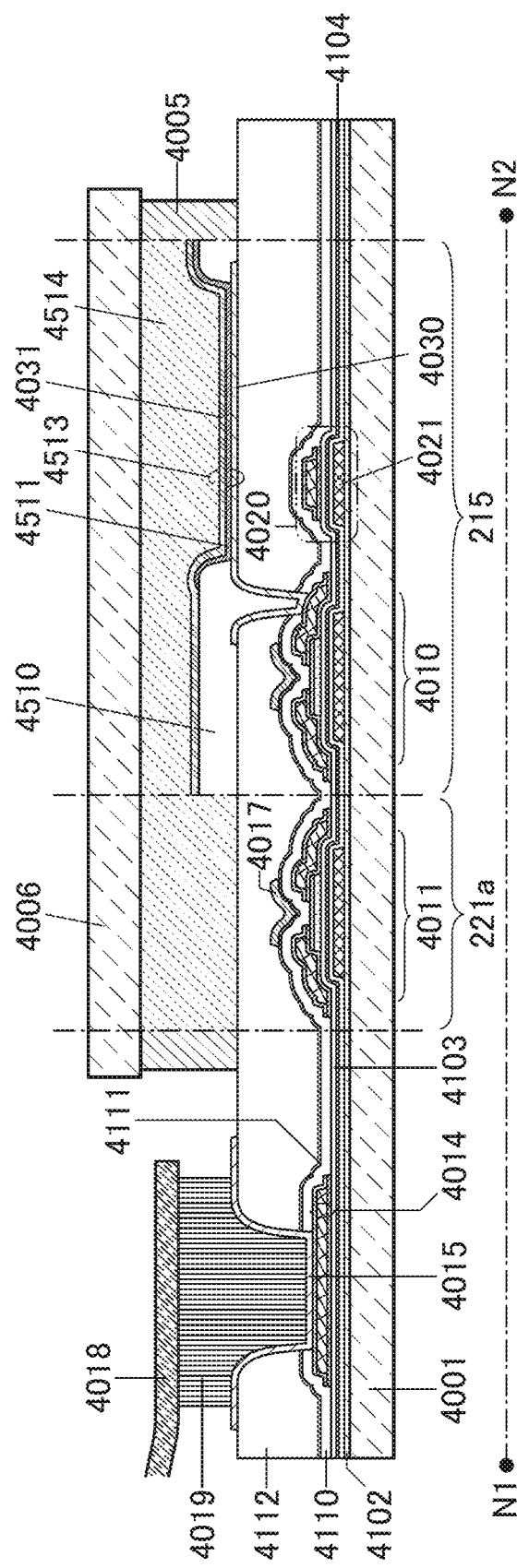
FIG. 11 illustrates a display device.

FIG. 11 is a cross-sectional view taken along the chain line N1-N2 in FIG. 9B. A display device shown in FIG. 11 includes an electrode 4015, and the electrode 4015 is electrically connected to a terminal included in the FPC 4018 through an anisotropic conductive layer 4019. In FIG. 11, the electrode 4015 is electrically connected to a wiring 4014 in an opening formed in insulating layers 4112, 4111, and 4110.

The electrode 4015 is formed of the same conductive layer as a first electrode layer 4030, and the wiring 4014 is formed of the same conductive layer as source and drain electrodes of transistors 4010 and 4011.

The display portion 215 and the scan line driver circuit 221a provided over the first substrate 4001 each include a plurality of transistors. In FIG. 11, the transistor 4010 included in the display portion 215 and the transistor 4011 included in the scan line driver circuit 221a are shown as an example. In the example shown in FIG. 11, the transistors 4010 and 4011 are bottom-gate transistors but may be top-gate transistors.

In FIG. 11, the insulating layer 4112 is provided over the transistors 4010 and 4011. A bank 4510 is provided over the insulating layer 4112.

The transistors 4010 and 4011 are provided over an insulating layer 4102. The transistors 4010 and 4011 each include an electrode 4017 formed over the insulating layer 4111. The electrode 4017 can serve as a back gate electrode.

The display device shown in FIG. 11 includes a capacitor 4020. The capacitor 4020 includes an electrode 4021 formed in the same step as a gate electrode of the transistor 4010, and an electrode formed in the same step as a source electrode and a drain electrode of the transistor 4010. The electrodes overlap with each other with the insulating layer 4103 therebetween.

In general, the capacitance of a capacitor provided in a pixel portion of a display device is set in consideration of the leakage current or the like of transistors provided in the pixel portion so that charges can be held for a predetermined period. The capacitance of the capacitor may be set considering the off-state current of the transistor or the like.

The transistor 4010 included in the display portion 215 is electrically connected to the display element.

The display device shown in FIG. 11 includes the insulating layer 4111 and an insulating layer 4104. As the insulating layers 4104 and 4111, insulating layers through which an impurity element does not easily pass are used. A semiconductor layer of the transistor is sandwiched between the insulating layers 4104 and 4111, whereby entry of impurities from the outside can be prevented.

As the display element included in the display device, a light-emitting element utilizing electroluminescence (EL element) can be used. An EL element includes a layer containing a light-emitting compound (also referred to as an "EL layer") between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer and a light-emitting substance contained in the EL layer emits light.

EL elements are classified depending on whether a light-emitting material is an organic compound or an inorganic compound. In general, the former is referred to as an organic EL element, and the latter is referred to as an inorganic EL element.

In an organic EL element, by voltage application, electrons are injected from one electrode to the EL layer and holes are injected from the other electrode to the EL layer. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

In addition to the light-emitting compound, the EL layer may further include any of a substance with an excellent hole-injection property, a substance with an excellent hole-transport property, a hole-blocking material, a substance with an excellent electron-transport property, a substance with an excellent electron-injection property, a substance with a bipolar property (a substance with an excellent electron- and hole-transport property), and the like.

The EL layer can be formed by an evaporation method (including a vacuum evaporation method), a transfer method, a printing method, an inkjet method, a coating method, or the like.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localization type light emission that utilizes inner-shell electron transition of metal ions. Here, the case will be described in which an organic EL element is used as a light-emitting element.

In order to extract light emitted from the light-emitting element, at least one of a pair of electrodes needs to be transparent. The transistor and the light-emitting element are formed over a substrate. The light-emitting element can have a top emission structure in which light emission is extracted from the side opposite to the substrate; a bottom emission structure in which light emission is extracted from the substrate side; or a dual emission structure in which light emission is extracted from both the side opposite to the substrate and the substrate side.

FIG. 11 shows an example of a light-emitting display device using a light-emitting element as a display element (also referred to as an "EL display device"). A light-emitting element 4513 which is a display element is electrically connected to the transistor 4010 provided in the display portion 215. The structure of the light-emitting element 4513 is the layered structure of the first electrode layer 4030, a light-emitting layer 4511, and a second electrode layer 4031; however, this embodiment is not limited to this structure. The structure of the light-emitting element 4513 can be changed as appropriate depending on the direction in which light is extracted from the light-emitting element 4513, or the like.

The bank 4510 is formed using an organic insulating material or an inorganic insulating material. It is particularly preferable that the bank 4510 be formed using a photosensitive resin material to have an opening over the first electrode layer 4030 so that a side surface of the opening slopes with continuous curvature.

The light-emitting layer 4511 may be formed using a single layer or a plurality of layers stacked.

The emission color of the light-emitting element 4513 can be white, red, green, blue, cyan, magenta, yellow, or the like depending on the material for the light-emitting layer 4511.

As a color display method, there are a method in which the light-emitting element 4513 whose emission color is white is combined with a coloring layer and a method in which the light-emitting element 4513 with a different emission color is provided in each pixel. The former method is more productive than the latter method. The latter method, which requires separate formation of the light-emitting layer 4511 pixel by pixel, is less productive than the former method; however, the latter method can produce the emission color with higher color purity than that of the emission color produced by the former method. When the light-emitting element 4513 has a microcavity structure in the latter method, the color purity can be further increased.

The light-emitting layer 4511 may contain an inorganic compound such as quantum dots. For example, when used for the light-emitting layer, the quantum dots can serve as a light-emitting material.

A protective layer may be formed over the second electrode layer 4031 and the bank 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In a space which is formed with the first substrate 4001, the second substrate 4006, and the sealant 4005, a filler 4514 is provided for sealing. It is preferable that the light-emitting element be packaged (sealed) with a protective film (such as a laminate film or an ultraviolet curable resin film) or a cover member with high air-tightness and little degasification so that the light-emitting element is not exposed to the outside air, in this manner.

As the filler 4514, an ultraviolet curable resin or a thermosetting resin can be used as well as an inert gas such as nitrogen or argon; for example, polyvinyl chloride (PVC), an acrylic resin, polyimide, an epoxy resin, a silicone resin, polyvinyl butyral (PVB), ethylene vinyl acetate (EVA), or the like can be used. A drying agent may be contained in the filler 4514.

A glass material such as a glass frit or a resin material such as a resin that is curable at room temperature (e.g., a two-component-mixture-type resin), a light curable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Furthermore, the polarizing plate or the circularly polarizing plate may be provided with an anti-reflection film. For example, anti-glare treatment by which reflected light can be diffused by projections and depressions on a surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer (each of which is also referred to as a pixel electrode layer, a common electrode layer, a counter electrode layer, or the like) for applying voltage to the display element each have a light-transmitting property or a light-reflecting property, which depends on the direction in which light is extracted, the position where the electrode layer is provided, and the pattern structure of the electrode layer.

Each of the first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

Each of the first electrode layer 4030 and the second electrode layer 4031 can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (T1), platinum (Pt), aluminum (Al), copper (Cu), or silver (Ag);

an alloy thereof; and a metal nitride thereof.

A conductive composition containing a conductive high molecule (also referred to as conductive polymer) can be used for the first electrode layer 4030 and the second electrode layer 4031. As the conductive high molecule, a π-electron conjugated conductive high molecule can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken by static electricity or the like, a protective circuit for protecting the driver circuit is preferably provided. The protective circuit is preferably formed using a nonlinear element.

This embodiment can be implemented in combination with any of the structures described in the other embodiments and the like, as appropriate.

Embodiment 3

In this embodiment, examples of transistors which can be used as the transistors described in the above embodiments will be described with reference to the drawings.

The display device of one embodiment of the present invention can be fabricated using a transistor with any of various structures, such as a bottom-gate transistor or a top-gate transistor. Therefore, a material for a semiconductor layer or the structure of a transistor can be easily changed depending on the existing production line.

[Bottom-Gate Transistor]

FIG. 12A1 is a cross-sectional view of a channel-protective transistor 810 that is a type of bottom-gate transistor. In FIG. 12A1, the transistor 810 is formed over a substrate 771. The transistor 810 includes an electrode 746 over the substrate 771 with an insulating layer 772 therebetween. The transistor 810 includes a semiconductor layer 742 over the electrode 746 with an insulating layer 726 therebetween. The electrode 746 can function as a gate electrode. The insulating layer 726 can function as a gate insulating layer.

The transistor 810 includes an insulating layer 741 over a channel formation region in the semiconductor layer 742. The transistor 810 includes an electrode 744a and an electrode 744b which are partly in contact with the semiconductor layer 742 and over the insulating layer 726. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrodes 744a and 744b. Thus, the channel formation region in the semiconductor layer 742 can be prevented from being etched at the time of forming the electrodes 744a and 744b. According to one embodiment of the present invention, a transistor with favorable electrical characteristics can be provided.

The transistor 810 includes an insulating layer 728 over the electrode 744a, the electrode 744b, and the insulating layer 741 and further includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used for regions of the electrodes 744a and 744b that are in contact with at least the semiconductor layer 742. The carrier concentration in the regions of the semiconductor layer 742 where oxygen vacancies are generated is increased, so that the regions become n-type regions (n$^+$ layers). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrodes 744a and 744b. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region in the transistor.

The insulating layer 729 is preferably formed using a material that can prevent or reduce diffusion of impurities into the transistor from the outside. Note that the insulating layer 729 is not necessarily provided.

A transistor 811 illustrated in FIG. 12A2 is different from the transistor 810 in that an electrode 723 that can function as a back gate electrode is provided over the insulating layer 729. The electrode 723 can be formed using a material and a method similar to those of the electrode 746.

In general, a back gate electrode is formed using a conductive layer and positioned so that a channel formation region of a semiconductor layer is positioned between a gate electrode and the back gate electrode. Thus, the back gate electrode can function in a manner similar to that of the gate electrode. The potential of the back gate electrode may be the same as that of the gate electrode or may be a ground (GND) potential or a given potential. By changing the potential of the back gate electrode independently of the potential of the gate electrode, the threshold voltage of the transistor can be changed.

The electrode 746 and the electrode 723 can each function as a gate electrode. Thus, the insulating layers 726, 728, and 729 can each function as a gate insulating layer. The electrode 723 may be provided between the insulating layers 728 and 729.

In the case where one of the electrode 746 and the electrode 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. One of the electrode 746 and the electrode 723 may be referred to as a "first gate electrode", and the other may be referred to as a "second gate electrode".

By providing the electrode 746 and the electrode 723 with the semiconductor layer 742 provided therebetween and setting the potentials of the electrode 746 and the electrode 723 to the same potential, a region of the semiconductor layer 742 through which carriers flow is enlarged in the film thickness direction; thus, the number of transferred carriers is increased. As a result, the on-state current and field-effect mobility of the transistor 811 are increased.

Therefore, the transistor 811 has a high on-state current for its area. That is, the area of the transistor 811 can be small for a required on-state current. According to one embodiment of the present invention, the area of a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

According to one embodiment of the present invention, a transistor with high reliability can be provided. Moreover, a semiconductor device with high reliability can be provided.

FIG. 12B1 is a cross-sectional view of a channel-protective transistor 820 that is a type of bottom-gate transistor. The transistor 820 has substantially the same structure as the transistor 810 but is different from the transistor 810 in that the insulating layer 741 covers end portions of the semiconductor layer 742. The semiconductor layer 742 is electrically connected to the electrode 744a through an opening formed by selectively removing part of the insulating layer 741 which overlaps with the semiconductor layer 742. The semiconductor layer 742 is electrically connected to the electrode 744b through another opening formed by selectively removing part of the insulating layer 741 which overlaps with the semiconductor layer 742. A region of the insulating layer 741 which overlaps with the channel formation region can function as a channel protective layer.

A transistor 821 illustrated in FIG. 12B2 is different from the transistor 820 in that the electrode 723 which can function as a back gate electrode is provided over the insulating layer 729.

With the insulating layer 741, the semiconductor layer 742 can be prevented from being exposed at the time of forming the electrodes 744a and 744b. Thus, the semiconductor layer 742 can be prevented from being reduced in thickness at the time of forming the electrodes 744a and 744b.

The length between the electrode 744a and the electrode 746 and the length between the electrode 744b and the electrode 746 in the transistors 820 and 821 are larger than those in the transistors 810 and 811. Thus, the parasitic capacitances generated between the electrode 744a and the electrode 746 and between the electrode 744b and the electrode 746 can be smaller in the transistors 820 and 821 than in the transistors 810 and 811. According to one embodiment of the present invention, a transistor with favorable electrical characteristics can be provided.

A transistor 825 illustrated in FIG. 12C1 is a channel-etched transistor that is a type of bottom-gate transistor. In the transistor 825, the electrodes 744a and 744b are formed without providing the insulating layer 741. Thus, part of the semiconductor layer 742 that is exposed at the time of forming the electrodes 744a and 744b is etched in some cases. However, since the insulating layer 741 is not provided, the productivity of the transistor can be increased.

A transistor 826 illustrated in FIG. 12C2 is different from the transistor 825 in that the electrode 723 which can function as a back gate electrode is provided over the insulating layer 729.

[Top-Gate Transistor]

A transistor 842 illustrated in FIG. 13A1 is a type of top-gate transistor. The electrodes 744a and 744b are electrically connected to the semiconductor layer 742 through openings formed in the insulating layers 728 and 729.

As illustrated in FIG. 13A3, part of the insulating layer 726 that does not overlap with the electrode 746 is removed, and an impurity 755 is introduced into the semiconductor layer 742 using the electrode 746 and the insulating layer 726 that is left as masks, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity 755 is introduced through the insulating layer 726 has a lower impurity concentration than the semiconductor layer 742 in a region into which the impurity 755 is introduced not through the insulating layer 726. Thus, a lightly doped drain (LDD) region is formed in a region of the semiconductor layer 742 which does not overlap with the electrode 746.

A transistor 843 illustrated in FIG. 13A2 is different from the transistor 842 in that the electrode 723 is included. The transistor 843 includes the electrode 723 that is formed over the substrate 771, and the electrode 723 partly overlaps with the semiconductor layer 742 with the insulating layer 772 therebetween. The electrode 723 can function as a back gate electrode.

As in a transistor 844 illustrated in FIG. 13B1 and a transistor 845 illustrated in FIG. 13B2, the insulating layer 726 in a region that does not overlap with the electrode 746 may be completely removed. Alternatively, as in a transistor 846 illustrated in FIG. 13C1 and a transistor 847 illustrated in FIG. 13C2, the insulating layer 726 may be left.

In the transistors 842 to 847, after the formation of the electrode 746, the impurity 755 is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be provided. Furthermore, according to one embodiment of the present invention, a semiconductor device having a high degree of integration can be provided.

This embodiment can be implemented in combination with any of the structures described in the other embodiments and the like, as appropriate.

Embodiment 4

In this embodiment, a semiconductor device that can be used for the row driver 12, the column drivers 13 and 15, the circuits 14 and 16, and the like described as examples in the above embodiment will be described. The semiconductor device described below as an example can function as a memory device.

In this embodiment, a DOSRAM (registered trademark) will be described as an example of a memory device using an oxide semiconductor. The name "DOSRAM" stands for a dynamic oxide semiconductor random access memory. A DOSRAM refers to a memory device including a 1T1C (one transistor and one capacitor) memory cell where a writing transistor is formed using an oxide semiconductor.

A layered structure example of a DOSRAM 1000 will be described with reference to FIG. 14. In the DOSRAM 1000, a sense amplifier portion 1002 that performs data reading and a cell array portion 1003 that stores data are stacked.

Figure 14:
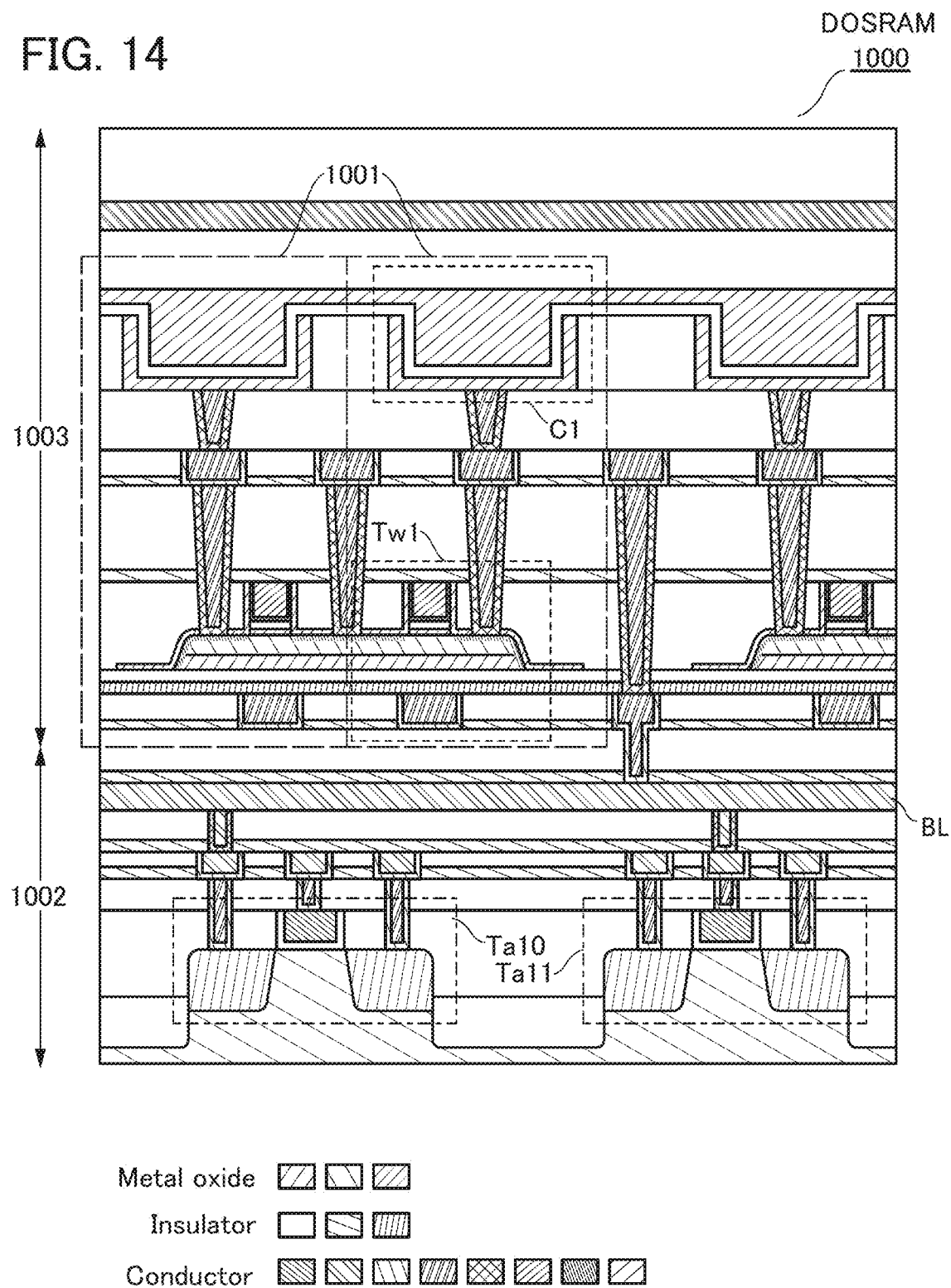
FIG. 14 is a cross-sectional view illustrating a structure example of a DOSRAM.

As illustrated in FIG. 14, the sense amplifier portion 1002 includes a bit line BL and Si transistors Ta10 and Ta11. The Si transistors Ta10 and Ta11 include a semiconductor layer in a single crystal silicon wafer. The Si transistors Ta10 and Ta11 are included in the sense amplifier and electrically connected to the bit line BL.

The cell array 1003 includes a plurality of memory cells 1001. The memory cell 1001 includes a transistor Tw1 and a capacitor C1. In the cell array portion 1003, two transistors Tw1 share a semiconductor layer. The semiconductor layer and the bit line BL are electrically connected to each other through a conductor that is not illustrated.

The layered structure illustrated in FIG. 14 can be used for a variety of semiconductor devices formed by stacking a plurality of circuits each including a transistor group.

Metal oxides, insulators, conductors, and the like in FIG. 14 have either a single-layer structure or a layered structure. They can be formed by any of a variety of deposition methods such as a sputtering method, a molecular beam epitaxy (MBE) method, a pulsed laser ablation (PLA) method, a CVD method, and an atomic layer deposition (ALD) method. Examples of the CVD method include a plasma CVD method, a thermal CVD method, and a metal organic CVD method.

Here, the semiconductor layer of the transistor Tw1 is formed using a metal oxide (oxide semiconductor). An example is illustrated in which the semiconductor layer is formed of three metal oxide layers. The semiconductor layer is preferably formed using a metal oxide containing In, Ga, and Zn.

When an element that forms oxygen vacancies or an element that is bonded to oxygen vacancies is added to the metal oxide, the metal oxide may have increased carrier density and thus have reduced resistance. For example, the resistance of the semiconductor layer formed using the metal oxide is selectively reduced, whereby a source region or a drain region can be provided in the semiconductor layer.

As the element that reduces the resistance of the metal oxide, boron or phosphorus is typically used. Hydrogen, carbon, nitrogen, fluorine, sulfur, chlorine, titanium, a rare gas element, or the like can also be used. Typical examples of the rare gas element include helium, neon, argon, krypton, and xenon. The concentration of the element can be measured by secondary ion mass spectrometry (SIMS) or the like.

In particular, boron and phosphorus are preferably used because an apparatus used in a manufacturing line for amorphous silicon or low-temperature polysilicon can be used. Since the existing facility can be used, capital investment can be reduced.

The transistor including the semiconductor layer having selectively reduced resistance can be formed using a dummy gate, for example. Specifically, the dummy gate is provided over the semiconductor layer, and an element that reduces the resistance of the semiconductor layer is preferably added to the semiconductor layer using the dummy gate as a mask. That is, the element is added to a region of the semiconductor layer that does not overlap with the dummy gate, so that a low-resistance region is formed. For the addition of the element, an ion implantation method by which an ionized source gas is subjected to mass separation and then added, an ion doping method by which an ionized source gas is added without mass separation, a plasma immersion ion implantation method, or the like can be used.

Examples of a conductive material used for the conductors include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing any of the above metals as its component (tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used.

Examples of an insulating material used for the insulators include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. Note that in this specification and the like, an oxynitride refers to a compound that contains more oxygen than nitrogen, and a nitride oxide refers to a compound that contains more nitrogen than oxygen.

This embodiment can be implemented in combination with any of the structures described in the other embodiments and the like, as appropriate.

Embodiment 5

In this embodiment, a configuration example of a semiconductor device serving as a neural network that can be used for, for example, the circuit 14 described in Embodiment 1 will be described.

Figure 15A:
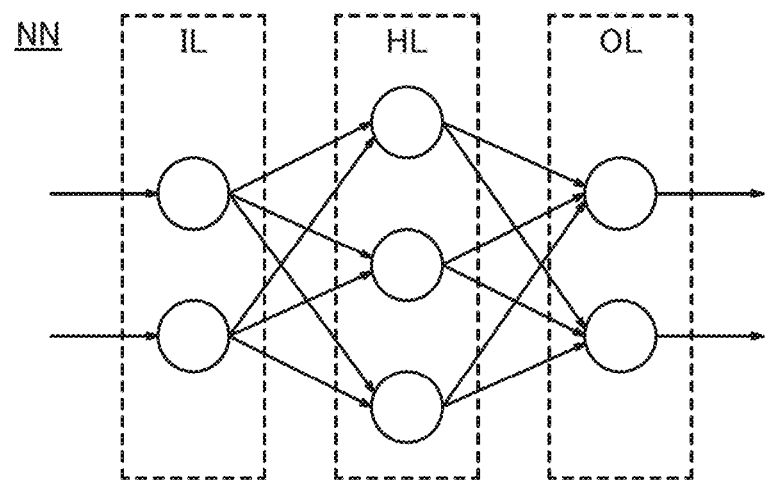
FIGS. 15A and 15B illustrate a configuration example of a neural network.

As illustrated in FIG. 15A, a neural network NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as a deep neural network (DNN), and learning using a deep neural network can also be referred to as deep learning.

Input data are input to neurons of the input layer IL, output signals of neurons in the previous layer or the subsequent layer are input to neurons of the middle layer HL, and output signals of neurons in the previous layer are input to neurons of the output layer OL. Note that each neuron may be connected to all the neurons in the previous and subsequent layers (full connection), or may be connected to some of the neurons.

Figure 15B:
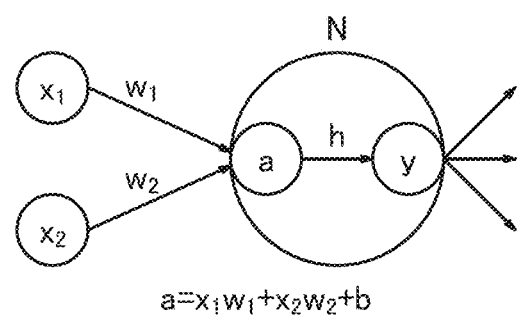

FIG. 15B illustrates an example of an operation with the neurons. Here, a neuron N and two neurons in the previous layer which output signals to the neuron N are illustrated. An output $x_1$ of a neuron in the previous layer and an output $x_2$ of a neuron in the previous layer are input to the neuron N. Then, in the neuron N, a total sum $x_1w_1+x_2w_2$ of a multiplication result ($x_1w_1$) of the output $x_1$ and a weight $w_1$ and a multiplication result ($x_2w_2$) of the output $x_2$ and a weight $w_2$ is calculated, and then a bias b is added as necessary, so that the value $a=x_1w_1+x_2w_2+b$ is obtained. Then, the value a is converted with an activation function h, and an output signal $y=h(a)$ is output from the neuron N.

In this manner, the operation with the neurons includes the operation that sums the products of the outputs and the weights of the neurons in the previous layer, that is, the product-sum operation ($x_1w_1+x_2w_2$ described above). This product-sum operation may be performed using a program on software or using hardware. In the case where the product-sum operation is performed by hardware, a product-sum arithmetic circuit can be used. Either a digital circuit or an analog circuit can be used as this product-sum arithmetic circuit.

An analog circuit is used as the product-sum arithmetic circuit of one embodiment of the present invention. Thus, the circuit scale of the product-sum arithmetic circuit can be reduced, or higher processing speed and lower power consumption can be achieved by reduced frequency of access to a memory.

The product-sum arithmetic circuit may be formed using a Si transistor or an OS transistor. An OS transistor is particularly preferably used as a transistor included in an analog memory of the product-sum arithmetic circuit because of its extremely low off-state current. Note that the product-sum arithmetic circuit may include both a Si transistor and an OS transistor. A configuration example of a semiconductor device serving as the product-sum arithmetic circuit will be described below.

<Configuration Example of Semiconductor Device>

Figure 16:
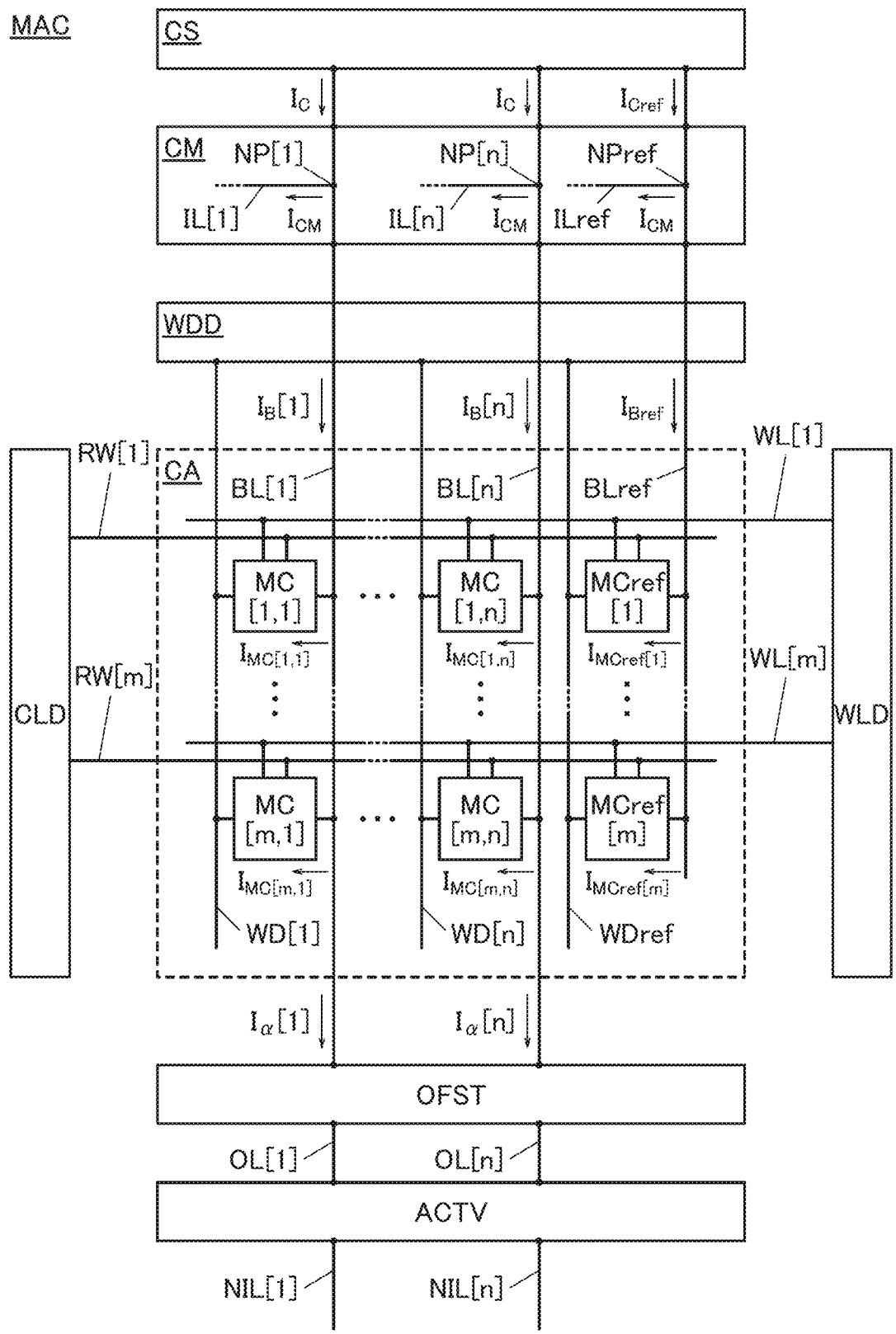
FIG. 16 illustrates a configuration example of a semiconductor device.

FIG. 16 illustrates a configuration example of a semiconductor device MAC configured to perform an operation of a neural network. The semiconductor device MAC is configured to perform a product-sum operation of first data corresponding to the connection strength (weight) between the neurons and second data corresponding to input data. Note that the first data and the second data can each be analog data or multilevel data (discrete data). The semiconductor device MAC is also configured to convert data obtained by the product-sum operation with the activation function.

The semiconductor device MAC includes a cell array CA, a current source circuit CS, a current mirror circuit CM, a circuit WDD, a circuit WLD, a circuit CLD, an offset circuit OFST, and an activation function circuit ACTV.

The cell array CA includes a plurality of memory cells MC and a plurality of memory cells MCref. In the configuration example illustrated in FIG. 16, the cell array CA includes the memory cells MC in m rows and n columns (memory cells MC[1, 1] to MC[m, n]) and the m memory cells MCref (memory cells MCref[1] to MCref[m]) (m and n are integers greater than or equal to 1). The memory cells MC are configured to store the first data. In addition, the memory cells MCref are configured to store reference data used for the product-sum operation. Note that the reference data can be analog data or multilevel data.

The memory cell MC[i, j] is connected to a wiring WL[i], a wiring RW[i], a wiring WD[j], and a wiring BL[j] (i is an integer greater than or equal to 1 and less than or equal to m, and j is an integer greater than or equal to 1 and less than or equal to n). In addition, the memory cell MCref[i] is connected to the wiring WL[i], the wiring RW[i], a wiring WDref, and a wiring BLref. Here, a current flowing between the memory cell MC[i, j] and the wiring BL[j] is denoted by $I_{MC[i,j]}$, and a current flowing between the memory cell MCref[i] and the wiring BLref is denoted by $I_{MCref[i]}$.

Figure 17:
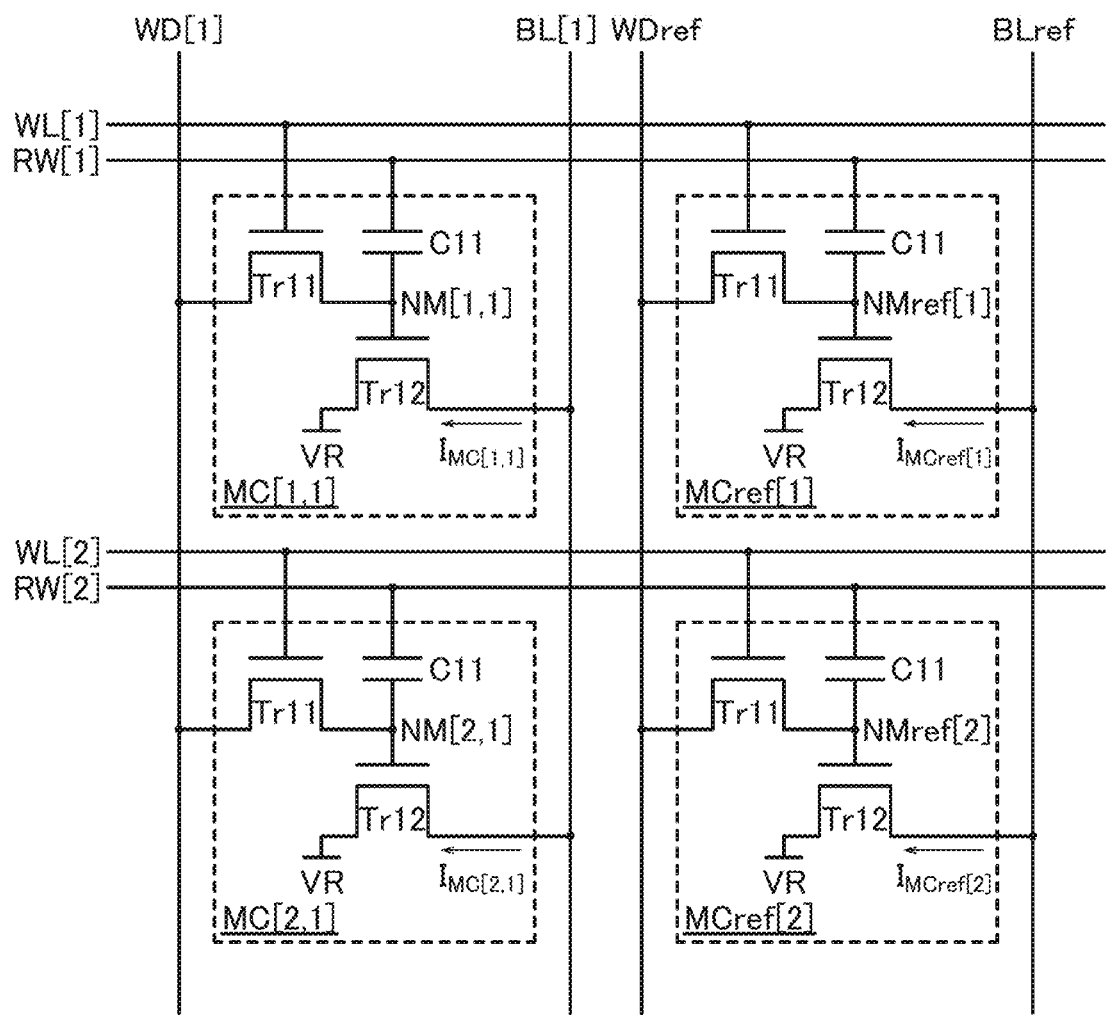
FIG. 17 illustrates a configuration example of a memory cell.

FIG. 17 illustrates a specific configuration example of the memory cells MC and the memory cells MCref. Although the memory cells MC[1, 1] and MC[2, 1] and the memory cells MCref[1] and MCref[2] are given as typical examples in FIG. 17, similar configurations can also be used for other memory cells MC and other memory cells MCref. The memory cells MC and the memory cells MCref each include a transistor Tr11, a transistor Tr12, and a capacitor C11. Here, the case where the transistors Tr11 and Tr12 are n-channel transistors will be described.

In the memory cell MC, a gate of the transistor Tr11 is connected to the wiring WL, one of a source and a drain of the transistor Tr11 is connected to a gate of the transistor Tr12 and a first electrode of the capacitor C11, and the other of the source and the drain of the transistor Tr11 is connected to the wiring WD. One of a source and a drain of the transistor Tr12 is connected to the wiring BL, and the other of the source and the drain of the transistor Tr12 is connected to a wiring VR. A second electrode of the capacitor C11 is connected to the wiring RW. The wiring VR is configured to supply a predetermined potential. In this example, a low power supply potential (e.g., a ground potential) is supplied from the wiring VR.

A node connected to the one of the source and the drain of the transistor Tr11, the gate of the transistor Tr12, and the first electrode of the capacitor C11 is referred to as a node NM. The nodes NM included in the memory cells MC[1, 1] and MC[2, 1] are referred to as nodes NM[1, 1] and NM[2, 1], respectively.

The memory cells MCref have a configuration similar to that of the memory cell MC. However, the memory cells MCref are connected to the wiring WDref instead of the wiring WD and connected to a wiring BLref instead of the wiring BL. Each of a node NMref[1] in the memory cell MCref[1] and a node NMref[2] in the memory cell MCref[2] refers to a node connected to the one of the source and the drain of the transistor Tr11, the gate of the transistor Tr12, and the first electrode of the capacitor C11.

The nodes NM and NMref function as holding nodes of the memory cells MC and MCref, respectively. The first data is held in the node NM and the reference data is held in the node NMref Currents $I_{MC[1, 1]}$ and $I_{MC[2, 1]}$ from the wiring BL[1] flow to the transistors Tr12 of the memory cells MC[1, 1] and MC[2, 1], respectively. Currents $I_{MCref[1]}$ and $I_{MCref[2]}$ from the wiring BLref flow to the transistors Tr12 of the memory cells MCref[1] and MCref[2], respectively.

Since the transistor Tr11 is configured to hold the potential of the node NM or the node NMref, the off-state current of the transistor Tr11 is preferably low. Thus, it is preferable to use an OS transistor, which has extremely low off-state current, as the transistor Tr11. This suppresses a change in the potential of the node NM or the node NMref, so that the operation accuracy can be increased. Furthermore, operations of refreshing the potential of the node NM or the node NMref can be performed less frequently, which leads to a reduction in power consumption.

There is no particular limitation on the transistor Tr12, and for example, a Si transistor, an OS transistor, or the like can be used. In the case where an OS transistor is used as the transistor Tr12, the transistor Tr12 can be manufactured with the same manufacturing apparatus as the transistor Tr11, and accordingly manufacturing cost can be reduced. Note that the transistor Tr12 may be an n-channel transistor or a p-channel transistor.

The current source circuit CS is connected to the wirings BL[1] to BL[n] and the wiring BLref. The current source circuit CS is configured to supply currents to the wirings BL[1] to BL[n] and the wiring BLref. Note that the value of the current supplied to the wirings BL[1] to BL[n] may be different from that of the current supplied to the wiring BLref. Here, the current supplied from the current source circuit CS to the wirings BL[1] to BL[n] is denoted by $I_C$, and the current supplied from the current source circuit CS to the wiring BLref is denoted by $I_{Cref}$.

The current mirror circuit CM includes wirings IL[1] to IL[n] and a wiring ILref. The wirings IL[1] to IL[n] are connected to the wirings BL[1] to BL[n], respectively, and the wiring ILref is connected to the wiring BLref. Here, a connection portion between the wirings IL[1] and BL[1] to a connection portion between the wirings IL[n] and BL[n] are referred to as nodes NP[1] to NP[n], respectively. Furthermore, a connection portion between the wiring ILref and the wiring BLref is referred to as a node NPref.

The current mirror circuit CM is configured to supply a current $I_{CM}$ corresponding to the potential of the node NPref to the wiring ILref and supply this current $I_{CM}$ also to the wirings IL[1] to IL[n]. In the example illustrated in FIG. 16, the current $I_{CM}$ is discharged from the wiring BLref to the wiring ILref, and the current $I_{CM}$ is discharged from the wirings BL[1] to BL[n] to the wirings IL[1] to IL[n]. Furthermore, currents flowing from the current mirror circuit CM to the cell array CA through the wirings BL[1] to BL[n] are denoted by $I_B[1]$ to $I_B[n]$, respectively. Furthermore, a current flowing from the current mirror circuit CM to the cell array CA through the wiring BLref is denoted by $I_{Bref}$.

The circuit WDD is connected to the wirings WD[1] to WD[n] and the wiring WDref. The circuit WDD is configured to supply a potential corresponding to the first data stored in the memory cells MC to the wirings WD[1] to WD[n]. The circuit WDD is also configured to supply a potential corresponding to the reference data stored in the memory cell MCref to the wiring WDref. The circuit WLD is connected to wirings WL[1] to WL[m]. The circuit WLD is configured to supply a signal for selecting the memory cell MC or MCref to which data is to be written, to any of the wirings WL[1] to WL[m]. The circuit CLD is connected to the wirings RW[1] to RW[m]. The circuit CLD is configured to supply a potential corresponding to the second data to the wirings RW[1] to RW[m].

The offset circuit OFST is connected to the wirings BL[1] to BL[n] and wirings OL[1] to OL[n]. The offset circuit OFST is configured to determine the amount of currents flowing from the wirings BL[1] to BL[n] to the offset circuit OFST and/or the amount of change in the currents flowing from the wirings BL[1] to BL[n] to the offset circuit OFST. The offset circuit OFST is also configured to output determination results to the wirings OL[1] to OL[n]. Note that the offset circuit OFST may output currents corresponding to the determination results to the wirings OL, or may convert the currents corresponding to the determination results into voltages to output the voltages to the wirings OL. The currents flowing between the cell array CA and the offset circuit OFST are denoted by $I_\alpha[1]$ to $I_\alpha[n]$.

Figure 18:
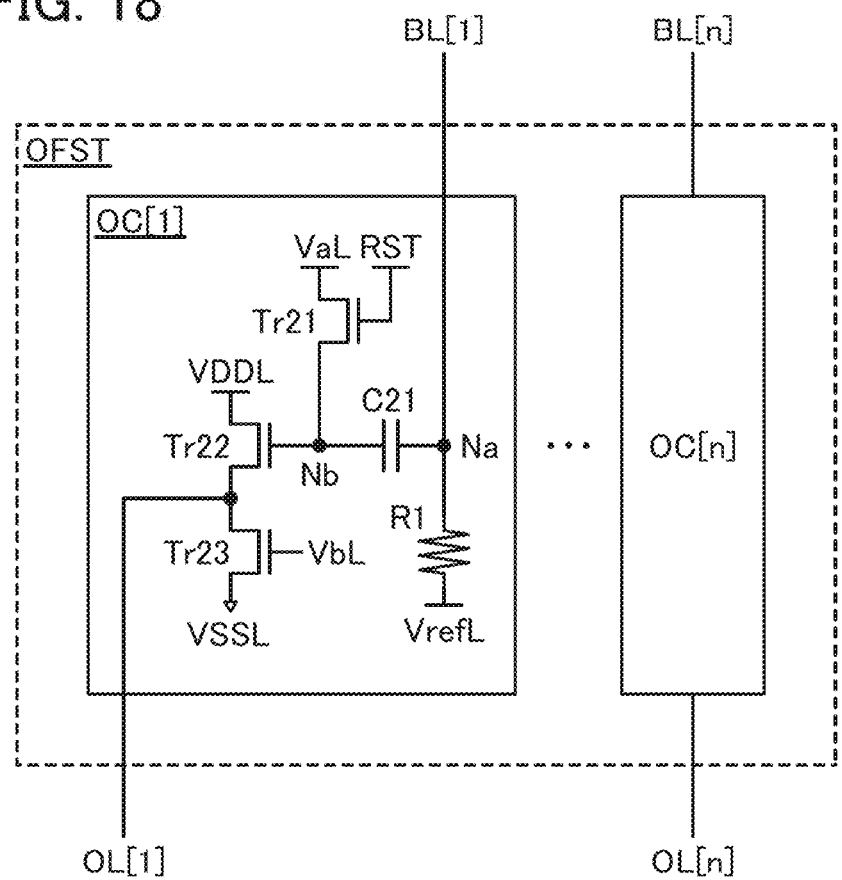
FIG. 18 illustrates a configuration example of an offset circuit.

FIG. 18 illustrates a configuration example of the offset circuit OFST. The offset circuit OFST illustrated in FIG. 18 includes circuits OC[1] to OC[n]. The circuits OC[1] to OC[n] each include a transistor Tr21, a transistor Tr22, a transistor Tr23, a capacitor C21, and a resistor R1. Connection relations of the elements are illustrated in FIG. 18. Note that a node connected to a first electrode of the capacitor C21 and a first terminal of the resistor R1 is referred to as a node Na. In addition, a node connected to a second electrode of the capacitor C21, one of a source and a drain of the transistor Tr21, and a gate of the transistor Tr22 is referred to as a node Nb.

A wiring VrefL is configured to supply a potential Vref, a wiring VaL is configured to supply a potential Va, and a wiring VbL is configured to supply a potential Vb. Furthermore, a wiring VDDL is configured to supply a potential VDD, and a wiring VSSL is configured to supply a potential VSS. Here, the case where the potential VDD is a high power supply potential and the potential VSS is a low power supply potential is described. A wiring RST is configured to supply a potential for controlling the conduction state of the transistor Tr21. The transistor Tr22, the transistor Tr23, the wiring VDDL, the wiring VSSL, and the wiring VbL form a source follower circuit.

Next, an operation example of the circuits OC[1] to OC[n] will be described. Note that although an operation example of the circuit OC[1] is described here as a typical example, the circuits OC[2] to OC[n] can be operated in a manner similar to that of the circuit OC[1]. First, when a first current flows to the wiring BL[1], the potential of the node Na becomes a potential corresponding to the first current and the resistance value of the resistor R1. At this time, the transistor Tr21 is on, and thus the potential Va is supplied to the node Nb. Then, the transistor Tr21 is turned off.

Next, when a second current flows to the wiring BL[1], the potential of the node Na becomes a potential corresponding to the second current and the resistance value of the resistor R1. At this time, since the transistor Tr21 is off and the node Nb is in a floating state, the potential of the node Nb is changed owing to capacitive coupling, following the change in the potential of the node Na. Here, when the amount of change in the potential of the node Na is $\Delta V_{Na}$ and the capacitive coupling coefficient is 1, the potential of the node Nb is $Va+\Delta V_{Na}$. In addition, when the threshold voltage of the transistor Tr22 is $V_{th}$, a potential of $Va+\Delta V_{Na}-V_{th}$ is output from the wiring OL[1]. Here, when $Va=V_{th}$ the potential $\Delta V_{Na}$ can be output from the wiring OL[1].

The potential $\Delta V_{Na}$ is determined by the amount of change from the first current to the second current, the resistance value of the resistor R1, and the potential Vref. Here, since the resistance value of the resistor R1 and the potential Vref are known, the amount of change in the current flowing to the wiring BL can be found from the potential $\Delta V_{Na}$.

A signal corresponding to the amount of current and/or the amount of change in the current that are/is determined by the offset circuit OFST as described above is input to the activation function circuit ACTV through the wirings OL[1] to OL[n].

The activation function circuit ACTV is connected to the wirings OL[1] to OL[n] and wirings NIL[1] to NIL[n]. The activation function circuit ACTV is configured to perform an operation for converting the signal input from the offset circuit OFST in accordance with the predefined activation function. As the activation function, for example, a sigmoid function, a tanh function, a softmax function, a ReLU function, a threshold function, or the like can be used. The signal converted by the activation function circuit ACTV is output as output data to the wirings NIL[1] to NIL[n].

<Operation Example of Semiconductor Device>

With the above semiconductor device MAC, the product-sum operation of the first data and the second data can be performed. An operation example of the semiconductor device MAC at the time of performing the product-sum operation will be described below.

Figure 19:
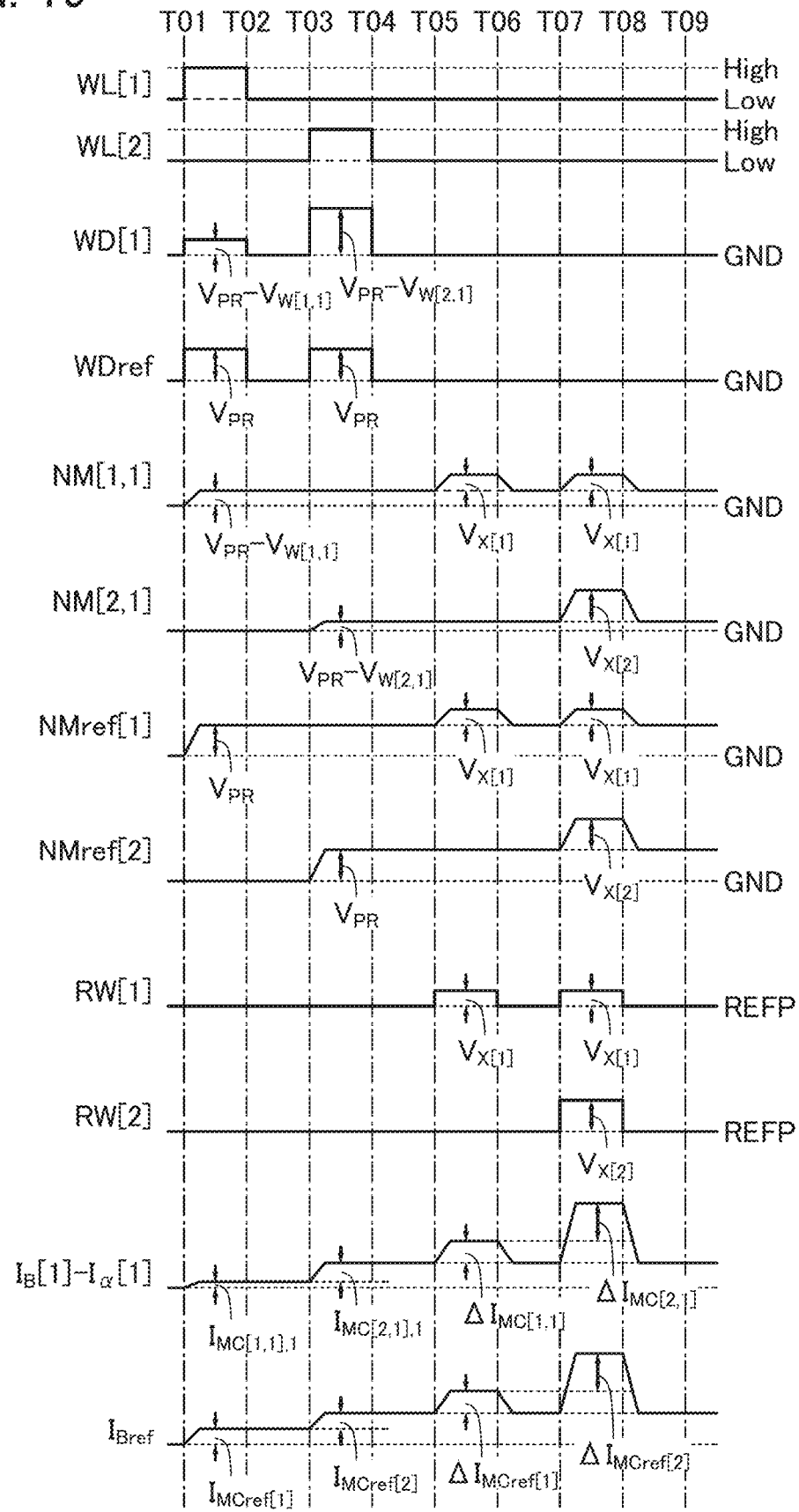
FIG. 19 is a timing chart showing the operation of a semiconductor device.

FIG. 19 is a timing chart showing the operation example of the semiconductor device MAC. FIG. 19 shows changes in the potentials of the wirings WL[1], WL[2], WD[1], and WDref, the nodes NM[1, 1], NM[2, 1], NMref[1], and NMref[2], and the wirings RW[1] and RW[2] in FIG. 17 and changes in the values of the currents $I_B[1]$–$I_\alpha[1]$ and $I_{Bref}$. The current $I_B[1]$–$I_\alpha[1]$ corresponds to the sum total of the currents flowing from the wiring BL[1] to the memory cells MC[1, 1] and MC[2, 1].

Although an operation example of the memory cells MC[1, 1], MC[2, 1], MCref[1], and MCref[2] illustrated in FIG. 17 is described as a typical example, the other memory cells MC and MCref can also be operated in a similar manner.

[Storage of First Data]

First, during a period from Time T01 to Time T02, the potential of the wiring WL[1] becomes high, the potential of the wiring WD[1] becomes a potential greater than a ground potential (GND) by $V_{PR}$–$V_{W[1, 1]}$, and the potential of the wiring WDref becomes a potential greater than the ground potential by $V_{PR}$. The potentials of the wirings RW[1] and RW[2] are reference potentials (REFP). Note that the potential $V_{W[1, 1]}$ is the potential corresponding to the first data stored in the memory cell MC[1, 1]. The potential $V_{PR}$ is the potential corresponding to the reference data. Thus, the transistors Tr11 included in the memory cells MC[1, 1] and MCref[1] are turned on, and the potentials of the nodes NM[1, 1] and NMref[1] become $V_{PR}$–$V_{W[1, 1]}$ and $V_{PR}$, respectively.

In this case, a current $I_{MC[1, 1], 0}$ flowing from the wiring BL[1] to the transistor Tr12 in the memory cell MC[1, 1] can be expressed by a formula shown below. Here, k is a constant determined by the channel length, the channel width, the mobility, the capacitance of a gate insulating film, and the like of the transistor Tr12. In addition, $V_{th}$ is the threshold voltage of the transistor Tr12.

$$I_{MC[1,1],0}=k(V_{PR}-V_{W[1,1]}-V_{th})^2 \quad (E1)$$

A current $I_{MCref[1], 0}$ flowing from the wiring BLref to the transistor Tr12 in the memory cell MCref[1] can be expressed by a formula shown below.

$$I_{MCref[1],0}=k(V_{PR}-V_{th})^2 \quad (E1)$$

Next, during a period from Time T02 to Time T03, the potential of the wiring WL[1] becomes low. Consequently, the transistors Tr11 included in the memory cells MC[1, 1] and MCref[1] are turned off, and the potentials of the nodes NM[1, 1] and NMref[1] are held.

As described above, an OS transistor is preferably used as the transistor Tr11. This can suppress the leakage current of the transistor Tr11, so that the potentials of the nodes NM[1, 1] and NMref[1] can be accurately held.

Next, during a period from Time T03 to Time T04, the potential of the wiring WL[2] becomes high, the potential of the wiring WD[1] becomes a potential greater than the ground potential by $V_{PR}$–$V_{W[2, 1]}$, and the potential of the wiring WDref becomes a potential greater than the ground potential by $V_{PR}$. Note that the potential $V_{W[2, 1]}$ is a potential corresponding to the first data stored in the memory cell MC[2, 1]. Thus, the transistors Tr11 included in the memory cells MC[2, 1] and MCref[2] are turned on, and the potentials of the nodes NM[2, 1] and NMref[2] become $V_{PR}$–$V_{W[2, 1]}$ and $V_{PR}$, respectively.

Here, a current $I_{MC[2, 1], 0}$ flowing from the wiring BL[1] to the transistor Tr12 in the memory cell MC[2, 1] can be expressed by a formula shown below.

$$I_{MC[2,1],0}=k(V_{PR}-V_{W[2,1]}-V_{th})^2 \quad (E3)$$

Furthermore, a current $I_{MCref[2], 0}$ flowing from the wiring BLref to the transistor Tr12 in the memory cell MCref[2] can be expressed by a formula shown below.

$$I_{MCref[2],0}=k(V_{PR}-V_{th})^2 \quad (E4)$$

Next, during a period from Time T04 to Time T05, the potential of the wiring WL[2] becomes low. Consequently, the transistors Tr11 included in the memory cells MC[2, 1] and MCref[2] are turned off, and the potentials of the nodes NM[2, 1] and NMref[2] are held.

Through the above operation, the first data is stored in the memory cells MC[1, 1] and MC[2, 1], and the reference data is stored in the memory cells MCref[1] and MCref[2].

Here, currents flowing to the wirings BL[1] and BLref during the period from Time T04 to Time T05 are considered. The current is supplied from the current source circuit CS to the wiring BLref. The current flowing through the wiring BLref is discharged to the current mirror circuit CM and the memory cells MCref[1] and MCref[2]. A formula shown below holds, where $I_{Cref}$ is the current supplied from the current source circuit CS to the wiring BLref and $I_{CM, 0}$ is the current discharged from the wiring BLref to the current mirror circuit CM.

$$I_{Cref}-I_{CM,0}=I_{MCref[1],0}+I_{MCref[2],0} \quad (E5)$$

The current from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. A formula shown below holds, where $I_{C, 0}$ is the current supplied from the current source circuit CS to the wiring BL[1] and $I_{\alpha,0}$ is the current flowing from the wiring BL[1] to the offset circuit OFST.

$$I_C-I_{CM,0}=I_{MC[1,1],0}+I_{MC[2,1],0}+I_{\alpha,0} \quad (E6)$$

[Product-Sum Operation of First Data and Second Data]

Next, during a period from Time T05 to Time T06, the potential of the wiring RW[1] becomes a potential greater than the reference potential by $V_{X[1]}$. At this time, the potential $V_{X[1]}$ is supplied to the capacitors C11 in the memory cells MC[1, 1] and MCref[1], so that the potentials of the gates of the transistors Tr12 increase owing to capacitive coupling. Note that the potential $V_{X[1]}$ is the potential corresponding to the second data supplied to the memory cells MC[1, 1] and MCref[1].

The amount of change in the potential of the gate of the transistor Tr12 corresponds to the value obtained by multiplying the amount of change in the potential of the wiring RW by a capacitive coupling coefficient determined by the memory cell configuration. The capacitive coupling coefficient is calculated on the basis of the capacitance of the capacitor C11, the gate capacitance of the transistor Tr12, the parasitic capacitance, and the like. In the following description, for convenience, the amount of change in the potential of the wiring RW is equal to the amount of change in the potential of the gate of the transistor Tr12, that is, the capacitive coupling coefficient is set to 1. In practice, the potential $V_X$ can be determined in consideration of the capacitive coupling coefficient.

When the potential $V_{X[1]}$ is supplied to the capacitors C11 in the memory cells MC[1, 1] and MCref[1], the potentials of the nodes NM[1, 1] and NMref[1] each increase by $V_{X[1]}$.

Here, a current $I_{MC[1, 1], 1}$ flowing from the wiring BL[1] to the transistor Tr12 in the memory cell MC[1, 1] during the period from Time T05 to Time T06 can be expressed by a formula shown below.

$$I_{MC[1,1],1} = k(V_{PR} - V_{W[1,1]} + V_{X[1]} - V_{th})^2 \quad (E7)$$

Thus, when the potential $V_{X[1]}$ is supplied to the wiring RW[1], the current flowing from the wiring BL[1] to the transistor Tr12 in the memory cell MC[1, 1] increases by $\Delta I_{MC[1, 1]} = I_{MC[1, 1], 1} - I_{MC[1, 1], 0}$.

Here, a current $I_{MCref[1], 1}$ flowing from the wiring BLref to the transistor Tr12 in the memory cell MCref[1] during the period from Time T05 to Time T06 can be expressed by a formula shown below.

$$I_{MCref[1],1} = k(V_{PR} + V_{X[1]} - V_{th})^2 \quad (E8)$$

Thus, when the potential $V_{X[1]}$ is supplied to the wiring RW[1], the current flowing from the wiring BLref to the transistor Tr12 in the memory cell MCref[1] increases by $\Delta I_{MCref[1]} = I_{MCref[1], 1} - I_{MCref[1], 0}$.

Furthermore, currents flowing to the wirings BL[1] and BLref are considered. A current $I_{Cref}$ is supplied from the current source circuit CS to the wiring BLref. The current flowing through the wiring BLref is discharged to the current mirror circuit CM and the memory cells MCref[1] and MCref[2]. A formula shown below holds, where $I_{CM, 1}$ is the current discharged from the wiring BLref to the current mirror circuit CM.

$$I_{Cref} - I_{CM,1} = I_{MCref[1],1} + I_{MCref[2],1} \quad (E9)$$

The current $I_C$ from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. A formula shown below holds, where $I_{\alpha,1}$ is the current flowing from the wiring BL[1] to the offset circuit OFST.

$$I_C - I_{CM,1} = I_{MC[1,1],1} + I_{MC[2,1],1} + I_{\alpha,1} \quad (E10)$$

In addition, from Formulae (E1) to (E10), a difference between the current $I_{\alpha, 0}$ and the current $I_{\alpha, 1}$ (differential current $\Delta I_\alpha$) can be expressed by a formula shown below.

$$\Delta I_\alpha = I_{\alpha,1} - I_{\alpha,0} = 2k\, V_{W[1,1]} V_{X[1]} \quad (E11)$$

Thus, the differential current $\Delta I_\alpha$ is a value corresponding to the product of the potentials $V_{W[1, 1]}$ and $V_{X[1]}$.

After that, during a period from Time T06 to Time T07, the potential of the wiring RW[1] becomes the reference potential, and the potentials of the nodes NM[1, 1] and NMref[1] become the same as the potentials thereof during the period from Time T04 to Time T05.

Next, during a period from Time T07 to Time T08, the potential of the wiring RW[1] becomes the potential greater than the reference potential by $V_{X[1]}$, and the potential of the wiring RW[2] becomes a potential greater than the reference potential by $V_{X[2]}$. Accordingly, the potential $V_{X[1]}$ is supplied to the capacitors C11 in the memory cell MC[1, 1] and the memory cell MCref[1], and the potentials of the node NM[1, 1] and the node NMref[1] each increase by $V_{X[1]}$ owing to capacitive coupling. Furthermore, the potential $V_{X[2]}$ is supplied to the capacitors C11 in the memory cell MC[2, 1] and the memory cell MCref[2], and the potentials of the node NM[2, 1] and the node NMref[2] each increase by $V_{X[2]}$ owing to capacitive coupling.

Here, the current $I_{MC[2, 1],1}$ flowing from the wiring BL[1] to the transistor Tr12 in the memory cell MC[2, 1] during the period from Time T07 to Time T08 can be expressed by a formula shown below.

$$I_{MC[2,1],1} = k(V_{PR} - V_{W[2,1]} + V_{X[2]} - V_{th})^2 \quad (E12)$$

Thus, when the potential $V_{X[2]}$ is supplied to the wiring RW[2], the current flowing from the wiring BL[1] to the transistor Tr12 in the memory cell MC[2, 1] increases by $\Delta I_{MC[2, 1]} = I_{MC[2, 1],1} - I_{MC[2, 1], 0}$.

Here, a current $I_{MCref[2], 1}$ flowing from the wiring BLref to the transistor Tr12 in the memory cell MCref[2] during the period from Time T07 to Time T08 can be expressed by a formula shown below.

$$I_{MCref[2],1} = k(V_{PR} + V_{X[2]} - V_{th})^2 \quad (E13)$$

Thus, when the potential $V_{X[2]}$ is supplied to the wiring RW[2], the current flowing from the wiring BLref to the transistor Tr12 in the memory cell MCref[2] increases by $\Delta I_{MCref[2]} = I_{MCref[2], 1} - I_{MCref[2], 0}$.

Furthermore, currents flowing to the wirings BL[1] and BLref are considered. The current $I_{Cref}$ is supplied from the current source circuit CS to the wiring BLref. The current flowing through the wiring BLref is discharged to the current mirror circuit CM and the memory cells MCref[1] and MCref[2]. A formula shown below holds, where $I_{CM, 2}$ is the current discharged from the wiring BLref to the current mirror circuit CM.

$$I_{Cref} - I_{CM,2} = I_{MCref[1],1} + I_{MCref[2],1} \quad (E14)$$

The current $I_C$ from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. A formula shown below holds, where $I_{\alpha, 2}$ is the current flowing from the wiring BL[1] to the offset circuit OFST.

$$I_C - I_{CM,2} = I_{MC[1,1],1} + I_{MC[2,1],1} + I_{\alpha,2} \quad (E15)$$

In addition, from Formulae (E1) to (E8) and (E12) to (E15), a difference between the current $I_{\alpha, 0}$ and the current $I_{\alpha, 2}$ (differential current $\Delta I_\alpha$) can be expressed by a formula shown below.

$$\Delta I_\alpha = I_{\alpha,2} - I_{\alpha,0} = 2k(V_{W[1,1]} V_{X[1]} + V_{W[2,1]} V_{X[2]}) \quad (E16)$$

Thus, the differential current $\Delta I_\alpha$ is a value corresponding to the sum of the product of the potentials $V_{W[1, 1]}$ and $V_{X[1]}$ and the product of the potentials $V_{W[2, 1]}$ and $V_{X[2]}$.

After that, during a period from Time T08 to Time T09, the potentials of the wirings RW[1] and RW[2] become reference potential, and the potentials of the nodes NM[1, 1], NM[2, 1], NMref[1], and NMref[2] become the same as the potentials thereof during the period from Time T04 to Time T05.

As represented by Formulae (E11) and (E16), the differential current $\Delta I\alpha$ input to the offset circuit OFST can be calculated from the formula including a product term of the potential $V_W$ corresponding to the first data (weight) and the potential $V_X$ corresponding to the second data (input data). Thus, measurement of the differential current $\Delta I\alpha$ with the offset circuit OFST gives the result of the product-sum operation of the first data and the second data.

Note that although the memory cells MC[1, 1], MC[2, 1], MCref[1], and MCref[2] are focused on in the above description, the number of the memory cells MC and MCref can be any number. In the case where the number m of rows of the memory cells MC and MCref is a given number i, the differential current $\Delta I_\alpha$ can be expressed by a formula shown below.

$$\Delta I_\alpha = 2k\Sigma_i V_{W[i,1]} V_{X[i]} \quad (E17)$$

When the number n of columns of the memory cells MC and MCref is increased, the number of product-sum operations executed in parallel can be increased.

The product-sum operation of the first data and the second data can be performed using the semiconductor device MAC as described above. Note that the use of the configuration of the memory cells MC and MCref in FIG. 17 allows the product-sum arithmetic circuit to be formed using fewer transistors. Accordingly, the circuit scale of the semiconductor device MAC can be reduced.

In the case where the semiconductor device MAC is used for the operation in the neural network, the number m of rows of the memory cells MC can correspond to the number of pieces of input data supplied to one neuron and the number n of columns of the memory cells MC can correspond to the number of neurons. For example, the case where a product-sum operation using the semiconductor device MAC is performed in the middle layer HL in FIG. 15A is considered. In this case, the number m of rows of the memory cells MC can be set to the number of pieces of input data supplied from the input layer IL (the number of neurons in the input layer IL), and the number n of columns of the memory cells MC can be set to the number of neurons in the middle layer HL.

Note that there is no particular limitation on the configuration of the neural network for which the semiconductor device MAC is used. For example, the semiconductor device MAC can also be used for a convolutional neural network (CNN), a recurrent neural network (RNN), an autoencoder, a Boltzmann machine (including a restricted Boltzmann machine), and the like.

The product-sum operation of the neural network can be performed using the semiconductor device MAC as described above. Furthermore, when the memory cells MC and MCref illustrated in FIG. 17 are used for the cell array CA, it is possible to provide an integrated circuit with improved operation accuracy, lower power consumption, or a reduced circuit scale.

This embodiment can be implemented in combination with any of the structures described in the other embodiments, examples, and the like, as appropriate.

Embodiment 6

Examples of an electronic device that can use the display device in one embodiment of the present invention include display devices, personal computers, image storage devices or image reproducing devices provided with storage media, cellular phones, game machines (including portable game machines), portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 20A to 20F illustrate specific examples of these electronic devices.

Figure 20A:
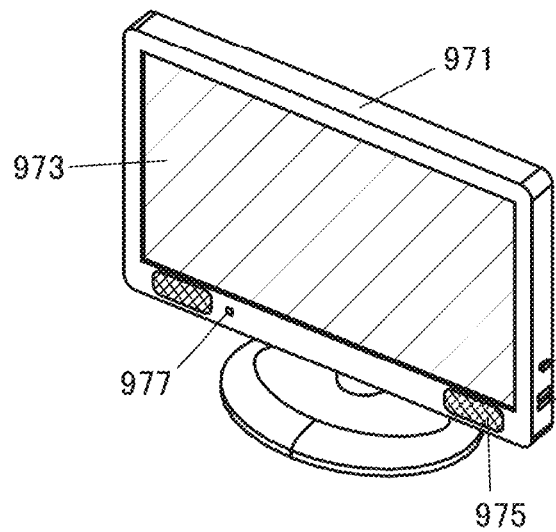
FIGS. 20A to 20F each illustrate an electronic device.

FIG. 20A illustrates a television, which includes a housing 971, a display portion 973, an operation key 974, speakers 975, a communication connection terminal 976, an optical sensor 977, and the like. The display portion 973 includes a touch sensor that enables input operation. The use of the display device of one embodiment of the present invention for the display portion 973 enables display with high quality.

Figure 20B:
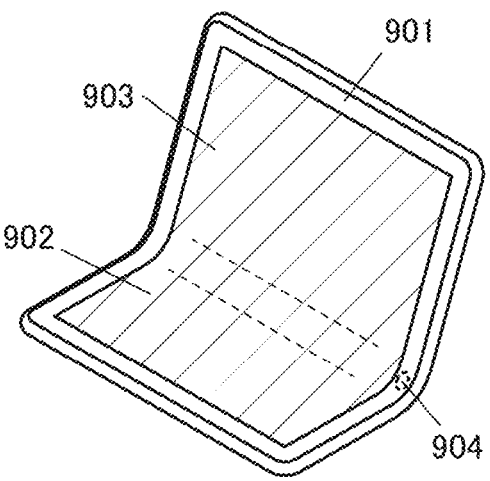

FIG. 20B illustrates an information processing terminal, which includes a housing 901, a display portion 902, a display portion 903, a sensor 904, and the like. The display portions 902 and 903 are formed using one display panel and flexible. The housing 901 is also flexible, can be used in a bent state as illustrated in FIG. 20B, and can be used in a flat plate-like shape like a tablet terminal. The sensor 904 can sense the shape of the housing 901, and for example, it is possible to switch display on the display portions 902 and 903 when the housing 901 is bent. The use of the display device of one embodiment of the present invention for the display portions 902 and 903 enables display with high quality.

Figure 20C:
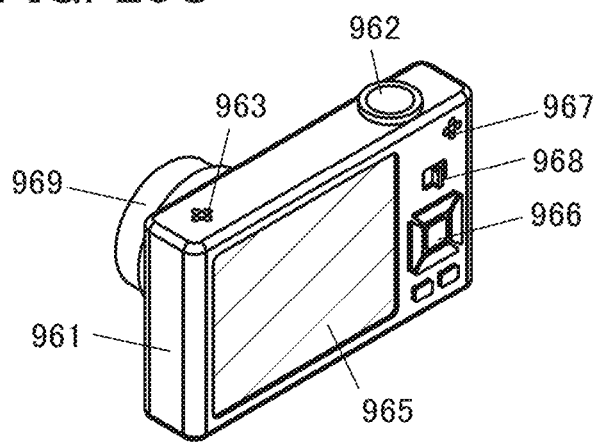

FIG. 20C illustrates a digital camera, which includes a housing 961, a shutter button 962, a microphone 963, a speaker 967, a display portion 965, operation keys 966, a zoom lever 968, a lens 969, and the like. The use of the display device of one embodiment of the present invention for the display portion 965 enables display with high quality.

Figure 20D:
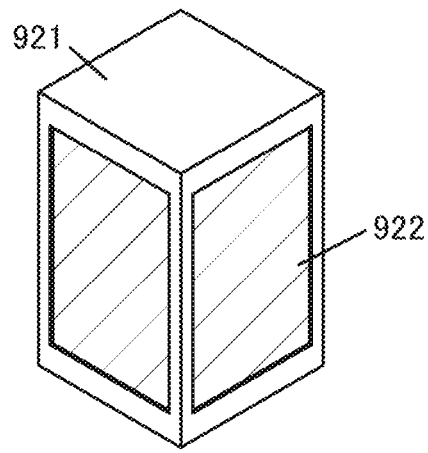

FIG. 20D illustrates a digital signage, which has large display portions 922. The digital signage can be installed on the side surface of a pillar 921, for example. The use of the display device of one embodiment of the present invention for the display portion 922 enables display with high quality.

Figure 20E:
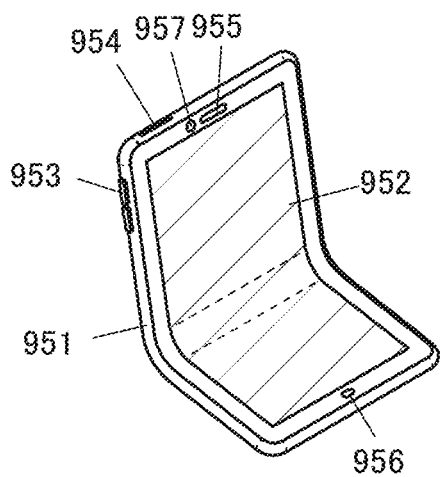

FIG. 20E illustrates a cellular phone, which includes a housing 951, a display portion 952, an operation button 953, an external connection port 954, a speaker 955, a microphone 956, a camera 957, and the like. The display portion 952 of the cellular phone includes a touch sensor. Operations such as making a call and inputting text can be performed by touch on the display portion 952 with a finger, a stylus, or the like. The housing 951 and the display portion 952 have flexibility and can be used in a bent state as illustrated in FIG. 20E. The use of the display device of one embodiment of the present invention for the display portion 952 enables display with high quality.

Figure 20F:
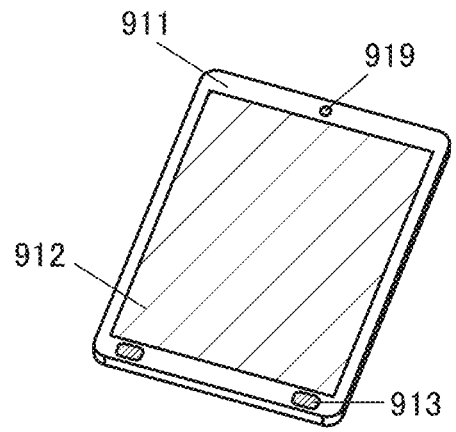

FIG. 20F illustrates a portable data terminal, which includes a housing 911, a display portion 912, speakers 913, a camera 919, and the like. A touch panel function of the display portion 912 enables input and output of information. The use of the display device of one embodiment of the present invention for the display portion 912 enables display with high quality.

This embodiment can be implemented in combination with any of the structures described in the other embodiments, examples, and the like, as appropriate.

Example 1

In this example, the results of fabricating the display device of one embodiment of the present invention will be described.

Figure 21:
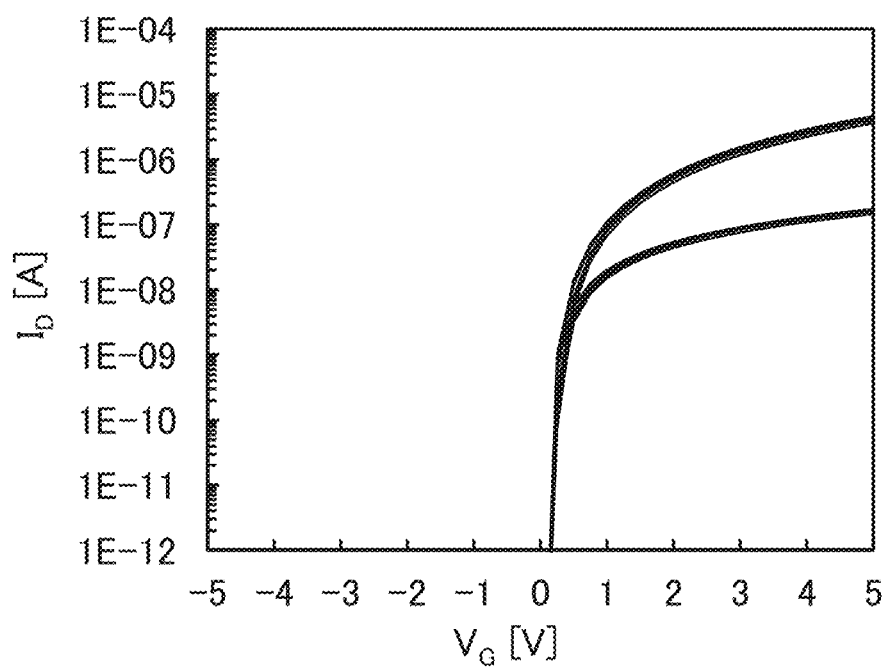
FIG. 21 shows the $I_D$-$V_G$ characteristics of transistors.

FIG. 21 shows the $I_D$–$V_G$ characteristics (Vds=0.1 V, 5.1 V) of an OS transistor (a CAAC-IGZO FET with W/L of 3 μm/3 μm) fabricated through the same process as that of the display device. The transistor is normally off; its off-state current is less than the lower measurement limit of measuring equipment.

Figure 22:
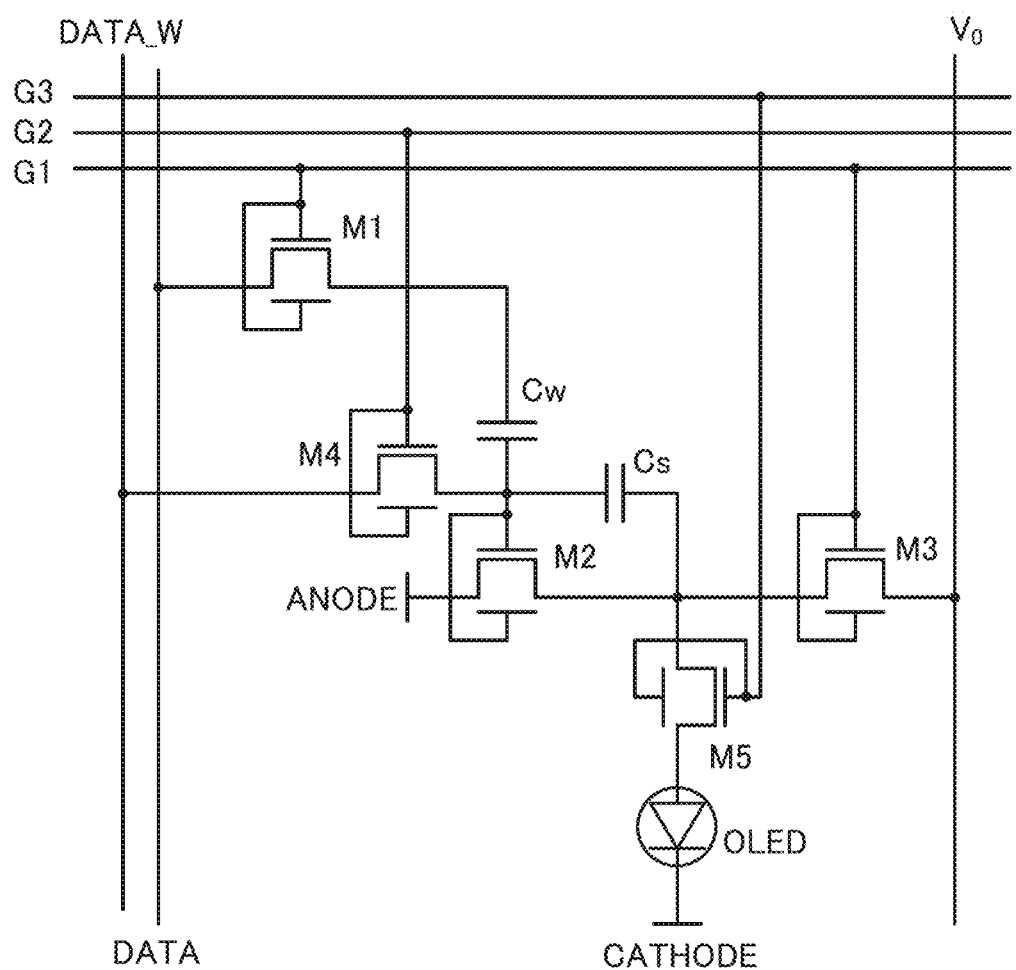
FIG. 22 illustrates a pixel circuit.

FIG. 22 is a circuit diagram of a pixel. The pixel circuit includes five transistors, two capacitors, and a display element OLED. All the transistors have a back gate electrically connected to a front gate. The driving method will be described below. A period in which weight (corresponding to correction data) is written and a period in which display data (corresponding to image data) is written do not overlap with each other.

<Writing of Weight (Correction Data)>

Figure 23A:
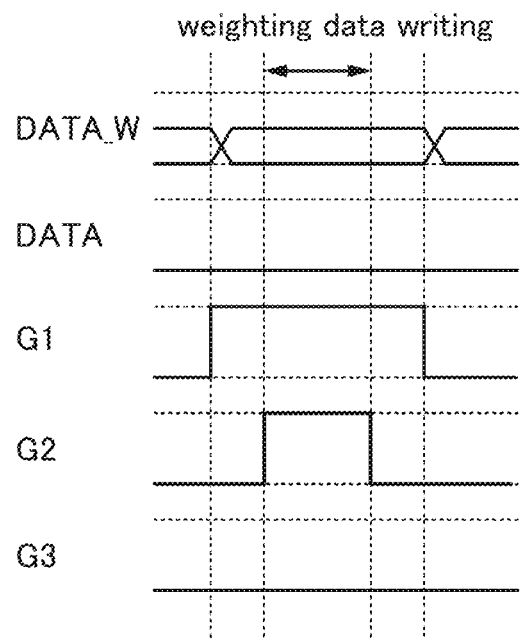
FIGS. 23A and 23B are timing charts each showing the operation of a pixel circuit.

FIG. 23A shows a timing chart for writing weight to a storage node. In writing weight, the display element OLED does not need to emit light; thus, a transistor M5 was off. Transistors M1, M3, and M4 were on so that a reference voltage $V_r$, a fixed potential $V_0$, and the potential of a weight ($V_w$) were supplied.

<Writing of Display Data (Image Data)>

Figure 23B:
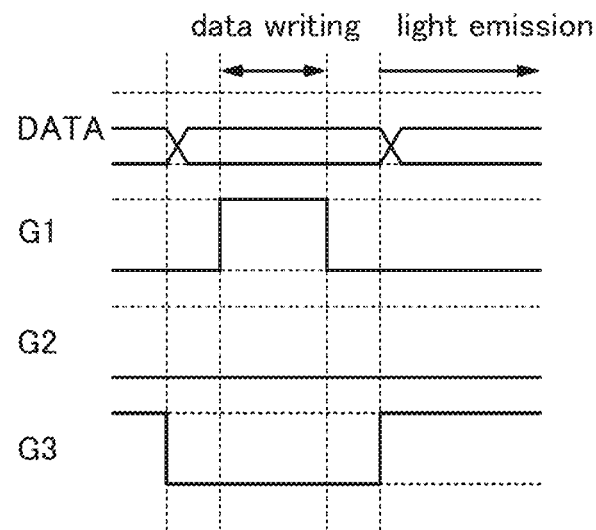

FIG. 23B shows a timing chart for writing display data. Here, weight is not rewritten; thus, the transistor M4 was off and the transistor M1 was on so that display data ($V_{data}$) was supplied. A gate voltage $V_g$ of a transistor M2 that drives the display element OLED is calculated by Formula (1). When the capacitance values of a capacitor $C_w$ and a capacitor $C_s$ have a relation of $C_w \gg C_s$, the gate voltage $V_g$ is expressed by Formula (2). That is to say, a weight ($V_w - V_r$) is added to display data ($V_{data}$).

$$V_g = \frac{\{C_W(V_W - V_r) + C_s(V_W - V_0) + C_W \cdot V_{data}\}}{(C_W + C_s)}$$ [Mathematical Formula 1]

$$V_g = V_W - V_r + V_{data}$$ [Mathematical Formula 2]

<Simulation Results>

Figure 24:
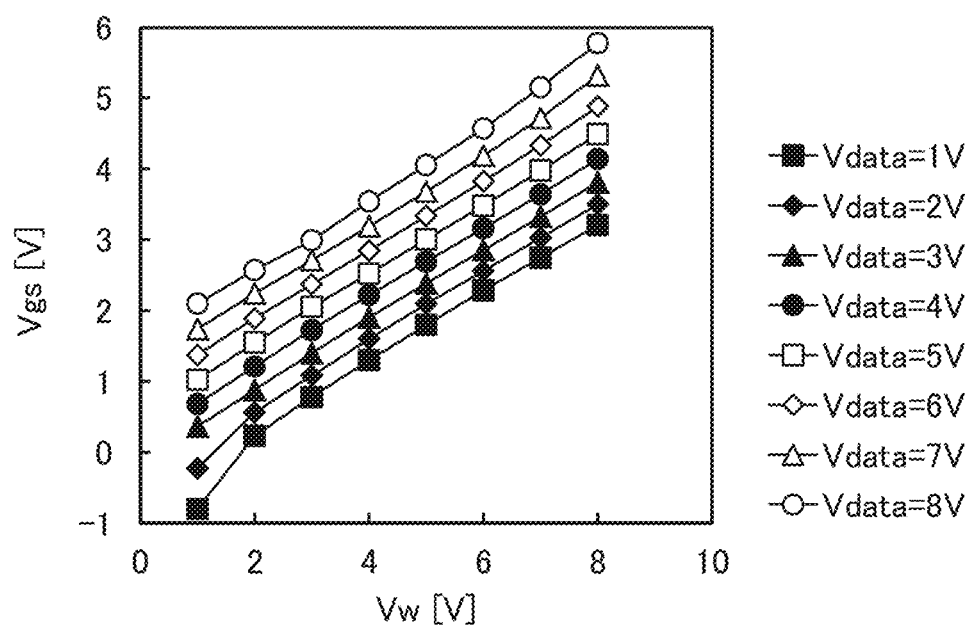
FIG. 24 is a graph showing simulation results.

FIG. 24 shows changes in the gate voltage $V_g$ of the transistor M2 when the value of weight is varied; the changes were obtained by calculation with circuit simulation software SPICE. Increasing the value of weight increased the gate voltage $V_g$.

<Wide Dynamic Range Display>

The gate voltage $V_g$ of the transistor M2 can be expressed by the sum of the potential of display data ($V_{data}$) and the potential of weight ($V_w$). Thus, a voltage higher than or equal to the output voltage of a source driver (corresponding a column driver) can be applied to a gate of the transistor M2. This operation is advantageous in the case where a display image needs to have high luminance. The ratio of the capacitance of the capacitor $C_w$ to the capacitance of the capacitor $C_s$ of the fabricated display device was set to 4:1. When $V_r = V_0 = 0$ V is satisfied, the voltage $V_g$ applied to the gate of the transistor M2 can be expressed by Formula (3).

$$V_g = V_W + \tfrac{4}{5} V_{data}$$ [Mathematical Formula 3]

In the case where the maximum output voltage of the source driver is 5 V, the ideal value of the gate voltage $V_g$ of the transistor M2 is as high as 9 V. In the case where the gate voltage $V_g$ of the transistor M2 is 4.5 V, a voltage of 2.5 V is output from the source driver. Thus, required data voltage can be decreased. Although an operation frequency needs to be increased to alternately write the weight ($V_w$) and display data ($V_{data}$) in one frame, the total power consumption is reduced owing to an effect of the decrease in voltage.

<Specifications of Panel>

Table 1 lists the specifications of the fabricated display device (panel). A scan driver (row driver) including an OS transistor (CAAC-IGZO) as a component was formed over the same substrate as the pixel circuit. The display element OLED has a tandem structure in which white light is emitted, and a coloring method using a combination of the tandem structure and a color filter was employed.

TABLE 1

| | Specifications |
|---|---|
| Screen Diagonal | 4.86-inches |
| Driving Method | Active Matrix |
| Resolution | 720 × 1280 |
| Pixel Pitch | 84 µm × 84 µm |
| Pixel Density | 302 ppi |
| Aperture Ratio | 43.70% |
| Pixel Arrangement | RGB Stripe |
| Coloring Method | White Tandem OLED + Color Filter |
| Emission Type | Top Emission |
| Source Driver | COG |
| Scan Driver | Integrated |

<Results>

Figure 25C:
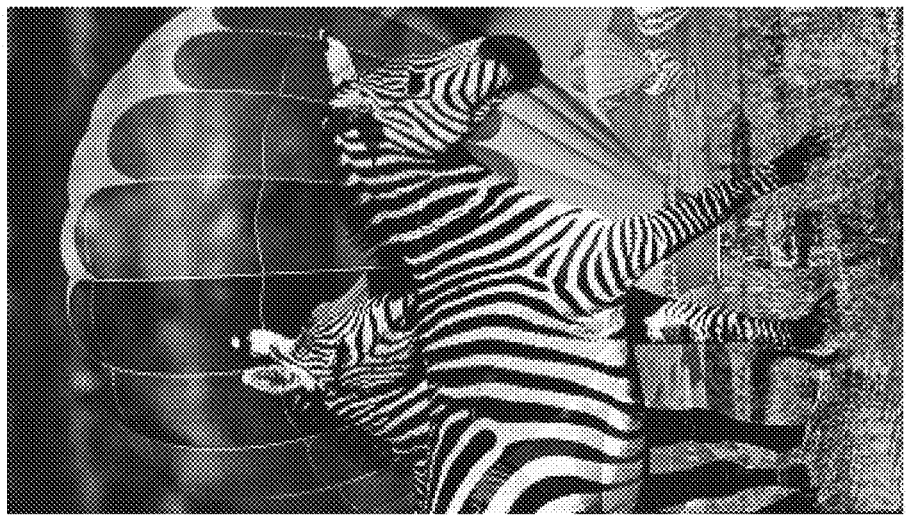
FIGS. 25A to 25C illustrate display.
Figure 25B:
Figure 25A:
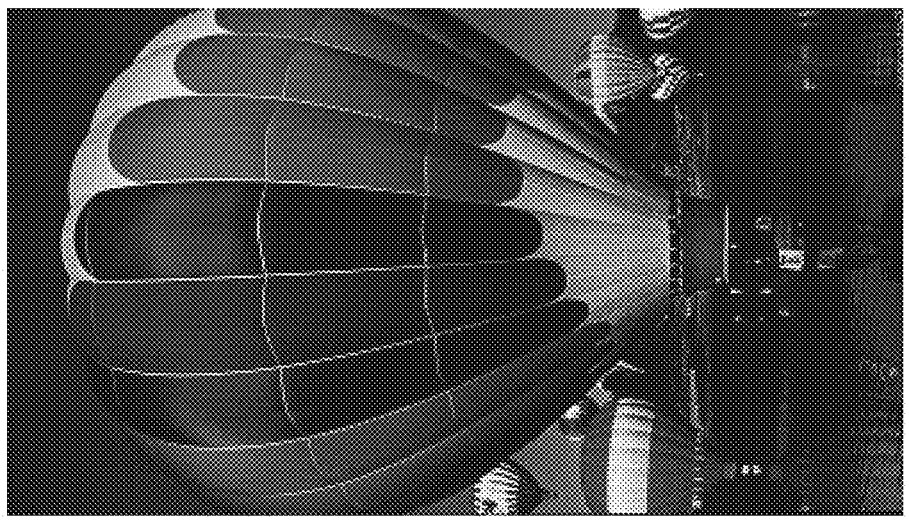

FIG. 25A is a photograph of a screen of the panel on which only the image data of a balloon input as weight was displayed. FIG. 25B is a photograph of a screen of the panel on which only the image data of a zebra input as display data was displayed. FIG. 25C is a photograph of a screen of the panel on which the image data of a balloon input as weight to which the image data of a zebra input as display data was added was displayed. In this manner, image data written as weight was superimposed on image data input as display data. This suggests that weight was normally retained in the storage node of the pixel.

Next, the luminance of an image displayed by writing data for full-white display as weight and inputting the same data for full-white display as display data was measured. As shown in Table 2, higher luminance was achieved. The results show that the voltage higher than or equal to the output voltage of the source driver can be applied to the gate of the transistor M2, enabling higher-luminance display.

TABLE 2

| | Only Display Data | Weighting Data + Display Data |
|---|---|---|
| Gate Voltage of Driving Transistor [V] | 5 | 9 |
| Luminance [cd/m$^2$] | 263 | 876 |

This example can be implemented in combination with any of the structures described in the other embodiments and the like, as appropriate.

Example 2

In this example, an example of the display device of one embodiment of the present invention provided with an external correction circuit will be described.

In a display device including an EL element, variations and deterioration in driving transistor characteristics significantly affect display. Thus, a circuit that corrects variations in current of the driving transistors is preferably provided.

In this example, the results of fabricating an EL display device including an external correction circuit with increased current reading accuracy will be described. The external correction circuit incorporates an integrator including a source driver with an input of a differential method or a two-differential-pair method.

Figure 26:
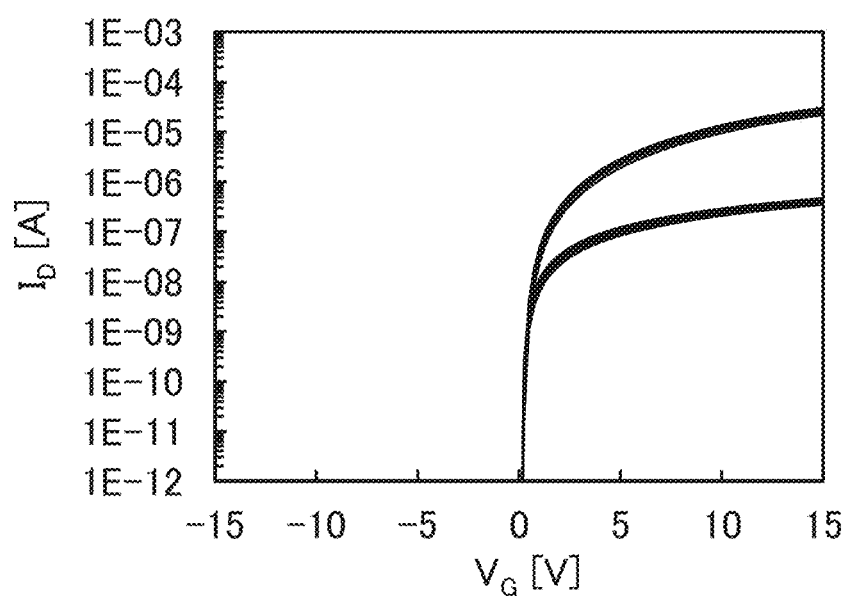
FIG. 26 is a graph showing the $I_D$-$V_G$ characteristics of transistors.

FIG. 26 shows the $I_D$-$V_G$ characteristics (Vds=0.1 V, 10 V) of an OS transistor (a CAAC-IGZO FET with W/L of 4 µm/6 µm) fabricated through the same process as that of the display device. The transistor is normally off; its off-state current is less than the lower measurement limit of measuring equipment.

To increase correction accuracy of the external correction circuit, the currents of the driving transistors are required to be accurately measured. However, when the external correction circuit is influenced by common-mode noise from a power source or the like used by a gate driver, current measurement accuracy is decreased. To cancel out common-mode noise, a differential-input-mode integrator is used for a sensing circuit of a touch sensor, for example.

Figure 27:
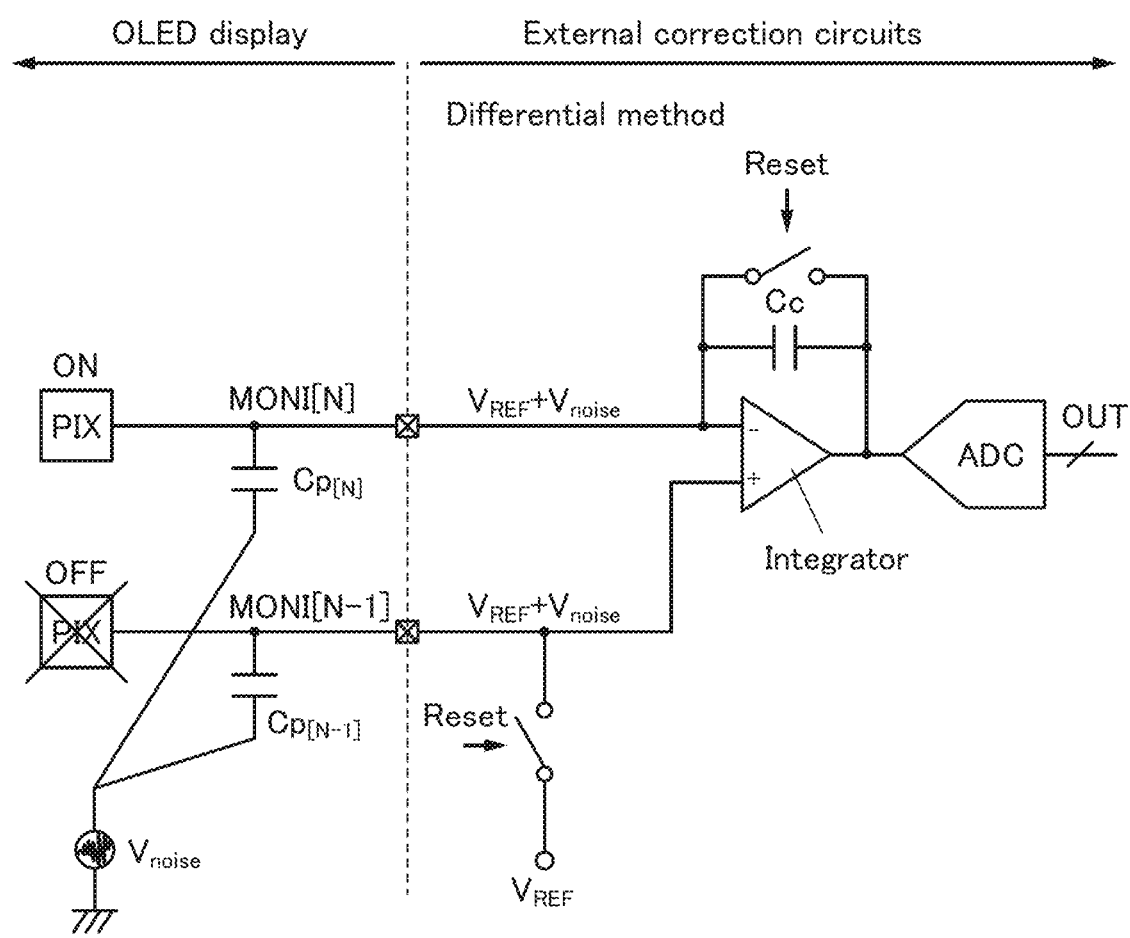
FIG. 27 illustrates an interface portion between an external correction circuit and an EL panel.
Figure 28:
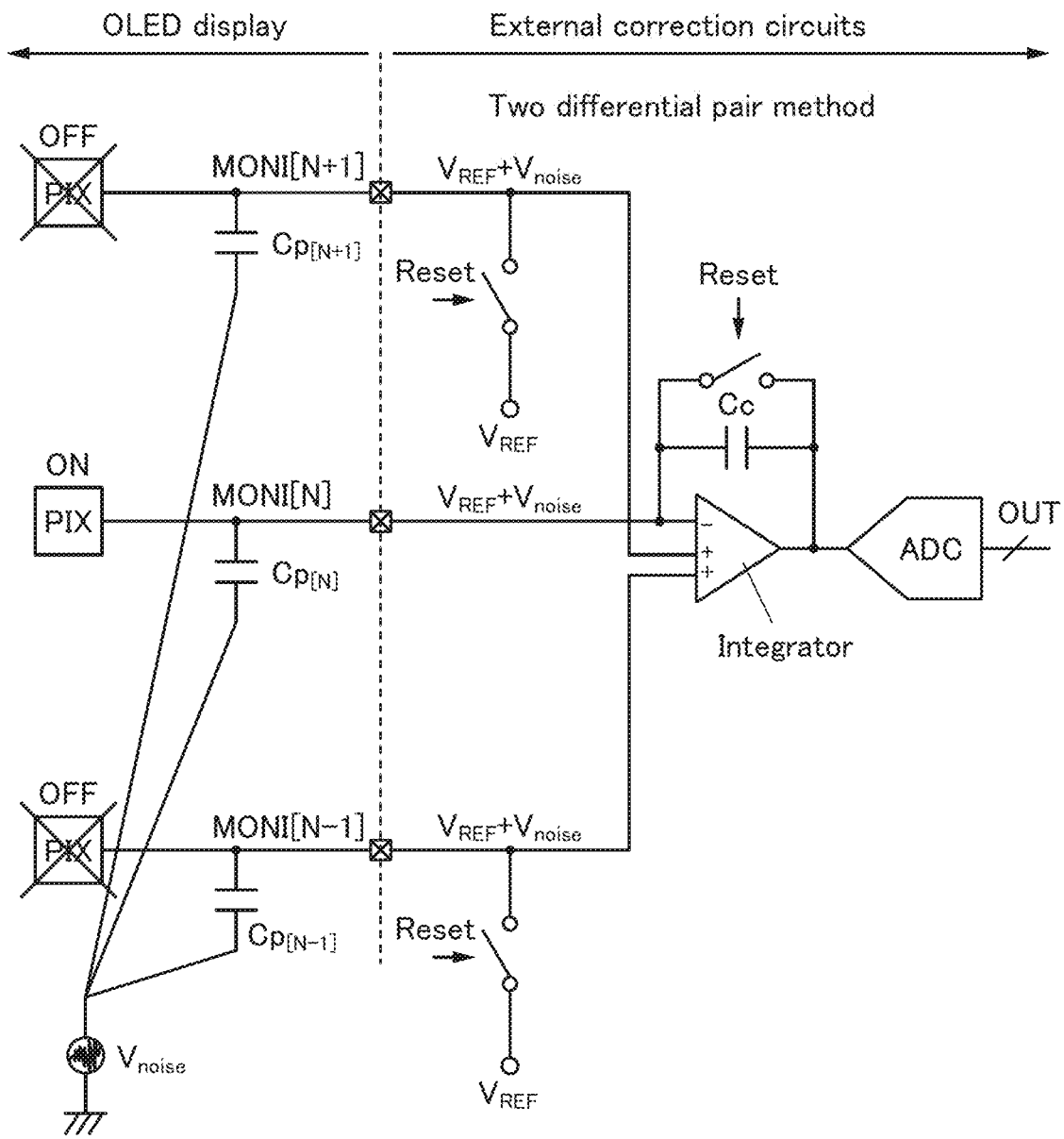
FIG. 28 illustrates an interface portion between an external correction circuit and an EL panel.

FIG. 27 and FIG. 28 illustrate an interface portion between the external correction circuit and the EL panel. The external correction circuit includes an integrator, an A/D converter (ADC), and an image processing circuit, and the integrator and the ADC are incorporated in a source driver IC chip. Before the current of a driving transistor of a pixel connected to a wiring MONI[N] is measured, the external correction circuit supplies a RESET signal to the wiring MONI[N] so that the voltages of wirings MONI[N−1], MONI[N], MONI[N+1], and the like are set to VREF.

The integrator illustrated in FIG. 27 has an input of a differential method, and the integrator illustrated in FIG. 28 has an input of a two-differential-pair method. Both the integrators can cancel out common-mode noise. Furthermore, an OS transistor with an extremely low off-state current is used as a transistor on the EL panel side; thus, the reference potential during current measurement can be retained without either provision of a particular storage capacitor or control of a power source.

Figure 29:
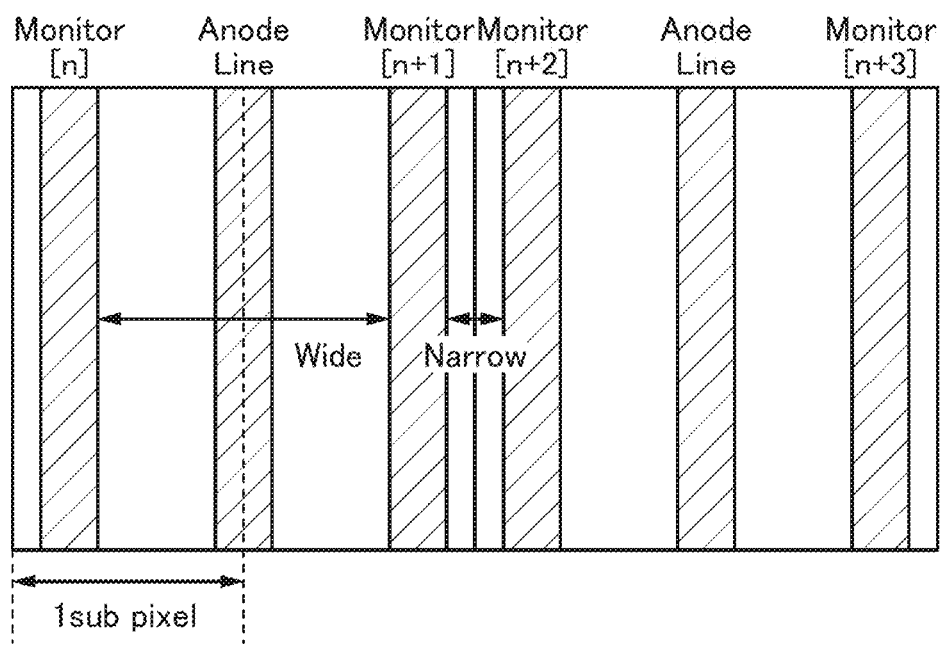
FIG. 29 illustrates a pixel layout.

In the case where a pixel layout is employed in which one power supply line is shared by two pixels (subpixels) as in FIG. 29, the two-differential-pair method illustrated in FIG. 28 is employed to cancel out noise with high accuracy.

Figure 30:
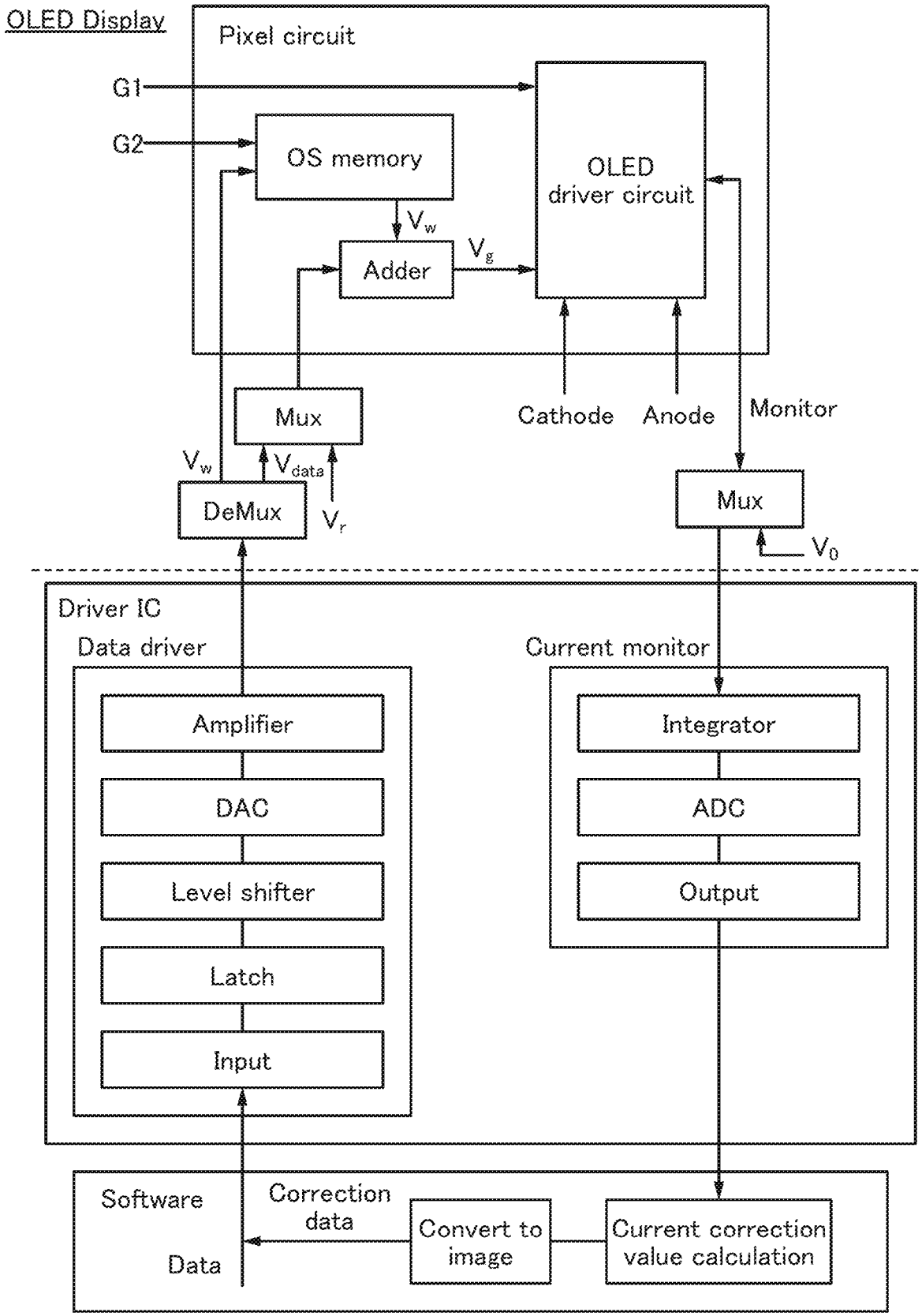
FIG. 30 is a block diagram illustrating the configuration of a pixel and a source driver.

FIG. 30 is a block diagram illustrating the configuration of a pixel and a source driver. A standard driver circuit including an EL element is additionally provided with a memory for retaining voltage data for correction of variations in characteristics, through an adder. The memory, which includes an OS transistor, is referred to as an OS memory. The pixel can read and measure the current value of a driving transistor from a wiring Monitor. Voltage data for correcting the variations in driving transistor characteristics is created using the measured current value, and added as the weight ($V_w$) to the image data ($V_{data}$) to reduce display unevenness resulting from variations in the transistor characteristics.

Next, a method for driving the pixel will be described. Weight ($V_w$) writing, image data ($V_{data}$) writing, and current reading are performed in different periods. In writing the weight ($V_w$) and the image data ($V_{data}$), the fixed potential ($V_0$) is input to the wiring Monitor.

<Weight ($V_w$) Writing>

The weight ($V_w$) is written to the memory with supply of gate signals (G1 and G2), the reference voltage ($V_r$), and the fixed potential ($V_0$) with which a transistor included in the driver circuit of the EL element and a transistor included in the memory are turned on.

<Image Data ($V_{data}$) Writing>

The display data ($V_{data}$) is written to the driver circuit with supply of the gate signal (G1) with which the transistor included in the driver circuit of the EL element is turned on. At this time, the voltage $V_g$ that is applied to the gate of the driving transistor of the EL element is a value obtained by adding "$V_{data}$" to "$V_w$−$V_r$" when the storage capacitance of the memory is sufficiently large. That is, the weight of "$V_w$−$V_r$" is added to the image data ($V_{data}$); thus, voltage data for correcting variations in characteristics is supplied as the weight ($V_w$) to perform correction.

<Current Reading>

In current reading, first, a given gate signal is supplied to the transistor included in the driver circuit of the EL element and the transistor included in the memory, to turn on the driving transistor. At this time, current that flows from the driving transistor to the wiring Monitor can be read from a current monitoring circuit in the source driver IC chip through a selection circuit.

<Whole System>

First, the current monitoring circuit measures the current of the pixel. Then, correction data is created from the measured current value and written to the OS memory in the pixel, and image data is added to the correction data. The OS memory is refreshed at intervals of a few seconds; thus, external calculation can be performed at a low frequency. Thus, data measured by the current monitoring circuit can be converted into correction data by software processing, and the correction data is written to the OS memory in the pixel from the data driver portion at intervals of a few seconds. The data driver portion can be composed of various circuits such as an input portion, a latch, a level shifter, a D/A converter, and an amplifier, and electrically connected to the pixel circuit through the selection circuit. The system does not require a dedicated peripheral circuit that performs calculation at low speed, resulting in cost reduction.

Figure 31A:
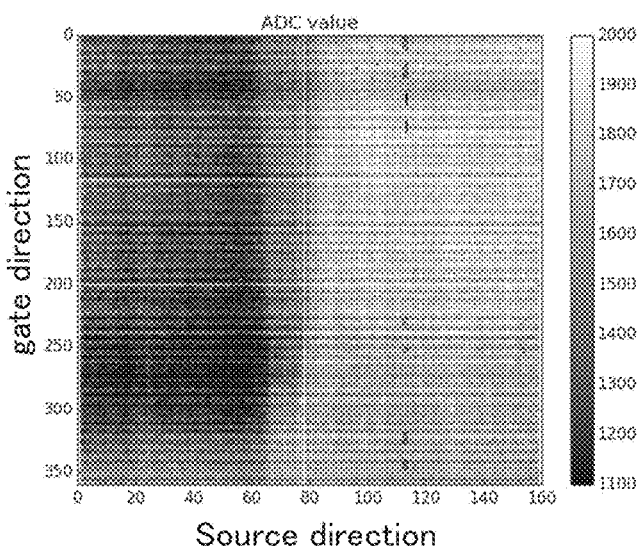
FIGS. 31A to 31C each show measurement results of current of a driving transistor.
Figure 31B:
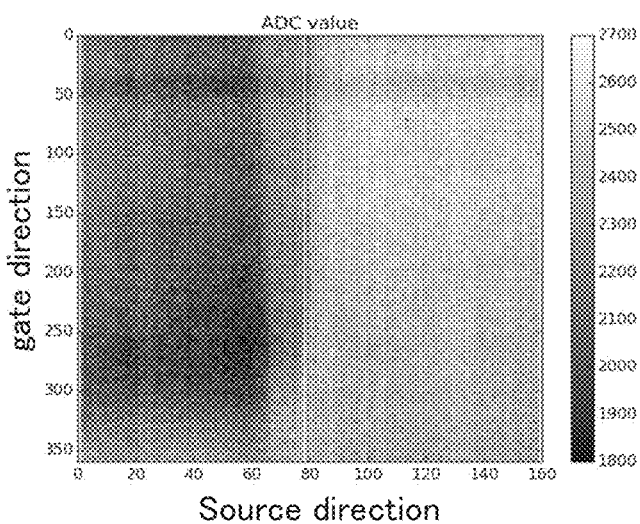
Figure 31C:
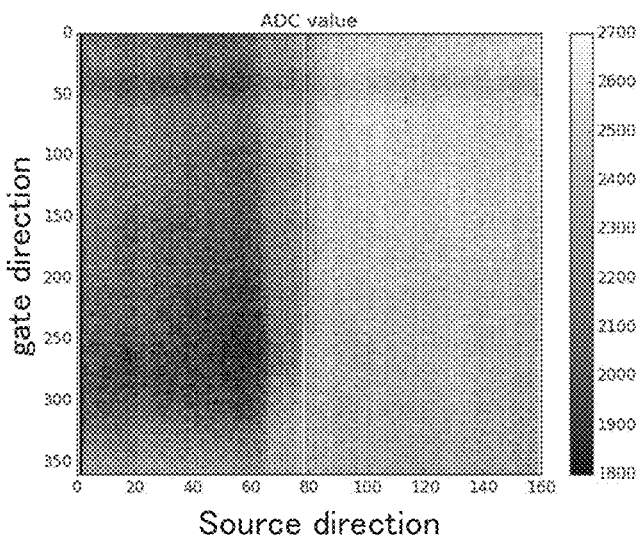

FIGS. 31A to 31C show results obtained by measuring the currents of the driving transistors of subpixels (160×360) for red display in the vicinity of the center of a screen of another fabricated high-resolution panel. An X-coordinate and a Y-coordinate represent the coordinates of the pixel where the current was measured. The shades of grey represent gray levels obtained after the measured current was subjected to AD conversion.

FIG. 31A shows the result of a single-ended method for inputting data to the integrator, where the noise impact was strongly observed in the gate-line direction. FIGS. 31B and 31C show the results of the differential method and the two-differential-pair method, respectively. Both FIGS. 31B and 31C indicate cancellation of the common-node noise. When the results were subjected to Fourier transform and compared, the two-differential-pair method was shown to suppress approximately 0.5% more noise than the differential method.

The specifications of the fabricated display device (EL panel) are the same as those in Table 1 described in Example 1. A scan driver including an OS transistor (CAAC-IGZO) as a component was formed over the same substrate as the pixel circuit. The external correction circuit is included in the source driver mounted by COG. The display element OLED has a tandem structure in which white light is emitted, and a coloring method using a combination of the tandem structure and a color filter was employed.

Figure 32A:
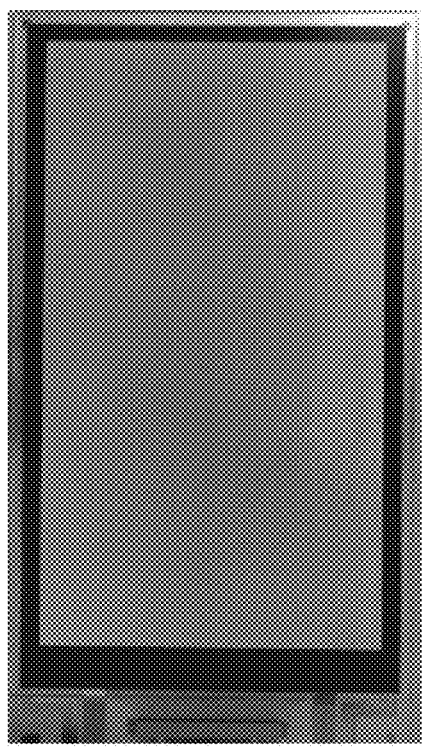
FIGS. 32A and 32B each show display performed after image correction using an external correction system.
Figure 32B:
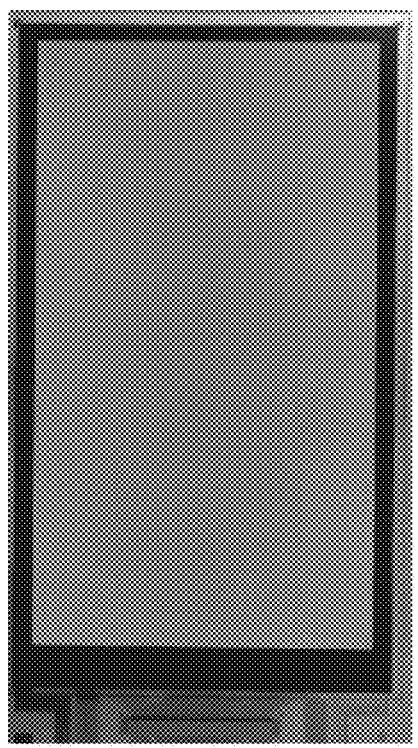

FIGS. 32A and 32B show results of display after image correction using a new external correction system. FIG. 32A shows gray display without external correction; noticeable display unevenness is observed in the right side of a display area. Black was written as weight. FIG. 32B shows gray display with external correction; uniform display was performed and thus unevenness is not observed. A corrected image created from a current measurement result was written as weight.

Figure 33A:
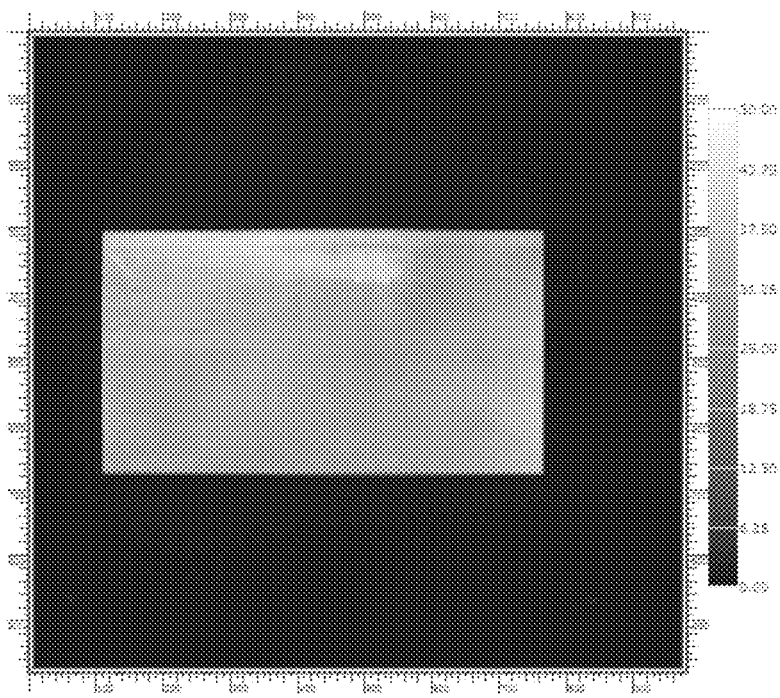
FIGS. 33A and 33B each show results obtained by measuring luminance unevenness with a two-dimensional luminance colorimeter.
Figure 33B:
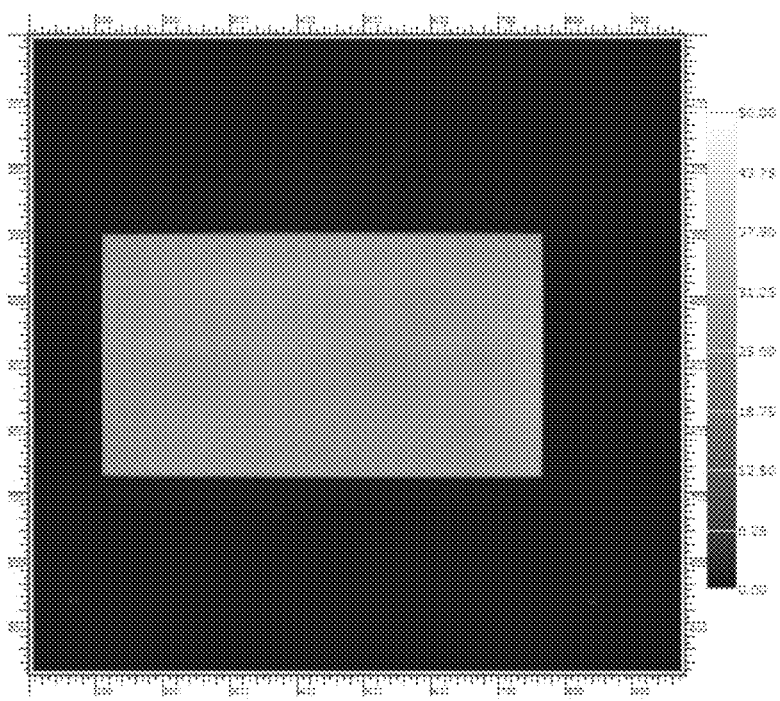

FIGS. 33A and 33B show results of measurement of luminance variations with a two-dimensional color luminance meter (CA-2500 manufactured by Konica Minolta, Inc.). FIG. 33A shows luminance distribution when correction was not performed, and FIG. 33B shows luminance distribution when correction was performed. These results demonstrate that external correction allowed luminance to be corrected to be uniform.

Figure 34:
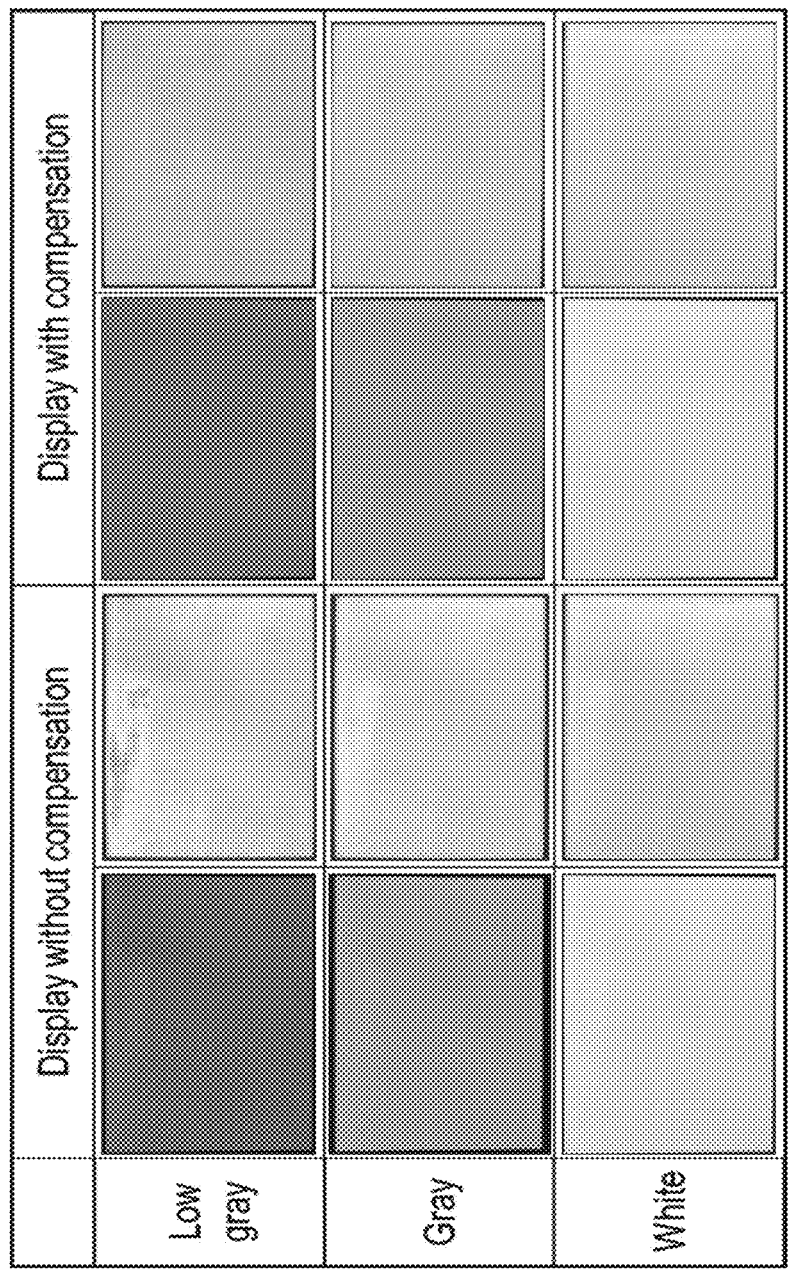
FIG. 34 shows display photographs and the measurement results obtained with a two-dimensional luminance colorimeter.

FIG. 34 shows comparisons of display photographs of low gray, gray, and white images and the results of measurement with a two-dimensional color luminance meter between displays with correction and displays without correction. Correction data written as weight was the same for all the displays. The displays with correction had relatively less display unevenness regardless of luminance.

Figure 35A:
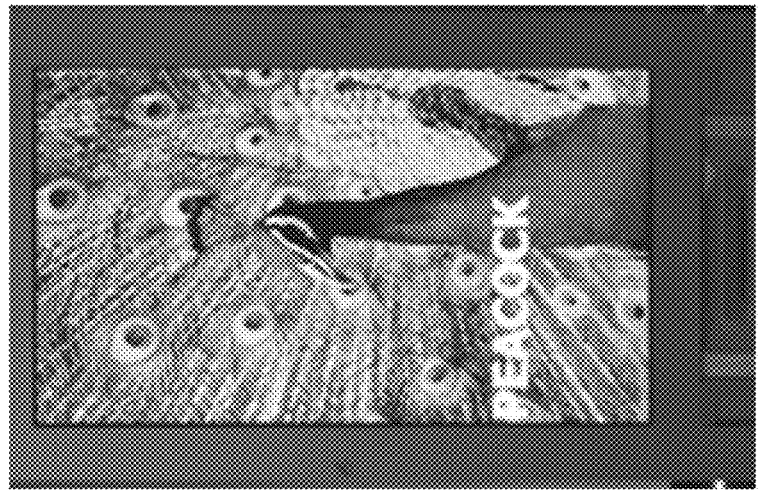
FIGS. 35A to 35C illustrate display.
Figure 35B:
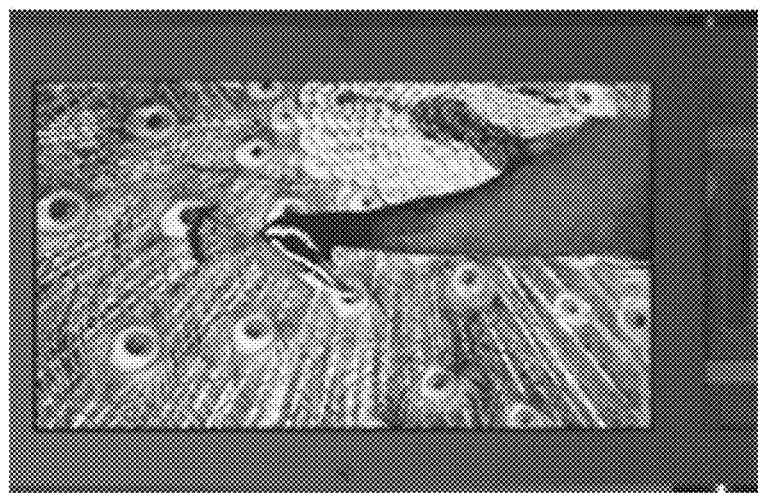
Figure 35C:
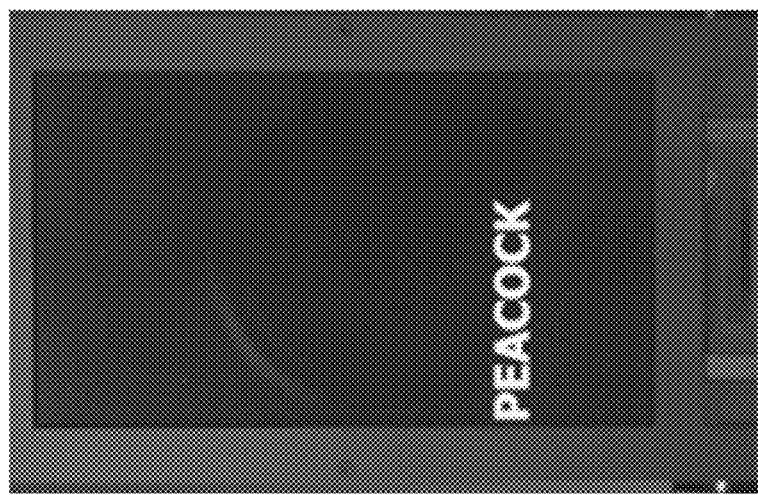

FIGS. 35A, 35B, and 35C show application examples of display using the memory in the pixel. Caption text data (FIG. 35A) was written as the weight ($V_w$), the image data of a peacock (FIG. 35B) was written as display data, and display was performed, whereby display in which two images superimpose on each other as in FIG. 35C was obtained. Even when the display data was changed, the text written as the weight ($V_w$) can be displayed without any change. This indicates that the weight ($V_w$) was normally retained in the memory.

The above results show that the external correction circuit included in the fabricated display device accurately measured the current of the driving transistor of the EL element. In addition, correction data was created from the measured current and the voltage of the correction data was retained as the weight ($V_w$) in the pixel, whereby variations in driving transistor characteristics were corrected.

This example can be implemented in combination with any of the structures described in the other embodiments and the like, as appropriate.

EXPLANATION OF REFERENCE

10: pixel, 10a: pixel, 10b: pixel, 10c: pixel, 10d: pixel, 11b: pixel, 12: row driver, 13: column driver, 14: circuit, 15: column driver, 16: circuit, 101: transistor, 102: transistor, 103: capacitor, 104: EL element, 105: transistor, 111: transistor, 112: transistor, 113: capacitor, 121: wiring, 122: wiring, 124: wiring, 125: wiring, 126: wiring, 128: power supply line, 129: common wiring, 130: wiring, 141: switch, 142: switch, 143: switch, 144: switch, 215: display portion, 221a: scan line driver circuit, 231a: signal line driver circuit, 232a: signal line driver circuit, 241a: common line driver circuit, 723: electrode, 726: insulating layer, 728: insulating layer, 729: insulating layer, 741: insulating layer, 742: semiconductor layer, 744a: electrode, 744b: electrode, 746: electrode, 755: impurity, 771: substrate, 772: insulating layer, 810: transistor, 811: transistor, 820: transistor, 821: transistor, 825: transistor, 842: transistor, 843: transistor, 844: transistor, 845: transistor, 846: transistor, 847: transistor, 901: housing, 902: display portion, 903: display portion, 904: sensor, 911: housing, 912: display portion, 919: camera, 921: pillar, 922: display portion, 951: housing, 952: display portion, 953: operation button, 954: external connection port, 955: speaker, 956: microphone, 957: camera, 961: housing, 962: shutter button, 963: microphone, 965: display portion, 966: operation key, 967: speaker, 968: zoom lever, 969: lens, 971: housing, 973: display portion, 974: operation key, 975: speaker, 976: communication connection terminal, 977: optical sensor, 1000: DOSRAM, 1001: memory cell, 1002: sense amplifier portion, 1003: cell array portion, 4001: substrate, 4005: sealant, 4006: substrate, 4010: transistor, 4011: transistor, 4014: wiring, 4015: electrode, 4017: electrode, 4018: FPC, 4019: anisotropic conductive layer, 4020: capacitor, 4021: electrode, 4030: electrode layer, 4031: electrode layer, 4041: printed circuit board, 4042: integrated circuit, 4102: insulating layer, 4103: insulating layer, 4104: insulating layer, 4110: insulating layer, 4111: insulating layer, 4112: insulating layer, 4200: input device, 4210: touch panel, 4227: electrode, 4228: electrode, 4237: wiring, 4238: wiring, 4239: wiring, 4263: substrate, 4272b: FPC, 4273b: IC, 4510: bank, 4511: light-emitting layer, 4513: light-emitting element, 4514: filler This application is based on Japanese Patent Application Serial No. 2017-166757 filed with Japan Patent Office on Aug. 31, 2017, Japanese Patent Application Serial No. 2017-230388 filed with Japan Patent Office on Nov. 30, 2017, Japanese Patent Application Serial No. 2018-029271 filed with Japan Patent Office on Feb. 22, 2018, and Japanese Patent Application Serial No. 2018-095317 filed with Japan Patent Office on May 17, 2018, the entire contents of which are hereby incorporated by reference.

The invention claimed is:

1. A display device comprising a pixel, the pixel comprising:
a first transistor, a second transistor, a third transistor, a fourth transistor, a fifth transistor, a first capacitor, a second capacitor, and a display element,
wherein one of a source and a drain of the first transistor is electrically connected to a first electrode of the first capacitor,
wherein a second electrode of the first capacitor is electrically connected to one of a source and a drain of the second transistor, a gate of the third transistor, and a first electrode of the second capacitor,
wherein a second electrode of the second capacitor is electrically connected to one of a source and a drain of the third transistor, one of a source and a drain of the fourth transistor, and one of a source and a drain of the fifth transistor,
wherein the second electrode of the second capacitor is electrically connected to the display element through the fourth transistor,
wherein another one of the source and the drain of the fourth transistor is electrically connected to the display element,
wherein another one of the source and the drain of the first transistor is electrically connected to a first wiring that supplies first data,
wherein another one of the source and the drain of the second transistor is electrically connected to a second wiring that supplies second data,
wherein another one of the source and the drain of the third transistor is electrically connected to a third wiring which is a power supply line,
wherein the first electrode of the first capacitor is not electrically connected to the second electrode of the second capacitor,
wherein another one of the source and the drain of the fifth transistor is electrically connected to a fourth wiring,
wherein a gate of the first transistor is electrically connected to a first scan line,
wherein a gate of the second transistor is electrically connected to a second scan line,
wherein a gate of the fourth transistor is electrically connected to a third scan line, and
wherein a gate of the fifth transistor is electrically connected to the first scan line.

2. The display device according to claim 1,
wherein the first data is image data, and
wherein the second data is correction data.

3. The display device according to claim 1, wherein a channel formation region of the second transistor comprises a metal oxide comprising In and Zn.

4. The display device according to claim 1, wherein a channel formation region of each of the first transistor, the second transistor, the third transistor, the fourth transistor, and the fifth transistor comprises a metal oxide comprising In and Zn.

5. The display device according to claim 1,
wherein each of the first transistor, the second transistor, the third transistor, the fourth transistor, and the fifth transistor comprises a back gate,
wherein the back gate of the first transistor is electrically connected to a gate of the first transistor,
wherein the back gate of the second transistor is electrically connected to a gate of the second transistor,
wherein the back gate of the third transistor is electrically connected to the gate of the third transistor,
wherein the back gate of the fourth transistor is electrically connected to a gate of the fourth transistor, and
wherein the back gate of the fifth transistor is electrically connected to a gate of the fifth transistor.

6. The display device according to claim 1, wherein the display element is an EL element.

* * * * *